United States Patent
Yada

(10) Patent No.: US 11,882,702 B2
(45) Date of Patent: Jan. 23, 2024

(54) LATERAL TRANSISTORS FOR SELECTING BLOCKS IN A THREE-DIMENSIONAL MEMORY ARRAY AND METHODS FOR FORMING THE SAME

(71) Applicant: SANDISK TECHNOLOGIES LLC, Addison, TX (US)

(72) Inventor: Shinsuke Yada, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 307 days.

(21) Appl. No.: 17/333,437

(22) Filed: May 28, 2021

(65) Prior Publication Data

US 2022/0262815 A1    Aug. 18, 2022

Related U.S. Application Data

(63) Continuation-in-part of application No. 17/176,829, filed on Feb. 16, 2021, now Pat. No. 11,626,415.

(51) Int. Cl.
| | |
|---|---|
| *H10B 43/27* | (2023.01) |
| *H01L 25/065* | (2023.01) |
| *H10B 41/10* | (2023.01) |
| *H10B 41/27* | (2023.01) |
| *H10B 41/35* | (2023.01) |

(Continued)

(52) U.S. Cl.
CPC .......... *H10B 43/27* (2023.02); *H01L 25/065* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
None
See application file for complete search history.

(56) References Cited

U.S. PATENT DOCUMENTS

| | | | |
|---|---|---|---|
| 9,449,981 | B2 | 9/2016 | Pachamuthu et al. |
| 9,478,495 | B1 | 10/2016 | Pachamuthu et al. |
| 9,627,395 | B2 | 4/2017 | Zhang et al. |

(Continued)

FOREIGN PATENT DOCUMENTS

| | | |
|---|---|---|
| EP | 3326205 B1 | 4/2020 |
| KR | 10-2018-0066745 A | 6/2018 |

OTHER PUBLICATIONS

ISR—Notification of Transmittal of the International Search Report and Written Opinion of the International Searching Authority for International Patent Application No. PCT/US2021/058675, dated Apr. 11, 2022, 10 pages.

(Continued)

*Primary Examiner* — Hsien Ming Lee
(74) *Attorney, Agent, or Firm* — THE MARBURY LAW GROUP PLLC

(57) ABSTRACT

A three-dimensional memory device includes an alternating stack of insulating layers and electrically conductive layers, memory opening fill structures including a respective vertical semiconductor channel and a respective vertical stack of memory elements extending through the alternating stack in a memory array region, via contact structures contacting the stepped surfaces of the electrically conductive layers at each step in a staircase region, and a vertical stack of access transistors located between the staircase region and the memory array region.

19 Claims, 65 Drawing Sheets

(51) Int. Cl.
*H10B 43/10* (2023.01)
*H10B 43/35* (2023.01)

(56) References Cited

U.S. PATENT DOCUMENTS

| | | |
|---|---|---|
| 9,953,992 B1 | 4/2018 | Ogawa et al. |
| 10,192,877 B2 | 1/2019 | Norizuki et al. |
| 10,290,803 B2 | 5/2019 | Sano et al. |
| 10,453,798 B2 | 10/2019 | Tsutsumi et al. |
| 10,546,870 B2 | 1/2020 | Shimabukuro et al. |
| 10,580,795 B1 | 3/2020 | Luo et al. |
| 10,763,271 B2 | 9/2020 | Rabkin et al. |
| 10,804,284 B2 | 10/2020 | Ishii et al. |
| 10,847,524 B2 | 11/2020 | Otsu et al. |
| 10,861,873 B2 | 12/2020 | Kim et al. |
| 10,868,025 B2 | 12/2020 | Zhou et al. |
| 10,872,899 B2 | 12/2020 | Kim et al. |
| 2007/0029607 A1 | 2/2007 | Kouznetzov |
| 2007/0147104 A1 | 6/2007 | Kato et al. |
| 2013/0007353 A1 | 1/2013 | Shim et al. |
| 2015/0069377 A1 | 3/2015 | Rabkin et al. |
| 2018/0158873 A1* | 6/2018 | Sano ............... H10N 70/011 |
| 2018/0233513 A1* | 8/2018 | Zhang ............... G11C 16/26 |
| 2018/0261611 A1 | 9/2018 | Norizuki et al. |
| 2018/0366471 A1 | 12/2018 | Harari et al. |
| 2019/0096808 A1 | 3/2019 | Tsutsumi et al. |
| 2019/0221574 A1 | 7/2019 | Shimabukuro et al. |
| 2019/0319040 A1 | 10/2019 | Ishii et al. |
| 2019/0333930 A1 | 10/2019 | Borukhov |
| 2020/0006364 A1 | 1/2020 | Rabkin et al. |
| 2020/0006370 A1 | 1/2020 | Huo et al. |
| 2020/0091182 A1* | 3/2020 | Shishido ............... H01L 23/544 |
| 2022/0052070 A1 | 2/2022 | Han et al. |

OTHER PUBLICATIONS

Endoh et al., "Novel Ultra High Density Memory with a Stacked-Surrounding Gate Transistor (S-SGT) Structured Cell," IEDM Proc. (2001) 33-36.
U.S. Appl. No. 16/881,346, filed May 22, 2020, SanDisk Technologies LLC.
U.S. Appl. No. 16/881,401, filed May 22, 2020, SanDisk Technologies LLC.
U.S. Appl. No. 16/910,752, filed Jun. 24, 2020, SanDisk Technologies LLC.
U.S. Appl. No. 16/921,146, filed Jul. 6, 2020, SanDisk Technologies LLC.
U.S. Appl. No. 17/082,629, filed Oct. 28, 2020, SanDisk Technologies LLC.
U.S. Appl. No. 17/176,829, filed Feb. 16, 2021, SanDisk Technologies LLC.
USPTO Office Communication, Notice of Allowance and Fee(s) Due for U.S. Appl. No. 17/176,829, dated Jan. 11, 2023, 16 pages.
Notification of Transmittal of the International Search Report and the Written Opinion of the International Searching Authority for International Patent Application No. PCT/US2021/035959, dated Nov. 12, 2021, 13 pages.

\* cited by examiner

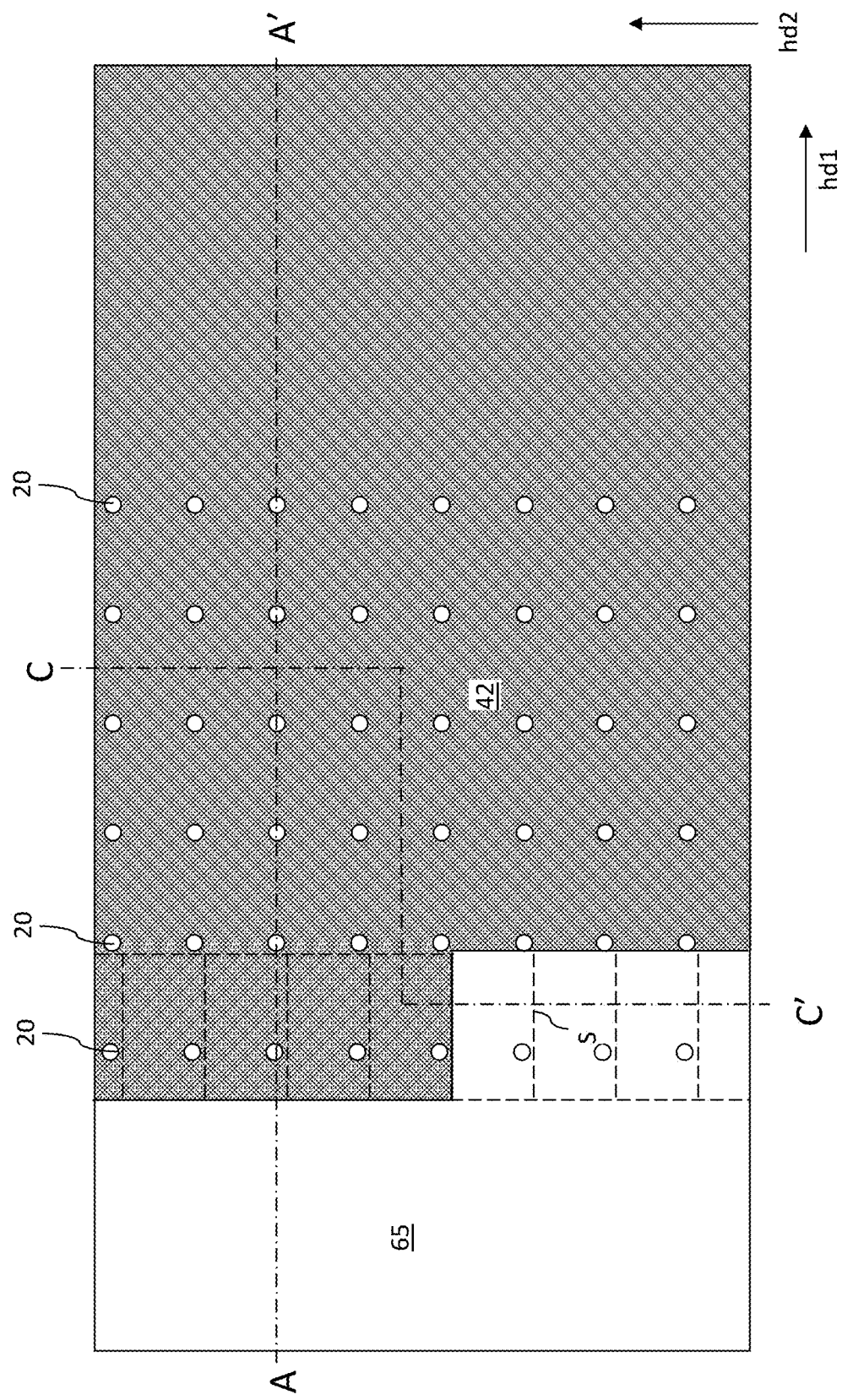

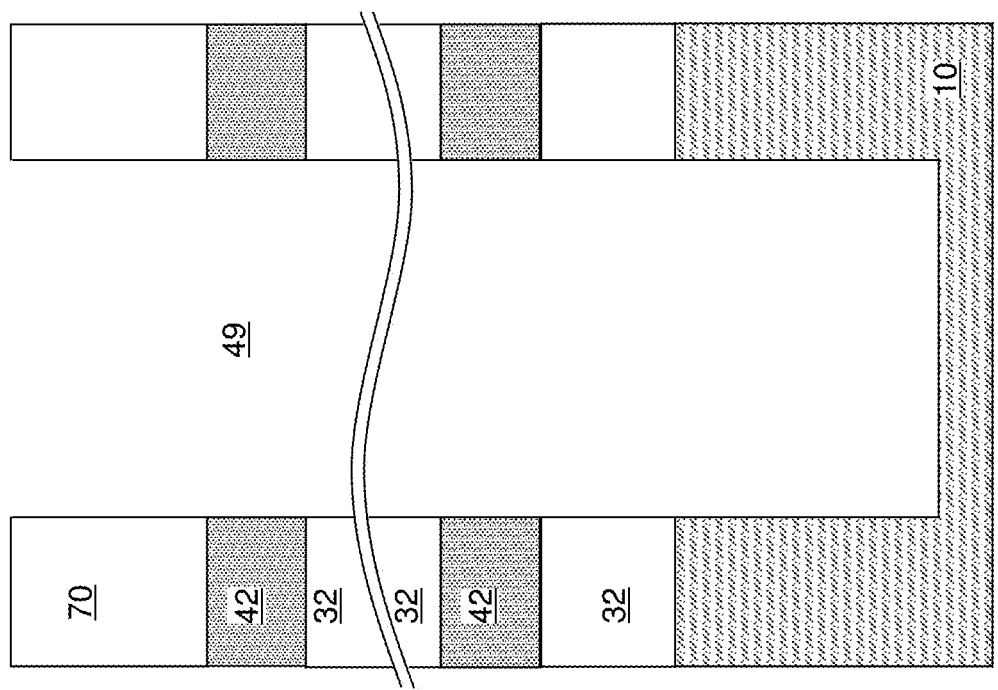

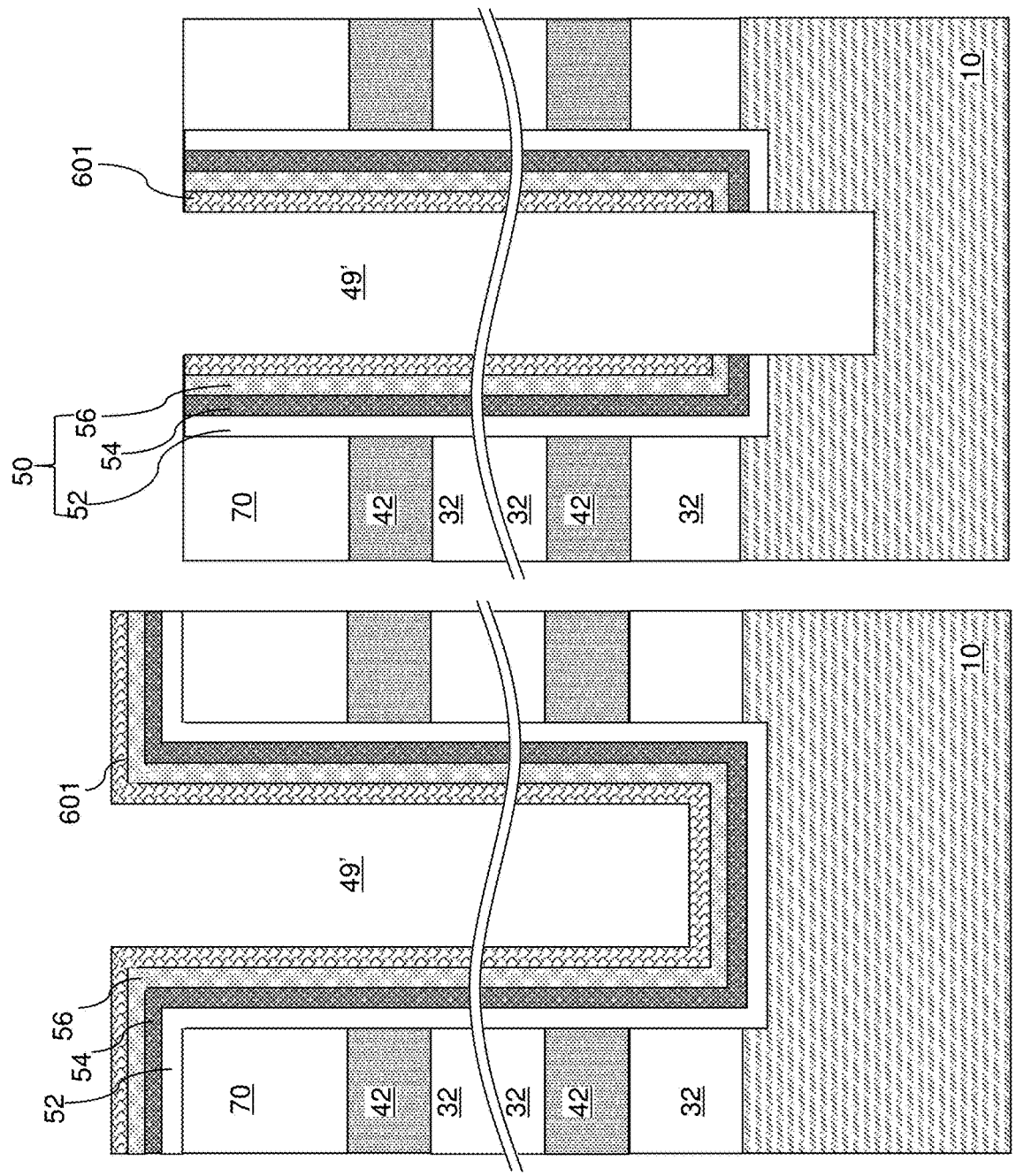

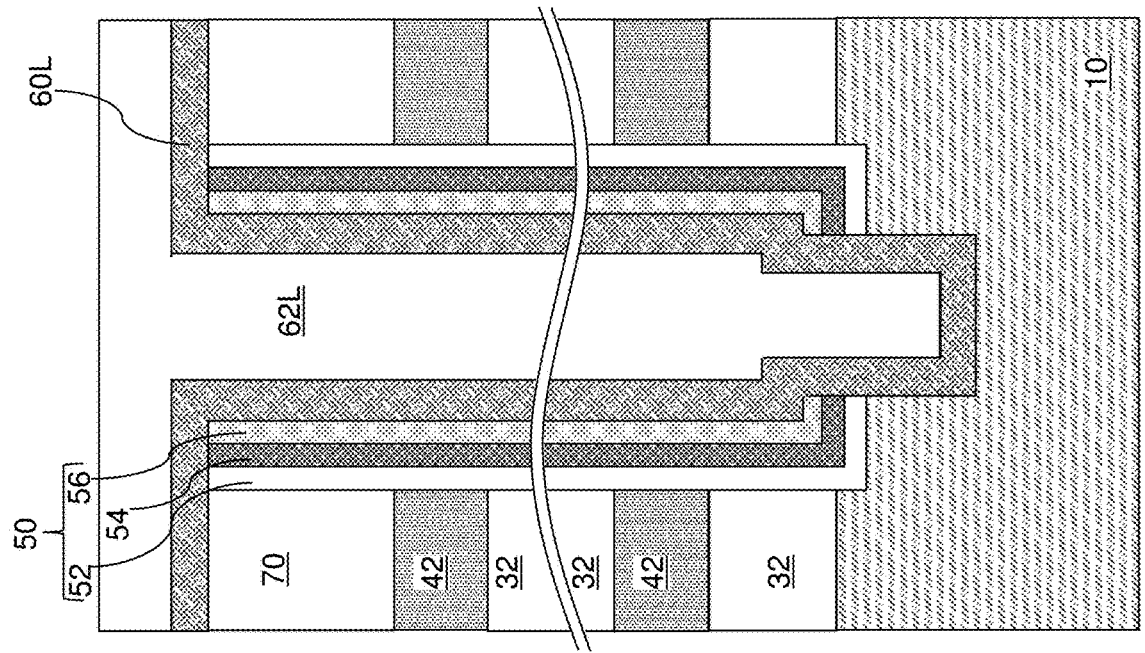
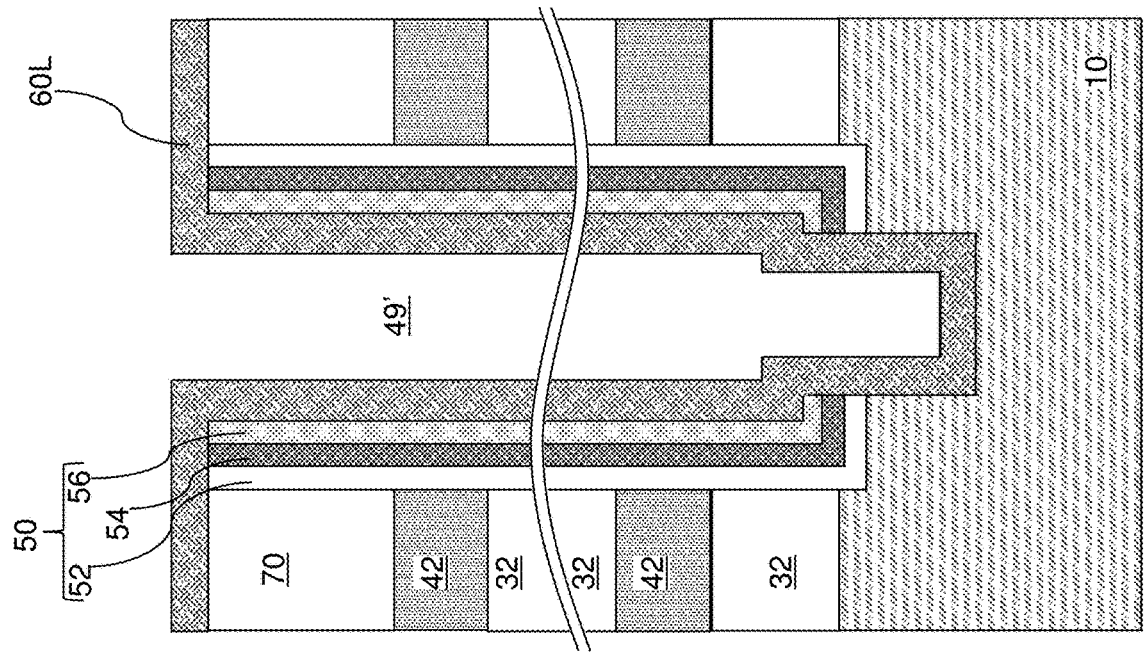

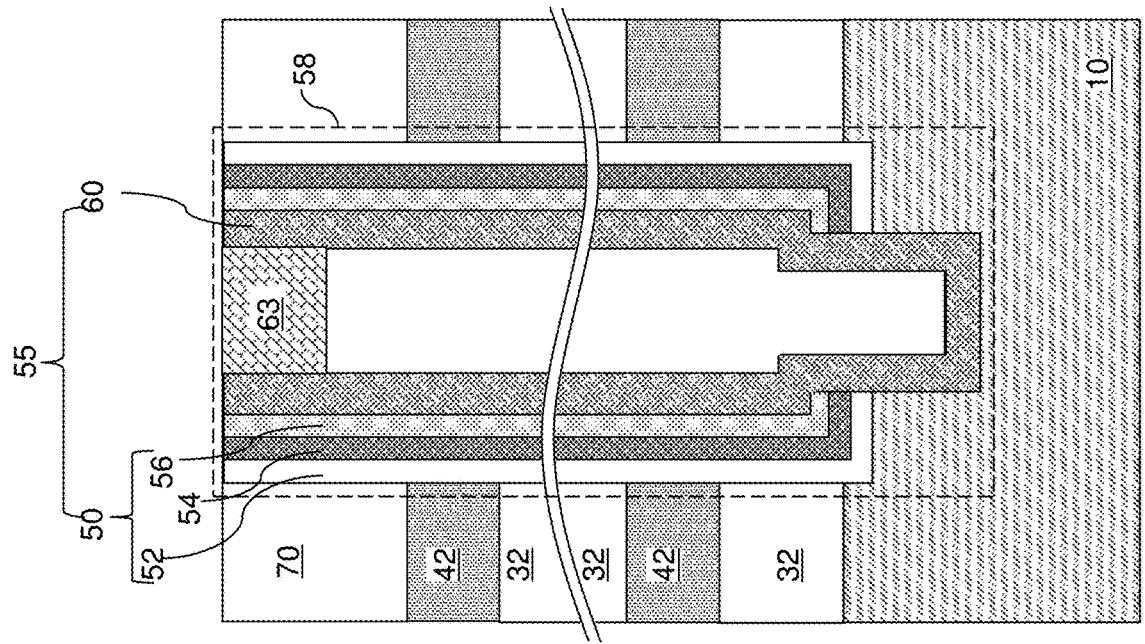
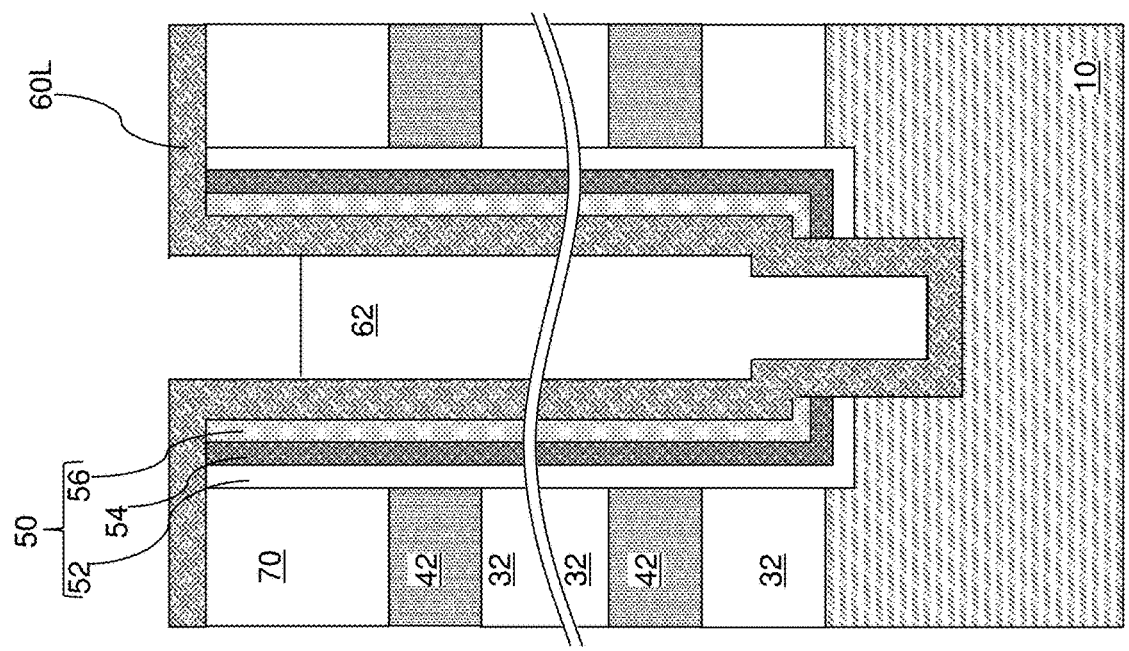
FIG. 6G
FIG. 6F

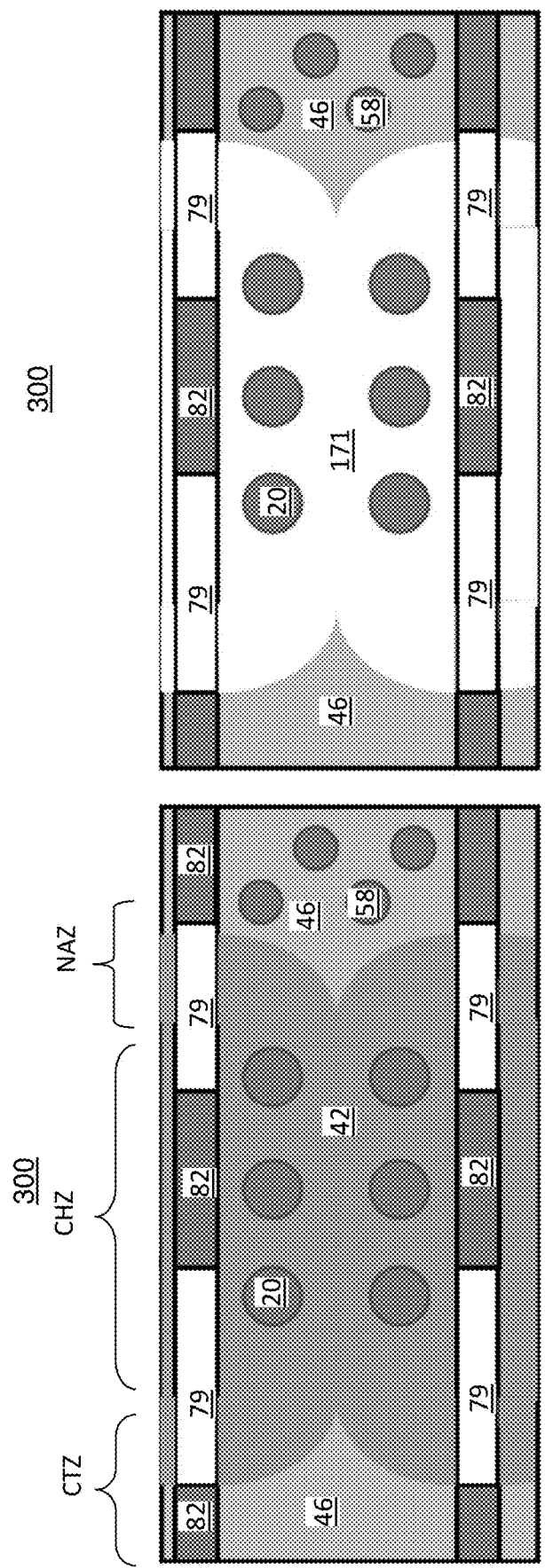

LATERAL TRANSISTORS FOR SELECTING BLOCKS IN A THREE-DIMENSIONAL MEMORY ARRAY AND METHODS FOR FORMING THE SAME

FIELD

The present disclosure relates generally to the field of semiconductor devices, and particularly to a three-dimensional memory device employing lateral transistors for selecting blocks and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device comprises an alternating stack of insulating layers and electrically conductive layers having a staircase region, a memory array region and an access transistor region located between the staircase region and the memory array region, memory opening fill structures comprising a respective vertical semiconductor channel and a respective vertical stack of memory elements extending through the alternating stack in the memory array region, via contact structures contacting the stepped surfaces of the electrically conductive layers at each step in the staircase region, and a vertical stack of access transistors located in the access transistor region.

According to an embodiment of the present disclosure a method of forming a semiconductor structure comprises forming an alternating stack of insulating layers and sacrificial material layers over a substrate, forming memory elements through the alternating stack, forming backside trenches that laterally extend along a first horizontal direction through the alternating stack, wherein the alternating stack is divided into finger regions that are laterally spaced apart from each other along a second horizontal direction which is perpendicular to the first horizontal direction by the backside trenches, and by a staircase region adjoined to end portions of the finger regions, replacing the sacrificial material layers with first electrically conductive layers that are located within a memory array region, second electrically conductive layers that are located within the staircase region, and active semiconductor regions that are located in an access transistor region located between the staircase region and the memory array region, forming vertically extending gate via cavities through the active semiconductor regions, and forming a gate dielectric and a vertical gate electrode in each of the via cavities.

BRIEF DESCRIPTION OF THE DRAWINGS

FIG. 4B is a horizontal cross-sectional view of the exemplary structure along the horizontal plane B-B' of FIG. 4A.

FIGS. 6A-6G are sequential schematic vertical cross-sectional views of a memory opening within the exemplary structure during formation of a memory stack structure, an optional dielectric core, and a drain region therein according to an embodiment of the present disclosure.

FIGS. 13A-13E are horizontal cross-sectional views of the access transistor region of the exemplary structure along the horizontal plane B-B' of FIG. 12A during steps of forming active regions of an access transistor of the exemplary structure according to an embodiment of the present disclosure.

DETAILED DESCRIPTION

Figure 1A:
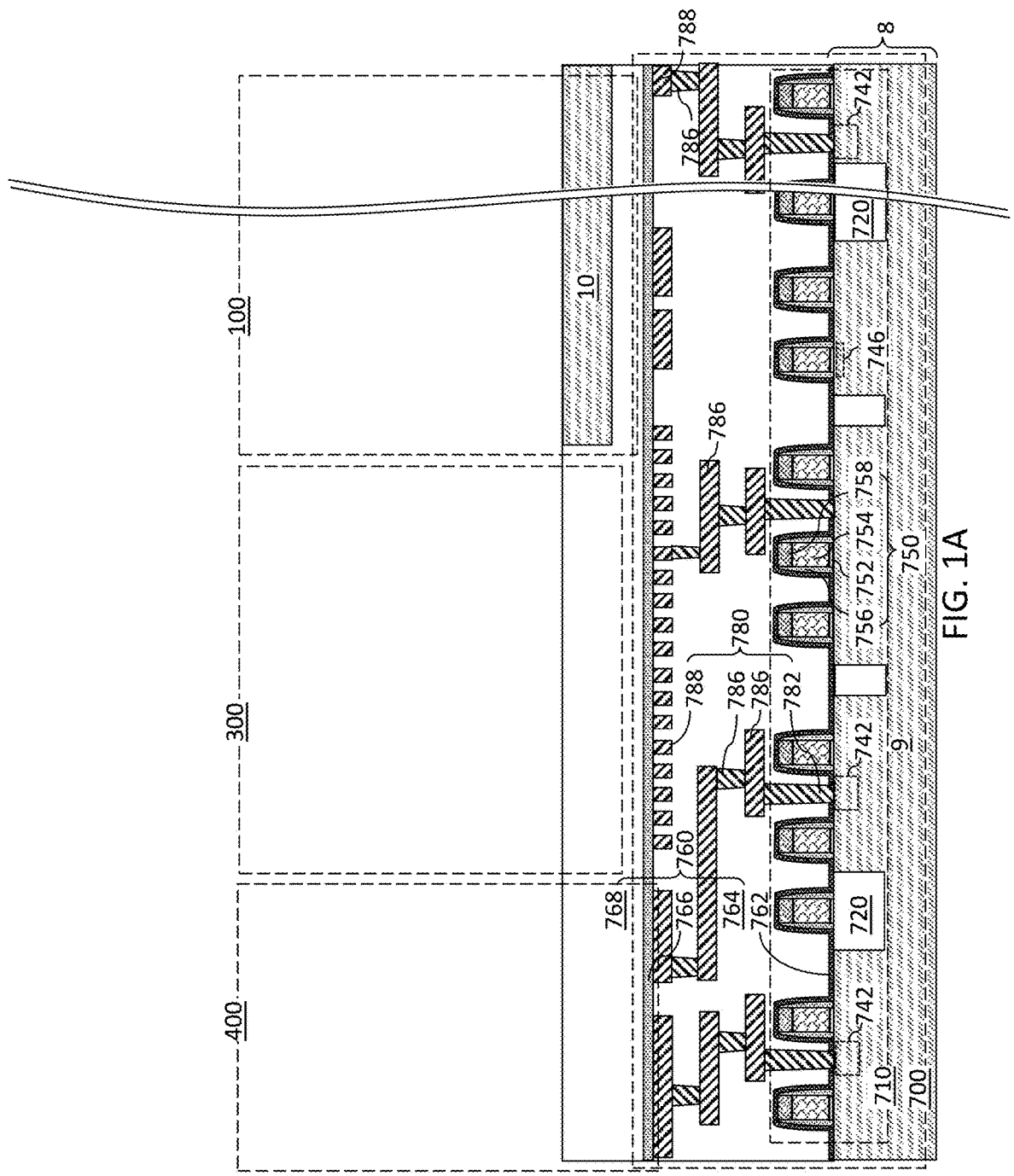
FIG. 1A is a vertical cross-sectional view of an exemplary structure after formation of semiconductor devices, lower-level dielectric material layers, lower-level metal interconnect structures, and in-process source level material layers on a semiconductor substrate according to an embodiment of the present disclosure.

Conventionally, memory block (e.g., finger region) selection in a three dimensional memory device is conducted by placing a word line contact via structure on each word line in every memory block. The word lines in every memory block terminated in an elongated staircase region which extends in the word line direction and exposes every word line at a respective step in the staircase region in each memory block. The embodiments of the present disclosure are directed to a three-dimensional memory device employing access transistors for selecting memory blocks and methods of manufacturing the same, the various aspects of which are described below. An access transistor is located between the memory array region and the staircase region at the level of each of the word lines. The access transistor functions as a memory block/finger selector (i.e., as a "word line gate"). By using the word line gate structure, one word line contact via structure may be used for each word line for all memory blocks/fingers in the same memory plane. Therefore, the staircase area can be reduced in the word line direction by a reciprocal of the number of memory blocks.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1A, an exemplary structure according to an embodiment of the present disclosure is illustrated. The exemplary structure includes a substrate 8, such as a silicon wafer or another suitable substrate, and semiconductor devices 710 formed thereupon. The substrate 8 includes a substrate semiconductor layer 9 at least at an upper portion thereof. The substrate semiconductor layer 9 includes a semiconductor material and may comprise a doped well in a silicon wafer and/or a semiconductor (e.g., silicon) layer deposited over the silicon wafer.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric material layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one second dielectric material layer 768 may comprise, or consist essentially of, dielectric material layers having dielectric constants that do not exceed the dielectric constant of undoped silicate glass (silicon oxide) of 3.9.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

A layer of a semiconductor material may be deposited over, or within patterned recesses of, the at least one second dielectric material layer 768, and is lithographically patterned to provide a patterned semiconductor material layer in a memory array region 100, which is a region in which a three-dimensional memory array is subsequently formed. The patterned semiconductor material layer 10 can include a p-doped semiconductor material or an n-doped semiconductor material. The atomic concentration of electrical dopants in the patterned semiconductor material layer 10 can be in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations may also be employed. In one embodiment, the patterned semiconductor material layer 10 may have a thickness in a range from 100 nm to 2,000 nm, although lesser and greater thicknesses may also be employed.

Figure 1B:
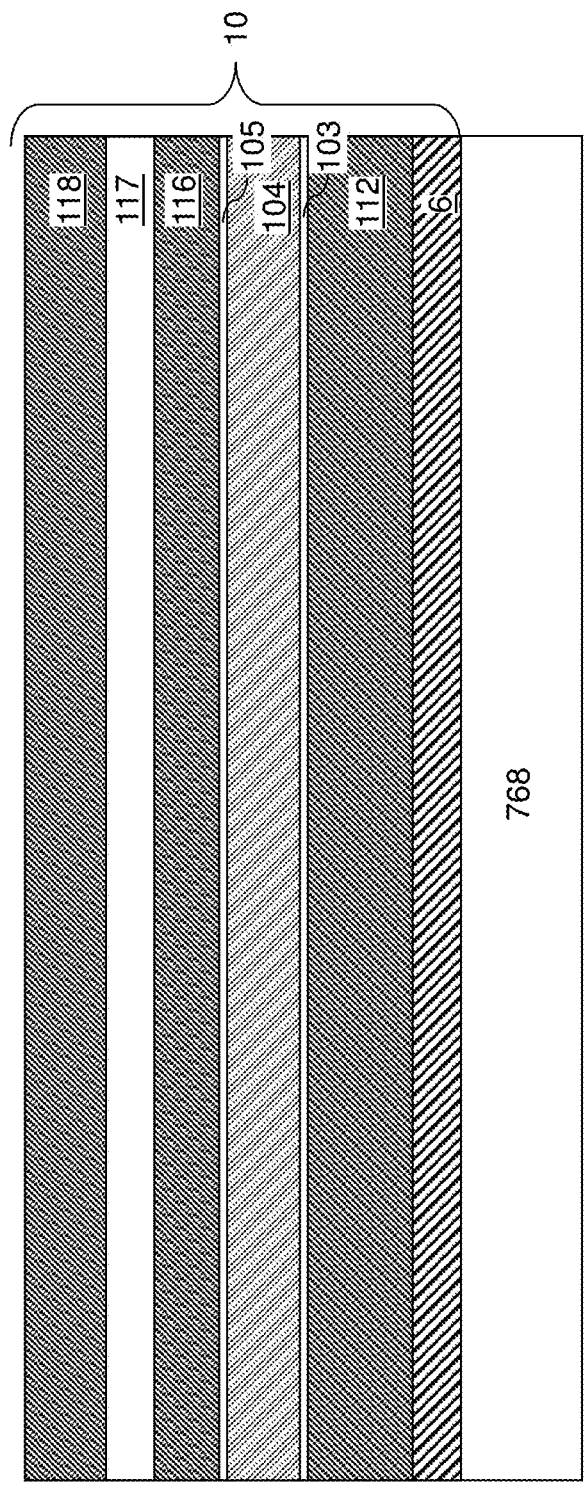
FIG. 1B is a magnified view of a portion of the exemplary structure of FIG. 1A.

As shown in FIG. 1B, an optional conductive plate layer 6 may be provided below the semiconductor material layer 10 and provides a high conductivity conduction path for electrical current that flows into, or out of, the semiconductor material layer. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

In one embodiment, the in-process semiconductor material layer 10 includes several sublayers which are shown in FIG. 1B. The in-process semiconductor material layer may include various layers that are subsequently modified to form source-level material layers. The source-level material layers, upon formation, include a source contact layer that functions as a common source region for vertical field effect transistors of a three-dimensional memory device. In one embodiment, the in-process semiconductor material layer 10 may include, from bottom to top, a lower source-level semiconductor layer 112, a lower sacrificial liner 103, a source-level sacrificial layer 104, an upper sacrificial liner 105, and an upper source-level semiconductor layer 116. An additional source-level insulating layer 117, and an optional source-select-level conductive layer 118 may be formed over the in-process semiconductor material layer 10.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The semiconductor material layer 10 can be formed in a memory array region 100, in which a three-dimensional array of memory elements is subsequently formed. An access transistor region 300 in which access transistors are subsequently formed can be provided adjacent to the memory array region 100. A peripheral region 400 may be provided adjacent to the access transistor region 300.

In one alternative embodiment, the peripheral device region 700 containing the at least one semiconductor device 700 for a peripheral circuitry may be located next to the memory array region 100 in a CMOS next to array configuration. In another alternative embodiment, the peripheral device region 700 may be located on a separate substrate which is subsequently bonded to the memory array region 100.

Figure 2:
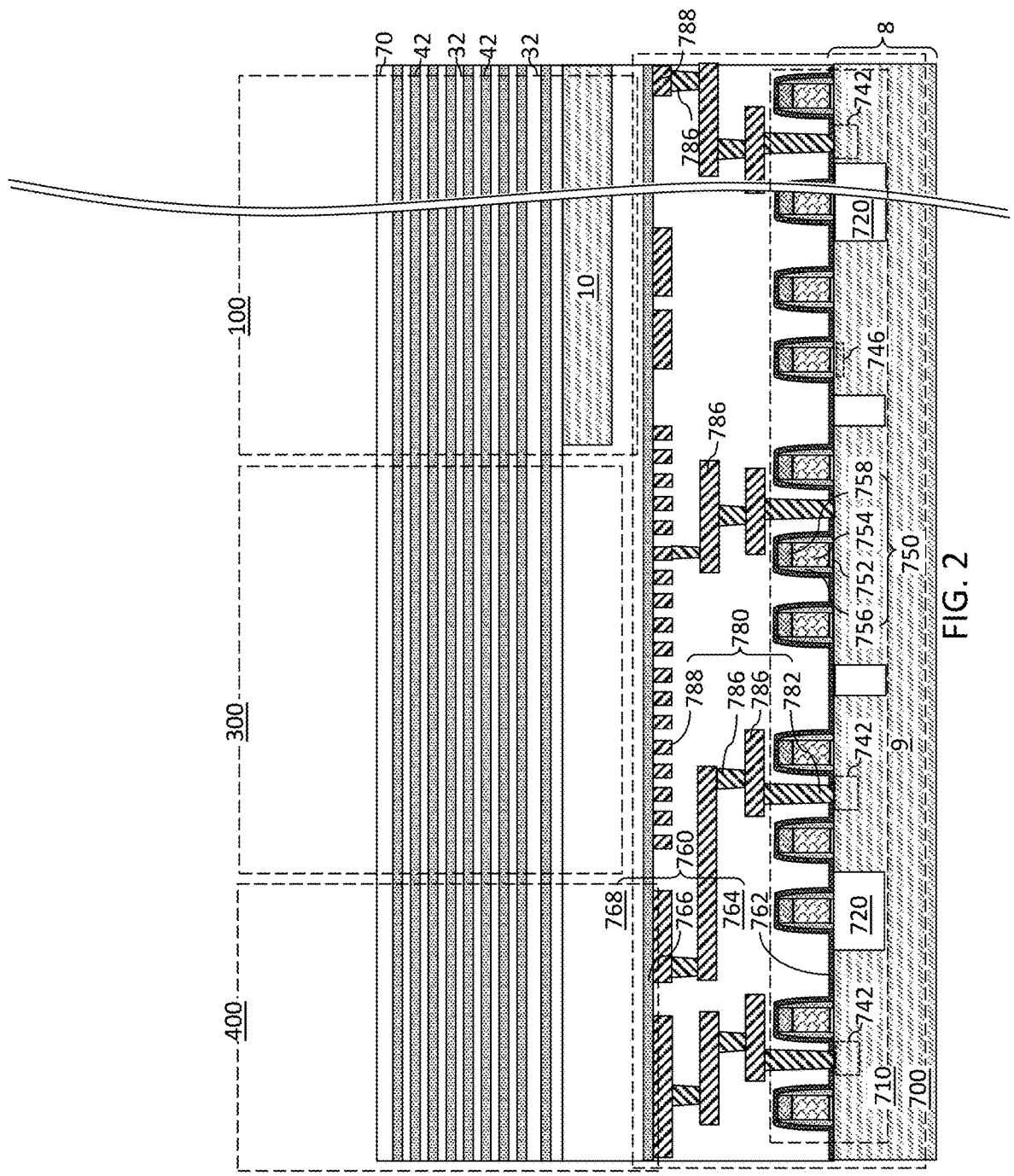
FIG. 2 is a vertical cross-sectional view of the exemplary structure after formation of an alternating stack of insulating layers and sacrificial material layers according to an embodiment of the present disclosure.

Referring to FIG. 2, an alternating stack of first material layers and second material layers is subsequently formed. Each first material layer may include a first material, and each second material layer may include a second material that is different from the material. The alternating stack may include insulating layers 32 as the first material layers, and spacer material layers as the second material layers. In one embodiment, the spacer material layers may be sacrificial material layers that are subsequently replaced with electrically conductive layers. In another embodiment, the spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be insulating layers 32 and sacrificial material layers 42, respectively. In one embodiment, each insulating layer 32 may include an insulating material, and each sacrificial material layer 42 may include a sacrificial material. An alternating plurality of insulating layers 32 and sacrificial material layers 42 is formed over the patterned semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The alternating stack (32, 42) may include insulating layers 32 composed of the first material, and sacrificial material layers 42 composed of the second material, which is different from the first material. The first material of the insulating layers 32 may be at least one insulating material. Insulating materials that may be used for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the material at a rate that is at least twice the rate of removal of the second material. The ratio of the rate of removal of the first material to the rate of removal of the second material is herein referred to as a "selectivity" of the removal process for the material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. In one embodiment, the sacrificial material layers 42 may be material layers that comprise silicon nitride.

In one embodiment, the insulating layers 32 may include silicon oxide, and sacrificial material layers may include silicon nitride sacrificial material layers. The material of the insulating layers 32 may be deposited, for example, by chemical vapor deposition (CVD). For example, if silicon oxide is used for the insulating layers 32, tetraethylorthosilicate (TEOS) may be used as the precursor material for the CVD process. The second material of the sacrificial material layers 42 may be formed, for example, CVD or atomic layer deposition (ALD).

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer 42 may be in a range from 2 to 1,024, and typically from 8 to 256, although a greater number of repetitions may also be used. In one embodiment, each sacrificial material layer 42 in the alternating stack (32, 42) may have a uniform thickness that is substantially invariant within each respective sacrificial material layer 42.

An optional insulating cap layer 70 is subsequently formed over the alternating stack (32, 42). The insulating cap layer 70 includes a dielectric material, which may be any dielectric material that may be used for the insulating layers 32. In one embodiment, the insulating cap layer 70 includes the same dielectric material as the insulating layers 32. The thickness of the insulating cap layer 70 may be in a range from 20 nm to 300 nm, although lesser and greater thicknesses may also be used.

Figure 3A:
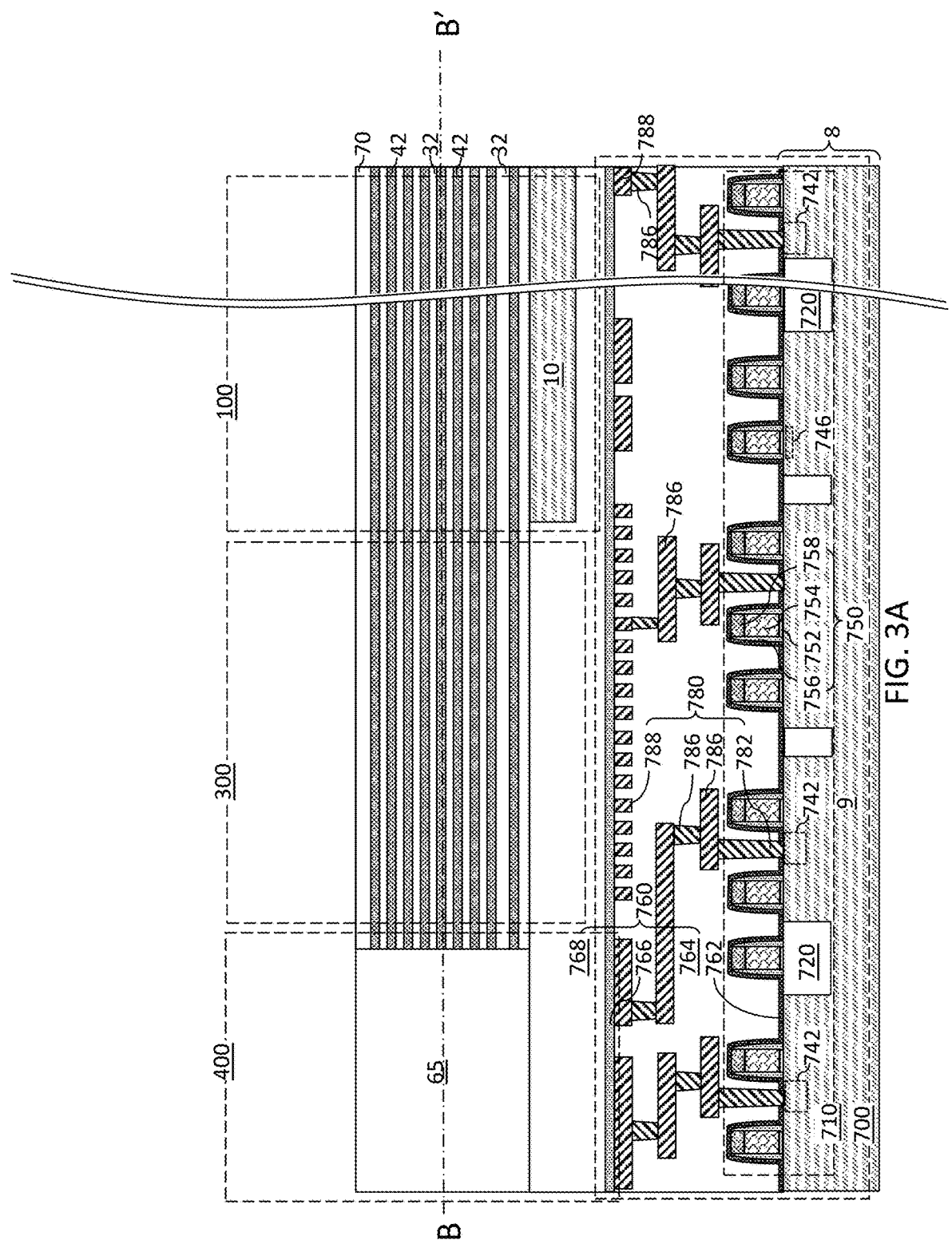
FIG. 3A is a vertical cross-sectional view of the exemplary structure after formation of stepped surfaces and a retro-stepped dielectric material portion according to an embodiment of the present disclosure.
Figure 3B:
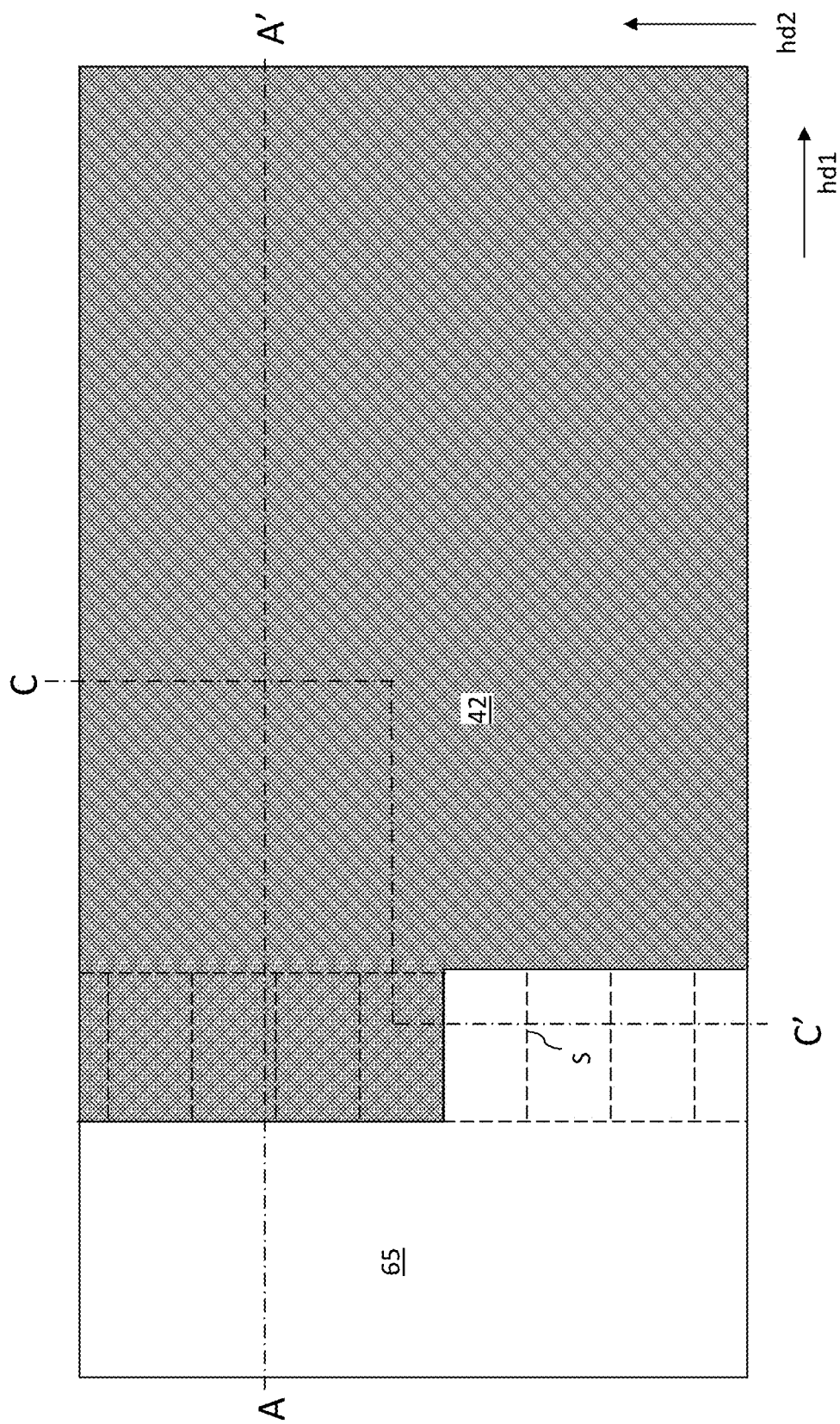
FIG. 3B is a horizontal cross-sectional view of the exemplary structure along the horizontal plane B-B' of FIG. 3A.
Figure 3C:
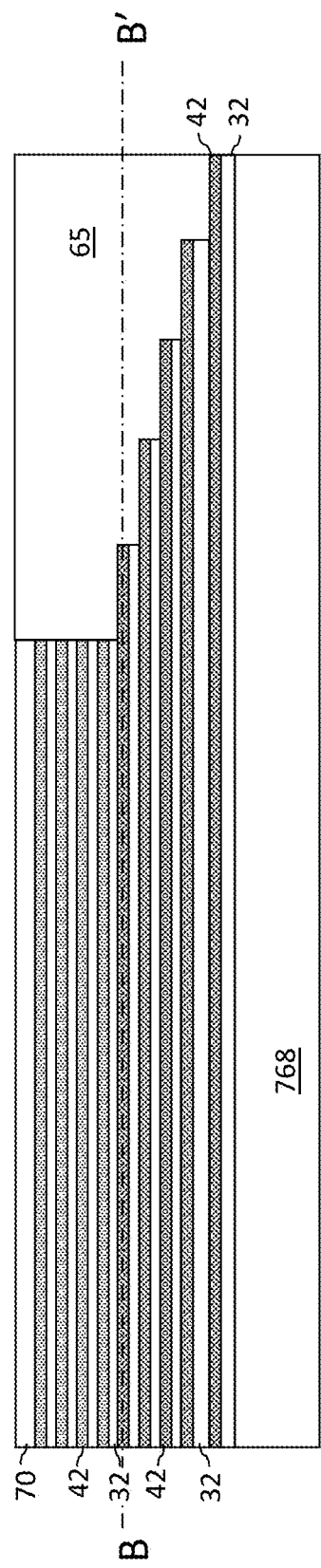
FIG. 3C is a vertical cross-sectional plane of an upper region of the exemplary structure along a zig-zag vertical cross-sectional plane C-C' of FIG. 3B.
Figure 4A:
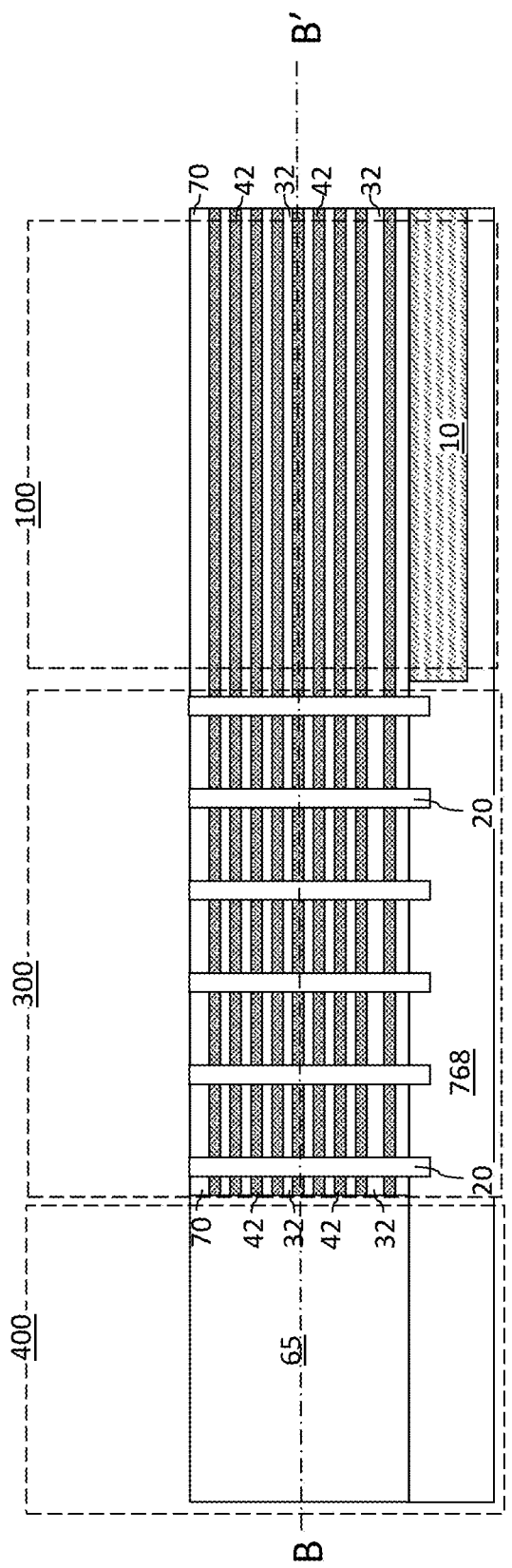
FIG. 4A is a vertical cross-sectional view of the exemplary structure after formation of support pillar structures according to an embodiment of the present disclosure.
Figure 4C:
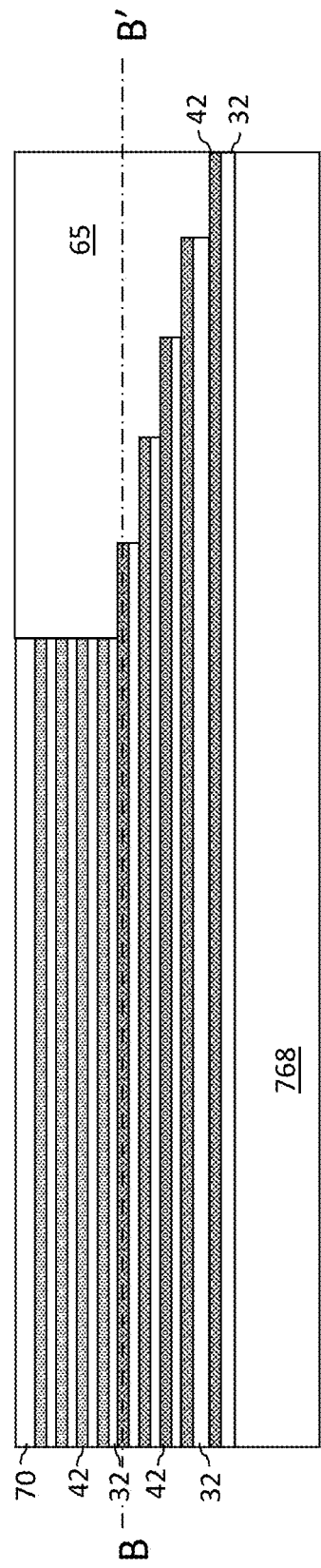
FIG. 4C is a vertical cross-sectional plane of an upper region of the exemplary structure along a zig-zag vertical cross-sectional plane C-C' of FIG. 4B.

Referring to FIGS. 3A-3C, the alternating stack (32, 42) can be patterned to remove portions of the alternating stack (32, 42) from the peripheral region 400. Stepped surfaces are formed at a peripheral area of the access transistor region 300 that is proximal to the peripheral region 400 and laterally spaced from the memory array region 100. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

According to an aspect of the present disclosure, the stepped surfaces can be formed such that the vertical steps S of the stepped surfaces laterally extend along the first horizontal direction (e.g., word line direction) hd1 and the lateral extent of the sacrificial material layers 42 changes along a second horizontal direction (e.g., bit line direction) hd2 that is perpendicular to the first horizontal direction hd1. In other words, the vertical steps S step up and down along the bit line direction hd2. In one embodiment, there are no up or down steps along the word line direction hd1. Locations of the vertical steps S of the stepped surfaces are illustrated in FIG. 3B as dotted lines. The vertical steps S may be laterally spaced from each other along the second horizontal direction hd2 with a uniform lateral spacing.

The stepped surfaces can be formed such that each sacrificial material layer comprises a respective rectangular surface that is not covered by any other overlying one among the sacrificial material layers 42. Thus, each sacrificial material layer 42 other than a topmost sacrificial material layer 42 within the alternating stack (32, 42) laterally extends farther along the bit line direction hd2 than any overlying sacrificial material layer 42 within the alternating stack (32, 42) within the area of the stepped surfaces. The stepped surfaces of the alternating stack (32, 42) continuously extend from a bottommost layer within the alternating stack (32, 42) to a topmost layer within the alternating stack (32, 42) along the bit line direction hd2.

A retro-stepped dielectric material portion 65 (i.e., an insulating fill material portion) can be formed over the stepped surfaces and around the alternating stack (32, 42) by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP).

The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
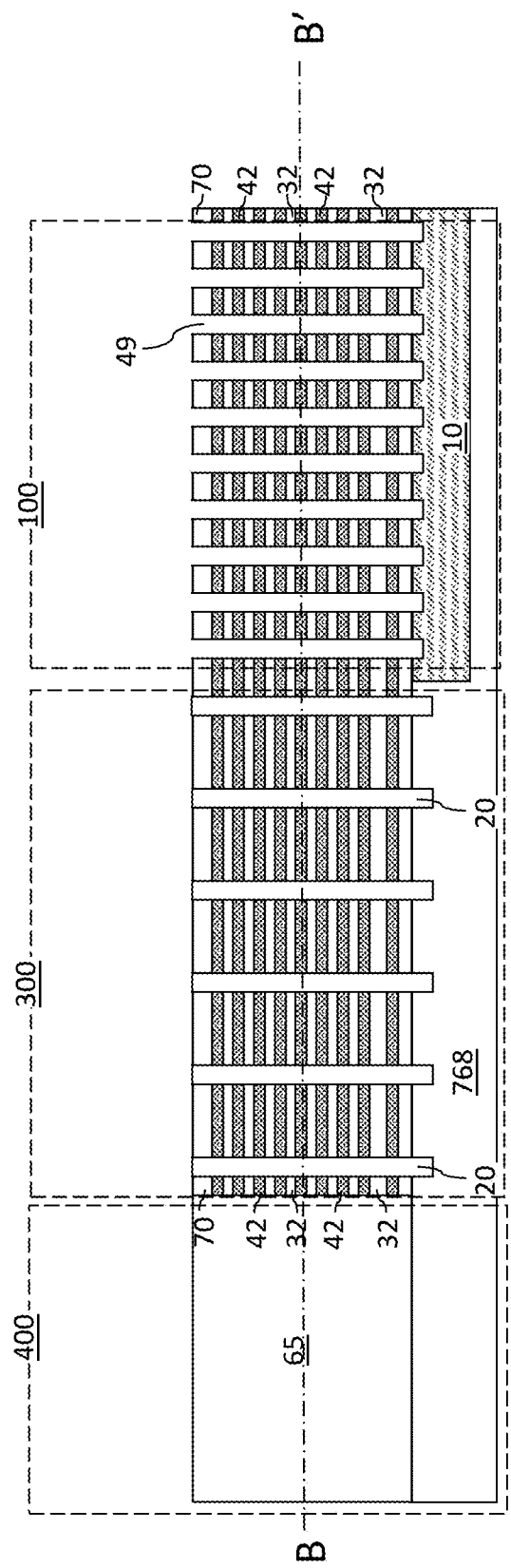
FIG. 5A is a vertical cross-sectional view of the exemplary structure after formation of memory openings according to an embodiment of the present disclosure.
Figure 5B:
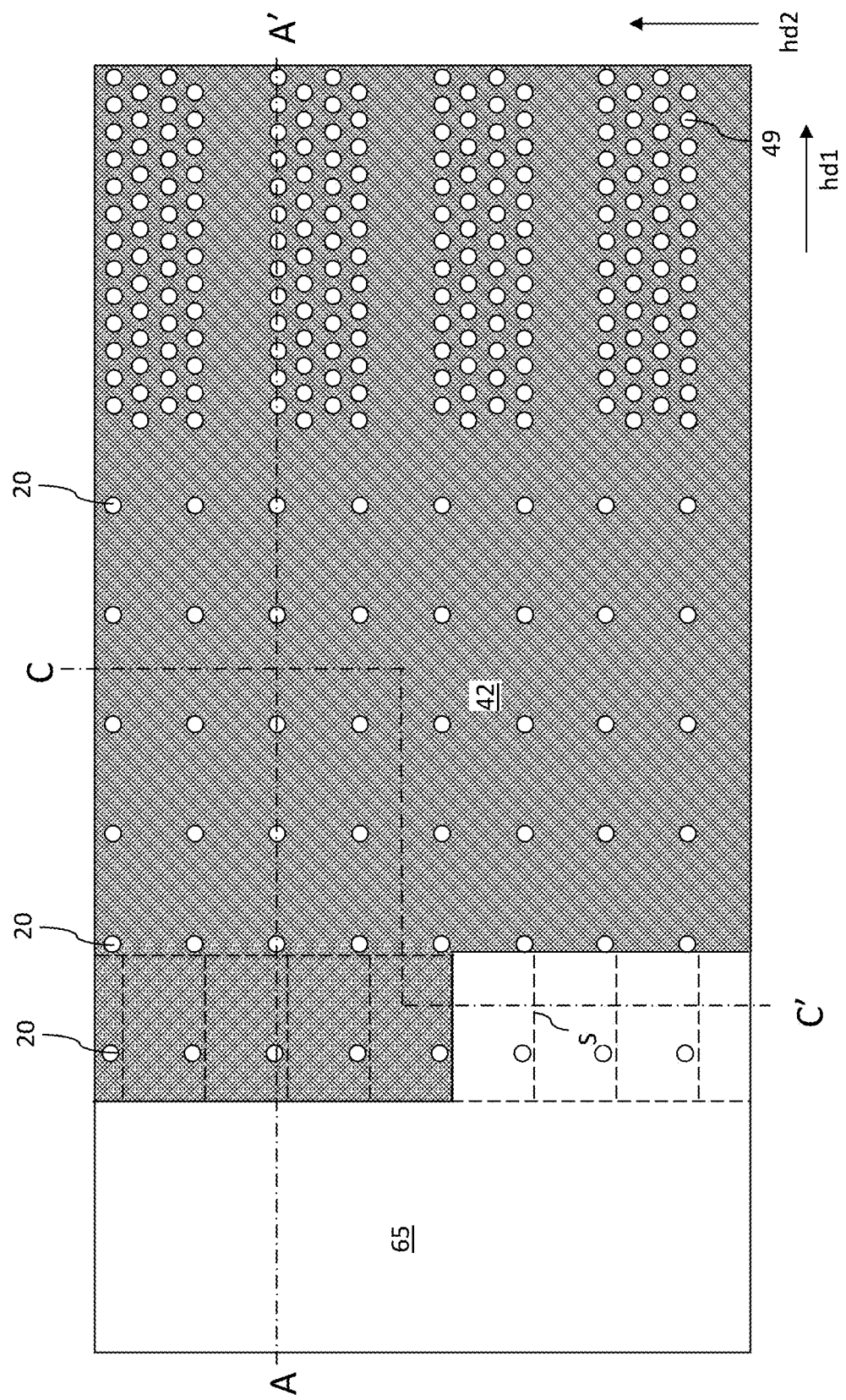
FIG. 5B is a horizontal cross-sectional view of the exemplary structure along the horizontal plane B-B' of FIG. 5A.
Figure 5C:
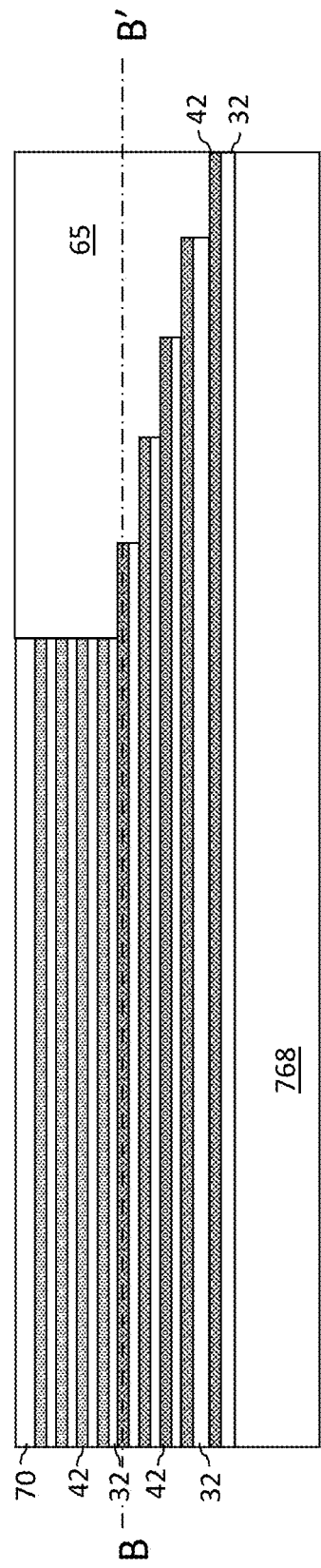
FIG. 5C is a vertical cross-sectional plane of an upper region of the exemplary structure along a zig-zag vertical cross-sectional plane C-C' of FIG. 5B.
Figure 7A:
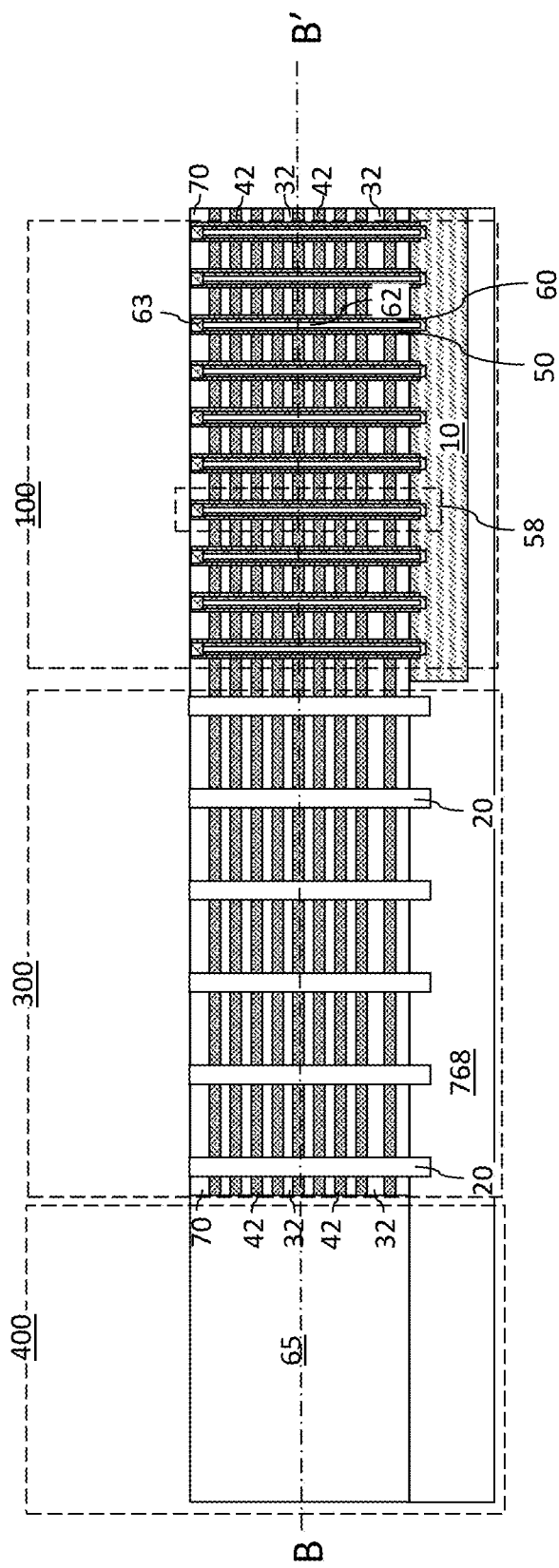
FIG. 7A is a vertical cross-sectional view of the exemplary structure after formation of memory opening fill structures according to an embodiment of the present disclosure.
Figure 7B:
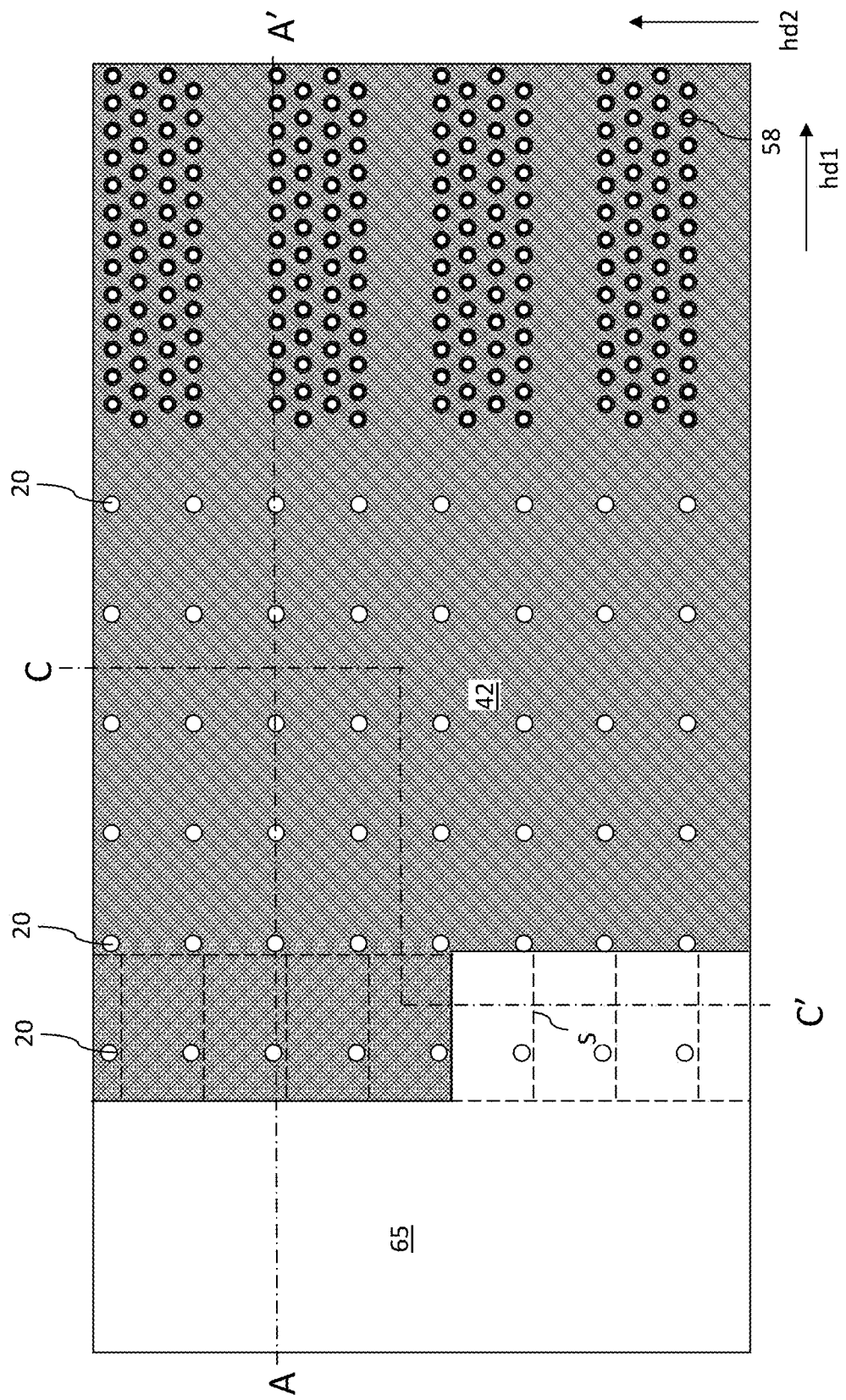
FIG. 7B is a horizontal cross-sectional view of the exemplary structure along the horizontal plane B-B' of FIG. 7A.
Figure 7C:
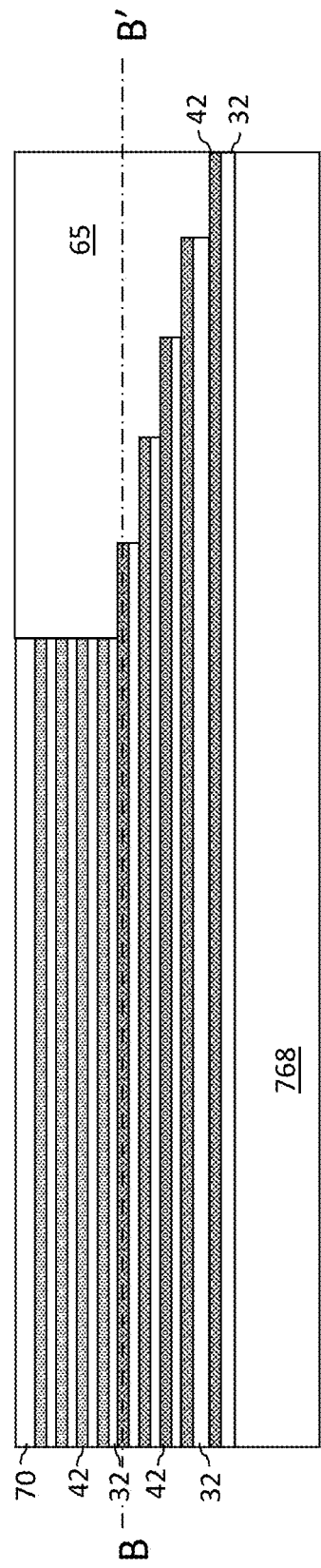
FIG. 7C is a vertical cross-sectional plane of an upper region of the exemplary structure along a zig-zag vertical cross-sectional plane C-C' of FIG. 7B.

Referring to FIGS. 5A-5C, a photoresist layer (not shown) can be applied over the exemplary structure, and can be lithographically patterned to form an array of discrete openings within the access transistor region 300. The pattern of the openings in the photoresist layer can be transferred through the alternating stack (32, 42) and the retro-stepped dielectric material portion 65 by an anisotropic etch process. Support openings vertically extending to a top portion of an underlying material layer (such as the at least one second dielectric material layer 768) that underlies the alternating stack (32, 42) can be formed. The photoresist layer can be subsequently removed, for example, by ashing.

A dielectric material such as undoped silicate glass or a doped silicate glass can be conformally deposited in the support openings by a conformal deposition process such as a chemical vapor deposition process. Excess portions of the dielectric material can be removed from above the top surface of the insulating cap layer 70 and the retro-stepped dielectric material portion 65 by a planarization process such as a chemical mechanical polishing process. Remaining portions of the dielectric material filling the support openings comprise support pillar structures 20.

Clusters of memory openings 49 are formed in the memory array region 100. The memory openings 49 may be formed during the same etching step as the support openings or they may be formed using a separate masking and etching step after formation of the support pillar structures 20.

FIGS. 6A-6G illustrate structural changes in a memory opening 49, which is one of the memory openings 49 in the exemplary structure of FIGS. 5A-5C. Referring to FIG. 6A, a memory opening 49 extends through the first-tier structure and the second-tier structure.

Referring to FIG. 6B, a stack of layers including a blocking dielectric layer 52, a memory material layer 54, a tunneling dielectric layer 56, and a semiconductor channel layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the memory material layer 54 may be formed. While the present disclosure is described employing an embodiment in which the memory material layer 54 is a single continuous layer, embodiments are expressly contemplated herein in which the memory material layer 54 is replaced with a plurality of memory material portions (which can be charge trapping material portions, electrically inhibited conductive material portions or ferroelectric material portions) that are vertically spaced apart. The thickness of the memory material layer 54 may be in a range from 2 nm to 20 nm, although lesser and greater thicknesses may also be used.

In one embodiment, each vertical stack of memory elements comprises a vertical stack of charge storage material portions that retain electrical charges therein upon programming, or a vertical stack of ferroelectric memory elements that retains electrical polarization therein upon programming. In case the vertical stack of ferroelectric memory elements is used, the memory material layer 54 may comprise a continuous ferroelectric material layer or a plurality of discrete, vertically separated ferroelectric material portions. The ferroelectric material may comprise orthorhombic phase hafnium oxide doped with silicon, aluminum or zirconium for example.

In one embodiment, the memory material layer 54 may be a continuous layer or patterned discrete portions of a charge trapping material including a dielectric charge trapping material, which may be, for example, silicon nitride. Alternatively, the memory material layer 54 may include a continuous layer or patterned discrete portions of a conductive material such as doped polysilicon or a metallic material that is patterned into multiple electrically isolated portions (e.g., floating gates). In one embodiment, the memory material layer 54 includes a silicon nitride layer. The thickness of the memory material layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the memory material layer 54, and the tunneling dielectric layer 56 constitutes a memory film 50 that stores memory bits.

The optional sacrificial cover material layer 601 includes a sacrificial material that can be subsequently removed selective to the material of the tunneling dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 6C, the optional sacrificial cover material layer 601, the tunneling dielectric layer 56, the memory material layer 54, the blocking dielectric layer 52 are sequentially anisotropically etched employing at least one anisotropic etch process. The portions of the sacrificial cover material layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the sacrificial cover material layer 601, the tunneling dielectric layer 56, the memory material layer 54, and the blocking dielectric layer 52 at a bottom of each memory cavity 49' can be removed to form openings in remaining portions thereof. Each of the sacrificial cover material layer 601, the tunneling dielectric layer 56, the memory material layer 54, and the blocking dielectric layer 52 can be etched by a respective anisotropic etch process employing a respective etch chemistry, which may, or may not, be the same for the various material layers. Each remaining portion of the sacrificial cover material layer 601 can have a tubular configuration.

Referring to FIG. 6D, a semiconductor channel layer 60L can be deposited directly on the semiconductor surface of the semiconductor material layer 10, and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 6E, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 6F, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIGS. 6G and 7A-7C, a doped semiconductor material can be deposited within each recessed region above the dielectric cores 62. The deposited semiconductor material can have a doping of a conductivity type that is the opposite of the conductivity type of the semiconductor material layer 10. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited doped semiconductor material and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having the second conductivity type constitutes a drain region 63. Each remaining portion of the semiconductor channel layer 60L constitutes a vertical semiconductor channel 60.

A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges or ferroelectric polarization with a macroscopic retention time. In some embodiments, a blocking dielectric layer 52 may not be present in the memory film 50 at this step, and a blocking dielectric layer may be subsequently formed after formation of backside recesses. Furthermore, if the ferroelectric memory material layer 54 is used, then the tunneling dielectric layer 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer 52. Each combination of a memory stack structure 55, a dielectric core 62, and a drain region 63 within a memory opening 49 is herein referred to as a memory opening fill structure 58. Generally, an alternating stack of insulating layers 32 and sacrificial material layers 42 can be formed over a substrate 8, and a three-dimensional array of memory strings containing memory elements can be formed through the alternating stack (32, 42). Each of the memory elements (e.g., portion of the memory material layer 54) is laterally surrounded by a respective one of the sacrificial material layers 42.

Figure 8A:
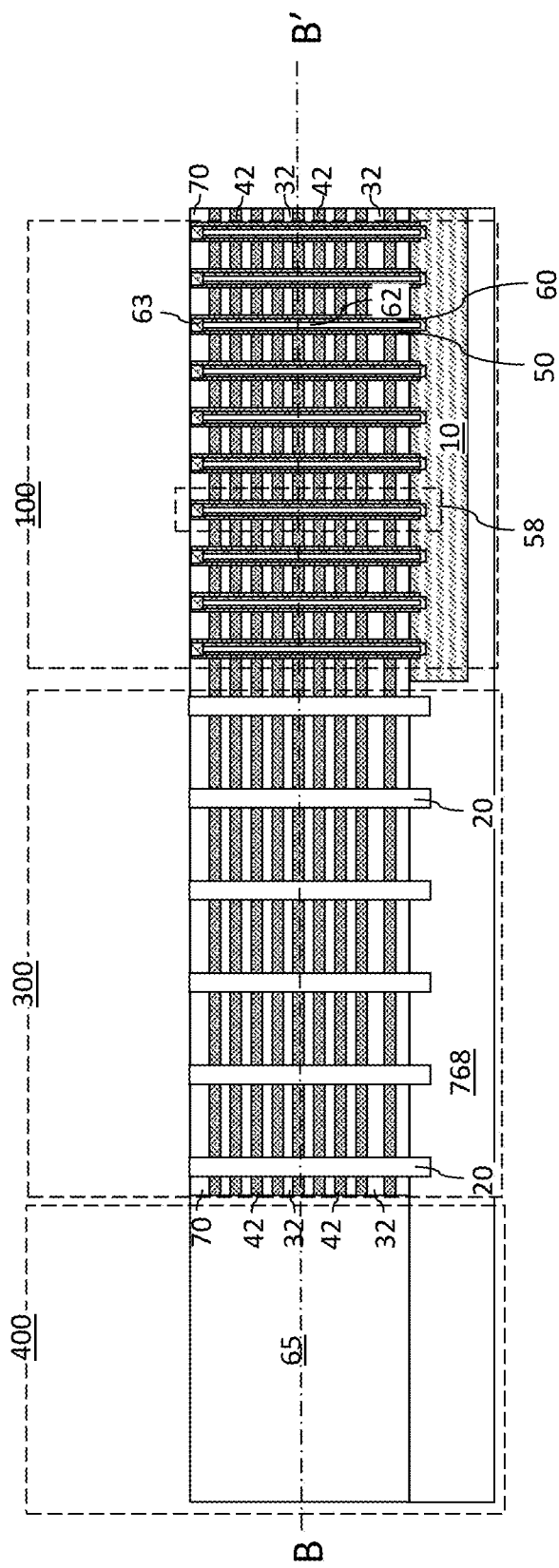
FIG. 8A is a vertical cross-sectional view of the exemplary structure after formation of backside trenches according to an embodiment of the present disclosure.
Figure 8B:
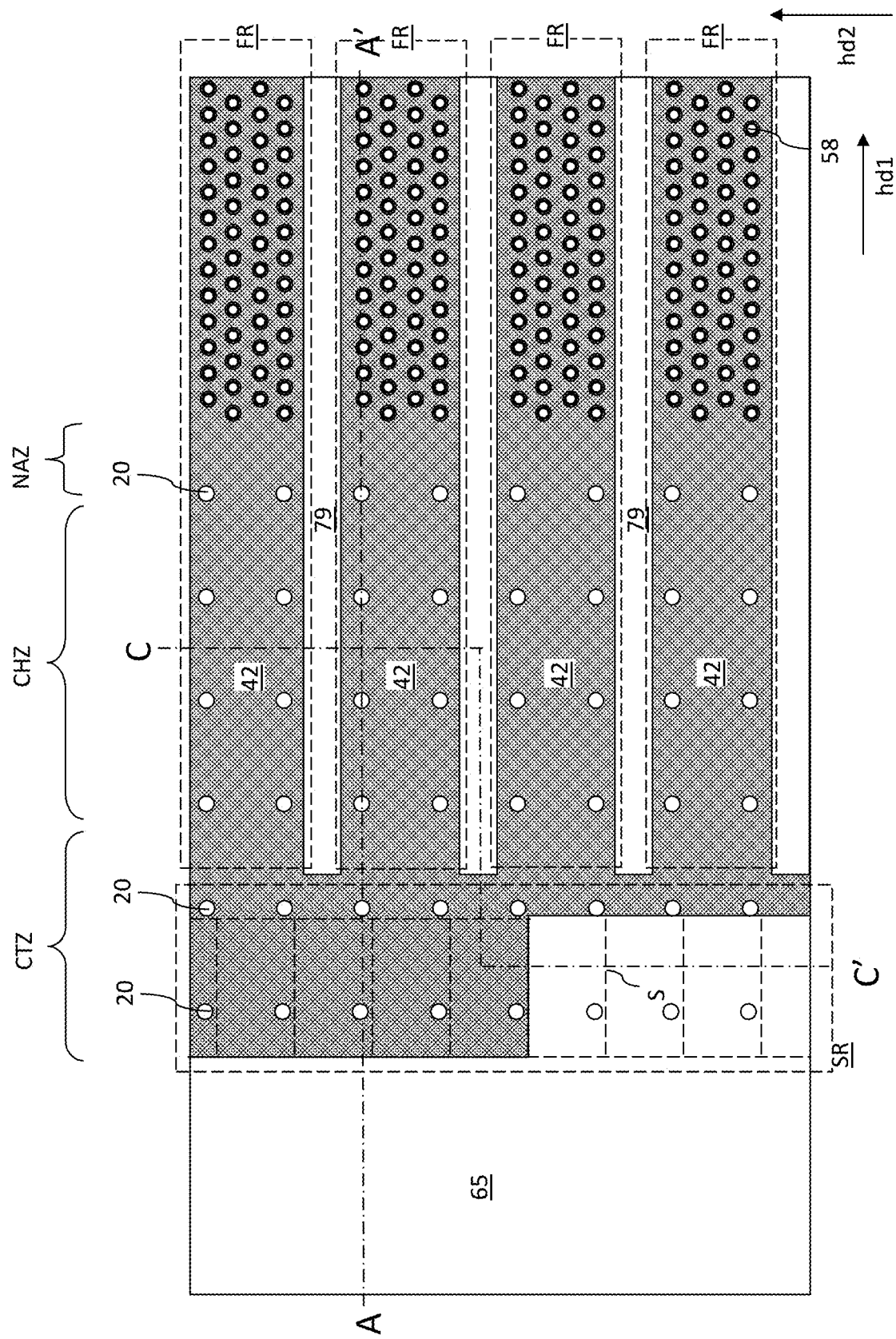
FIG. 8B is a horizontal cross-sectional view of the exemplary structure along the horizontal plane B-B' of FIG. 8A.
Figure 8C:
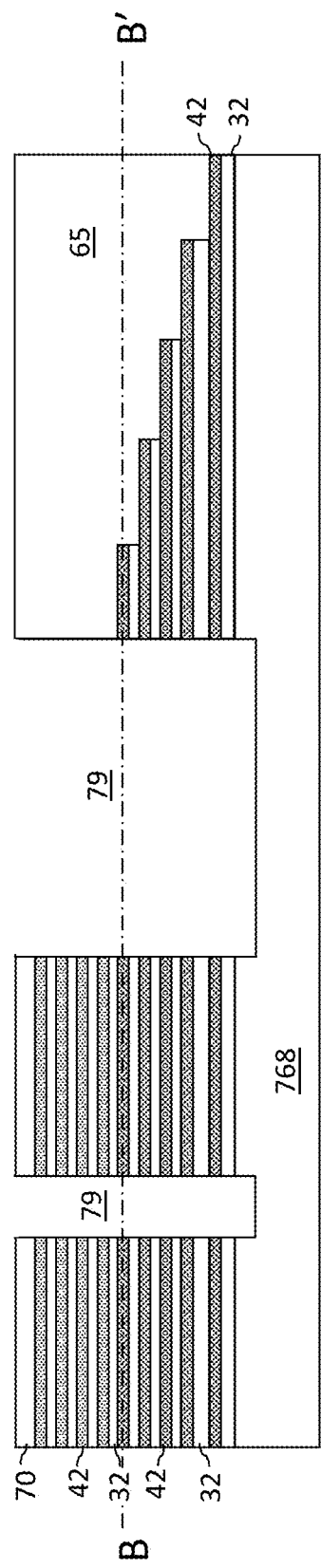
FIG. 8C is a vertical cross-sectional plane of an upper region of the exemplary structure along a zig-zag vertical cross-sectional plane C-C' of FIG. 8B.

Referring to FIGS. 8A-8C, a photoresist layer (not shown) can be applied over the exemplary structure, and can be lithographically patterned to form slit-shaped openings that laterally extend along the first horizontal direction between clusters of memory opening fill structures 58. As shown in FIG. 8B, the access transistor zone 300 can include a near-array zone NAZ that adjoins the memory array region 100, a contact zone CTZ that is adjacent to the retro-stepped dielectric material portion 65, and a channel zone CHZ that is located between the near-array zone NAZ and the contact zone CTZ and is subsequently employed to provide semiconductor channels for access transistors. In one embodiment, the openings in the photoresist layer can have a respective rectangular horizontal cross-sectional shape, and can laterally extend across the memory array region 100, and across the near-array zone NAZ and the channel zone CHZ of the access transistor region 300. The openings in the photoresist layer can extend into a peripheral segment of the contact zone CTZ within the access transistor zone 300.

An anisotropic etch process can be performed to transfer the pattern in the photoresist layer through the alternating stack (32, 42). Backside trenches 79 laterally extending along the first horizontal direction hd1 can be formed between clusters of the memory opening fill structures 58. The width of each backside trench 79 as measured along the second horizontal direction hd2 may be in a range from 100 nm to 2,000 nm, although lesser and greater widths may also be employed. The alternating stack (32, 42) is divided into finger regions FR that are laterally spaced apart from each other by the backside trenches 79, and a based region BR adjoined to end portions of the finger regions FR. Each finger region FR corresponds to one memory block. Each finger region FR can laterally extend through the memory array region 100 and through the near-array zone NAZ and the channel zone CHZ of the access transistor region 300, and the staircase region SR can be located at a contact zone CTZ of the access transistor region 300 that includes the areas of the stepped surfaces of the alternating stack (32, 42). Thus, the alternating stack (32, 42) comprises finger regions FR that are laterally spaced from each other by a plurality of backside trenches 79 and a staircase region SR that is adjoined to each of the finger regions FR. The finger regions FR laterally extend along the first horizontal direction hd1, and are laterally spaced apart along the second horizontal direction hd2 (which is perpendicular to the first horizontal direction hd1), and the staircase region SR laterally extends along the second horizontal direction hd2.

Figure 9A:
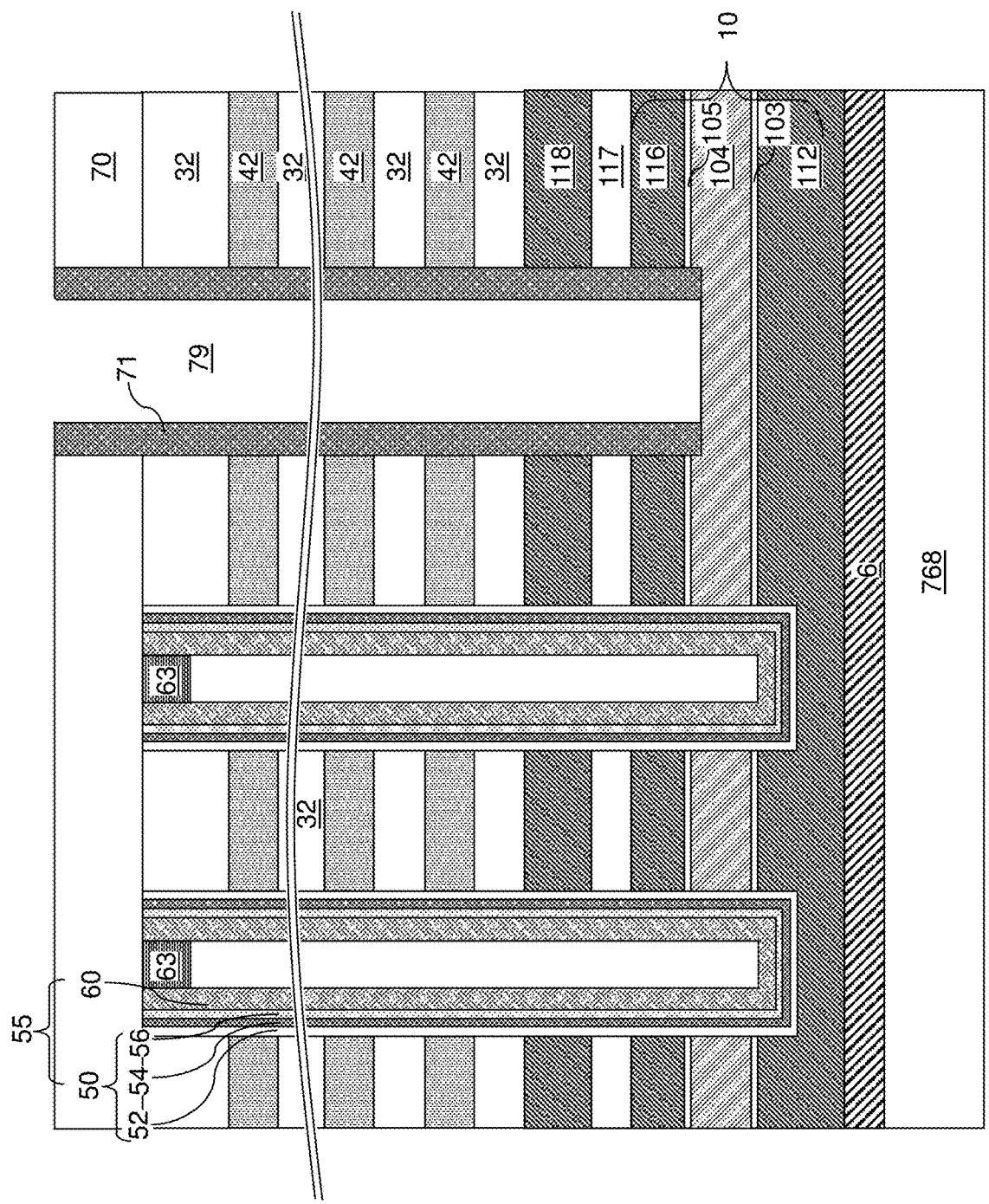
FIGS. 9A-9E illustrate sequential vertical cross-sectional views of memory opening fill structures and a backside trench during formation of source-level material layers according to an embodiment of the present disclosure.

Referring to FIG. 9A, a backside trench spacer 71 may be formed on sidewalls of each backside trench 79. For example, a conformal spacer material layer may be deposited in the backside trenches 79 and over the first contact level dielectric layer 280, and may be anisotropically etched to form the backside trench spacers 71. The backside trench spacers 71 include a material that is different from the material of the source-level sacrificial layer 104. For example, the backside trench spacers 71 may include silicon nitride.

Figure 9B:
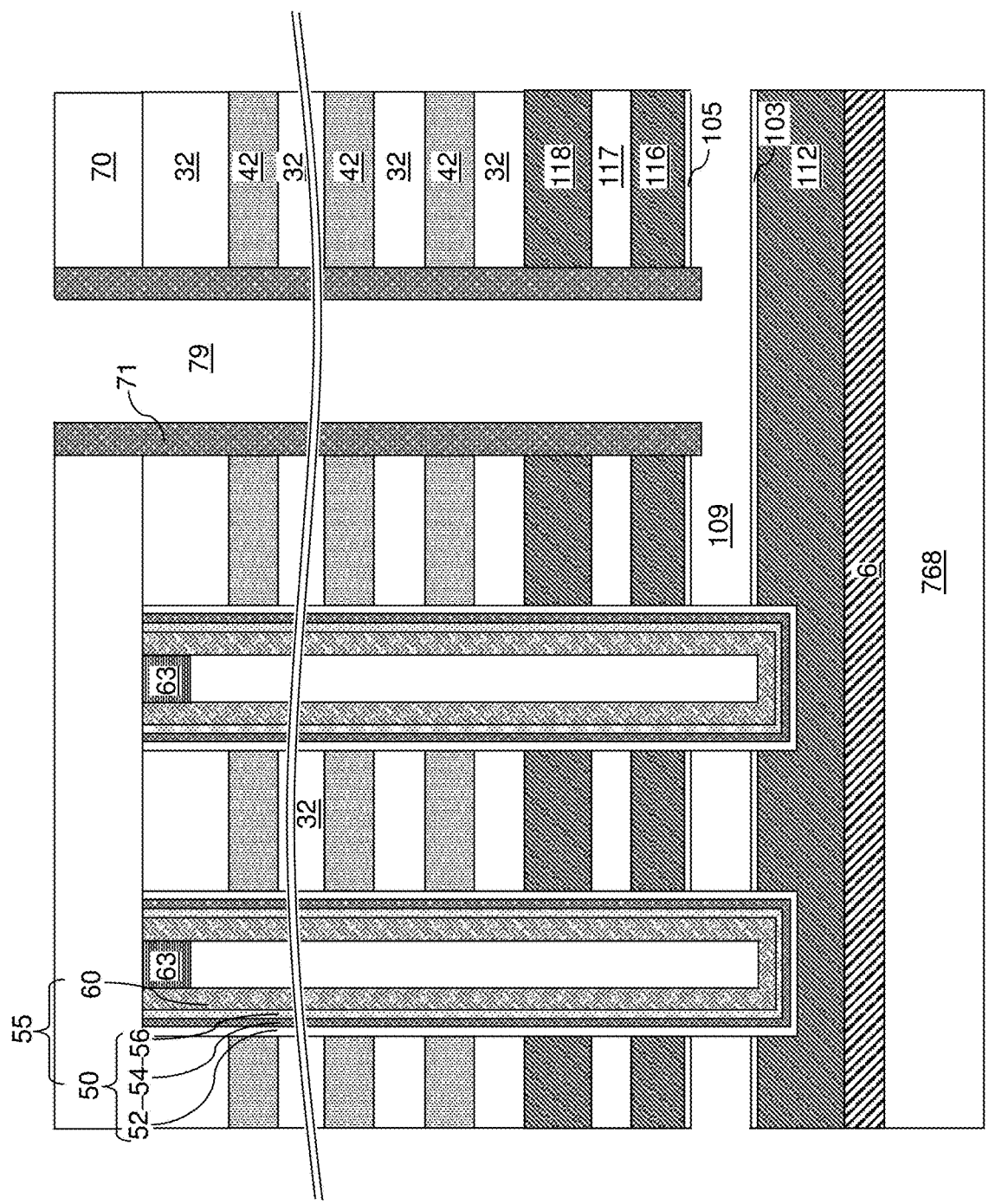

Referring to FIG. 9B, an etchant that etches the material of the source-level sacrificial layer 104 selective to the materials of the alternating stack (32, 42), the insulating cap layer 70, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 71 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 71 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 71, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 9C:
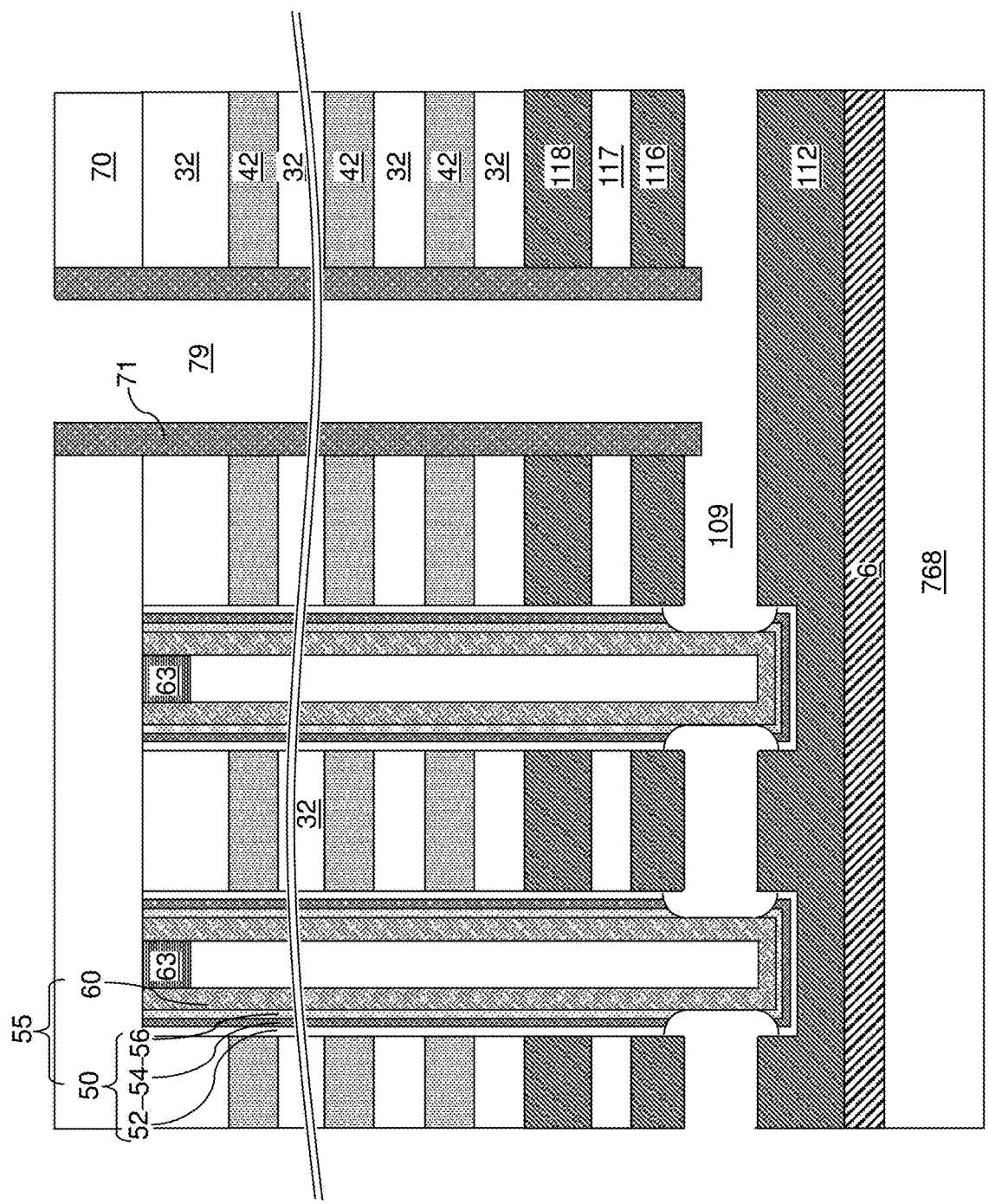

Referring to FIG. 9C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 9D:
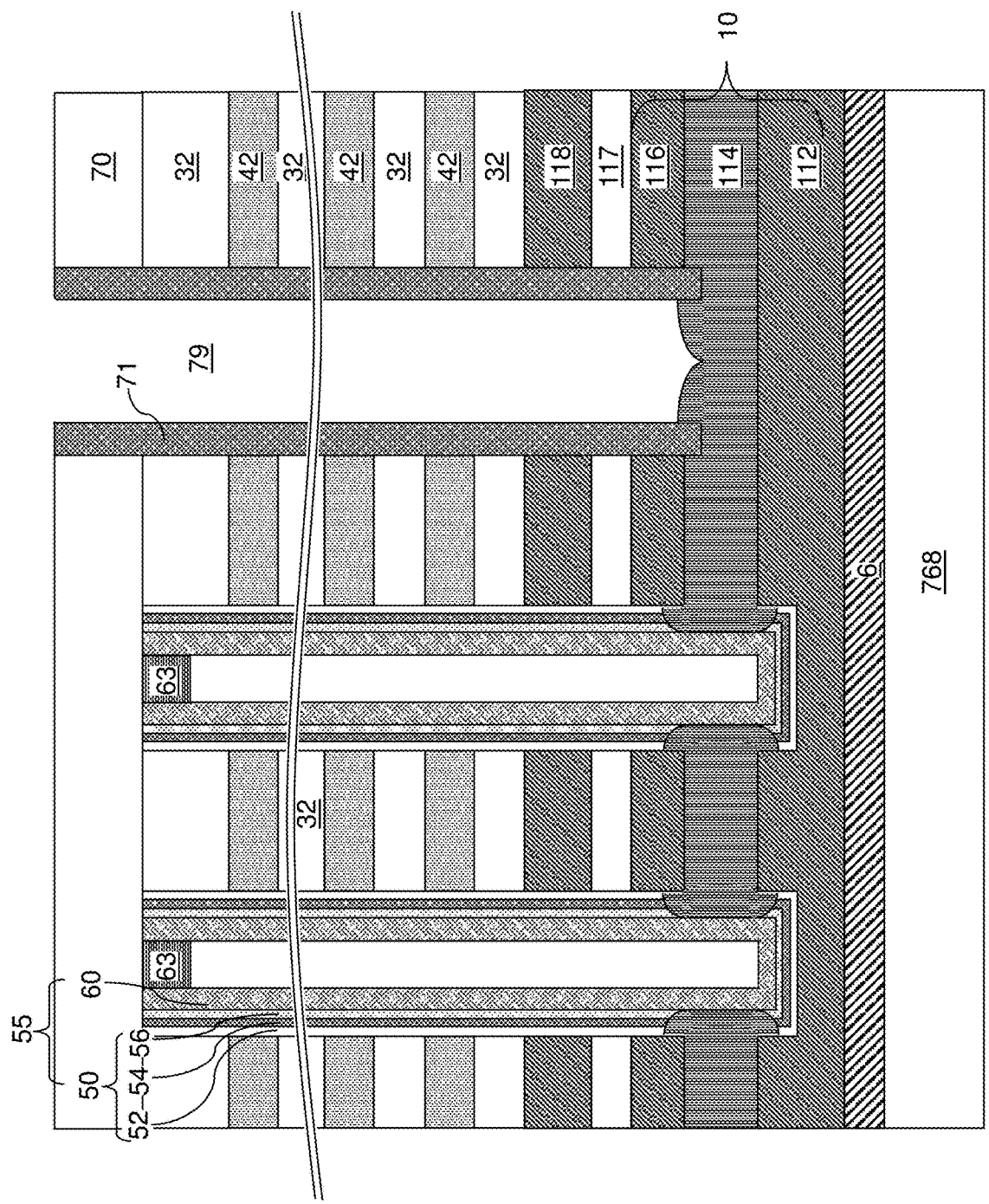

Referring to FIG. 9D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 71. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114. The layer stack including the lower source-level semiconductor layer 112, the source contact layer 114, and the upper source-level semiconductor layer 116 constitutes a buried source layer (112, 114, 116).

Figure 9E:
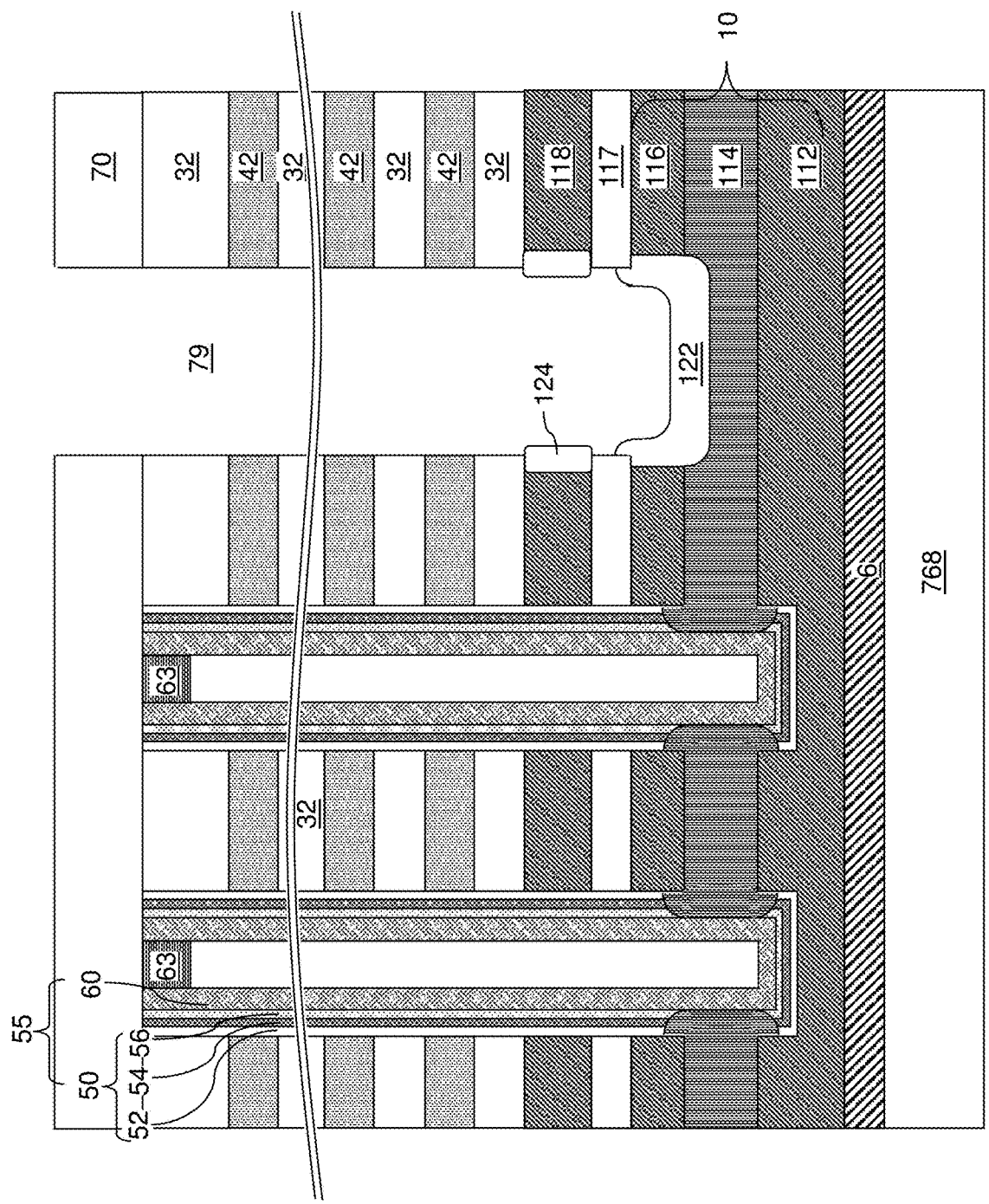

Referring to FIG. 9E, the backside trench spacers 71 may be removed selective to the insulating layers 32, the insulating cap layer 70, and the source contact layer 114 using an isotropic etch process. For example, if the backside trench spacers 71 include silicon nitride, a wet etch process using hot phosphoric acid may be performed to remove the backside trench spacers 71. In one embodiment, the isotropic etch process that removes the backside trench spacers 71 may be combined with a subsequent isotropic etch process that etches the sacrificial material layers 42 selective to the insulating layers 32, the insulating cap layer 70, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124. If desired, the exposed edges of the silicon nitride sacrificial material layers 42 exposed in the backside trench 79 may be oxidized to convert them to silicon oxide.

Figure 10A:
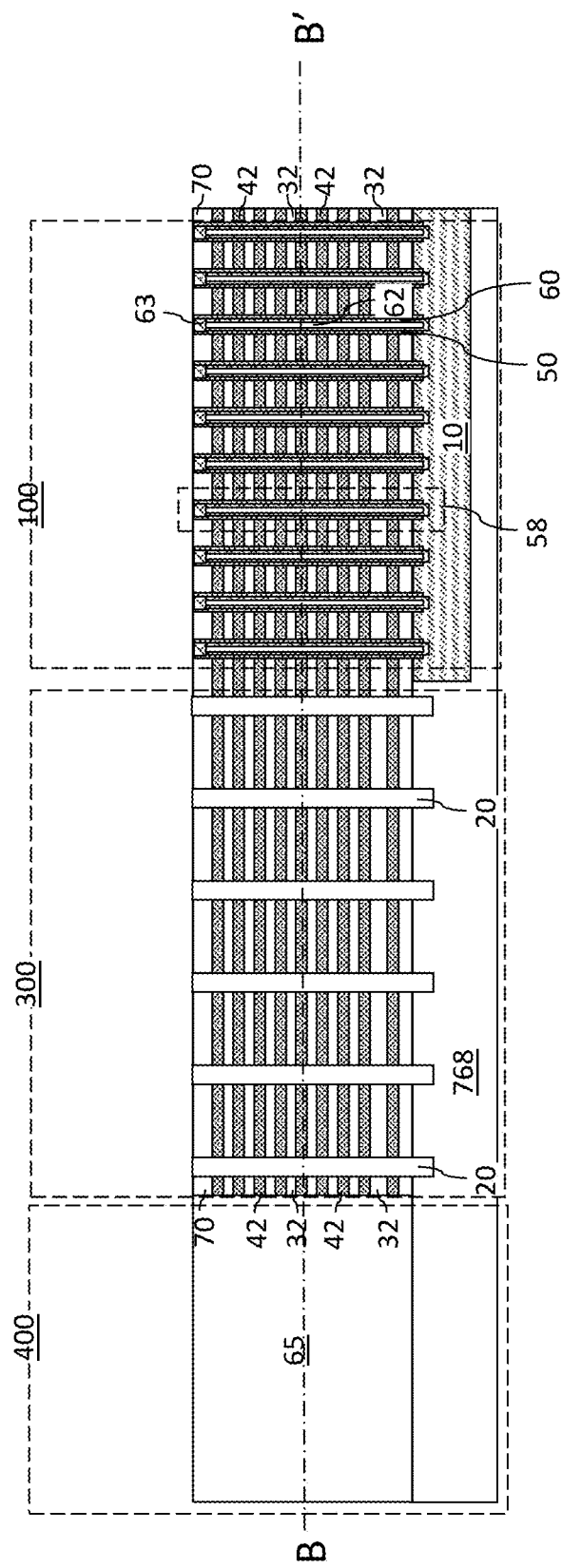
FIG. 10A is a vertical cross-sectional view of the exemplary structure after formation of masking material according to an embodiment of the present disclosure.
Figure 10B:
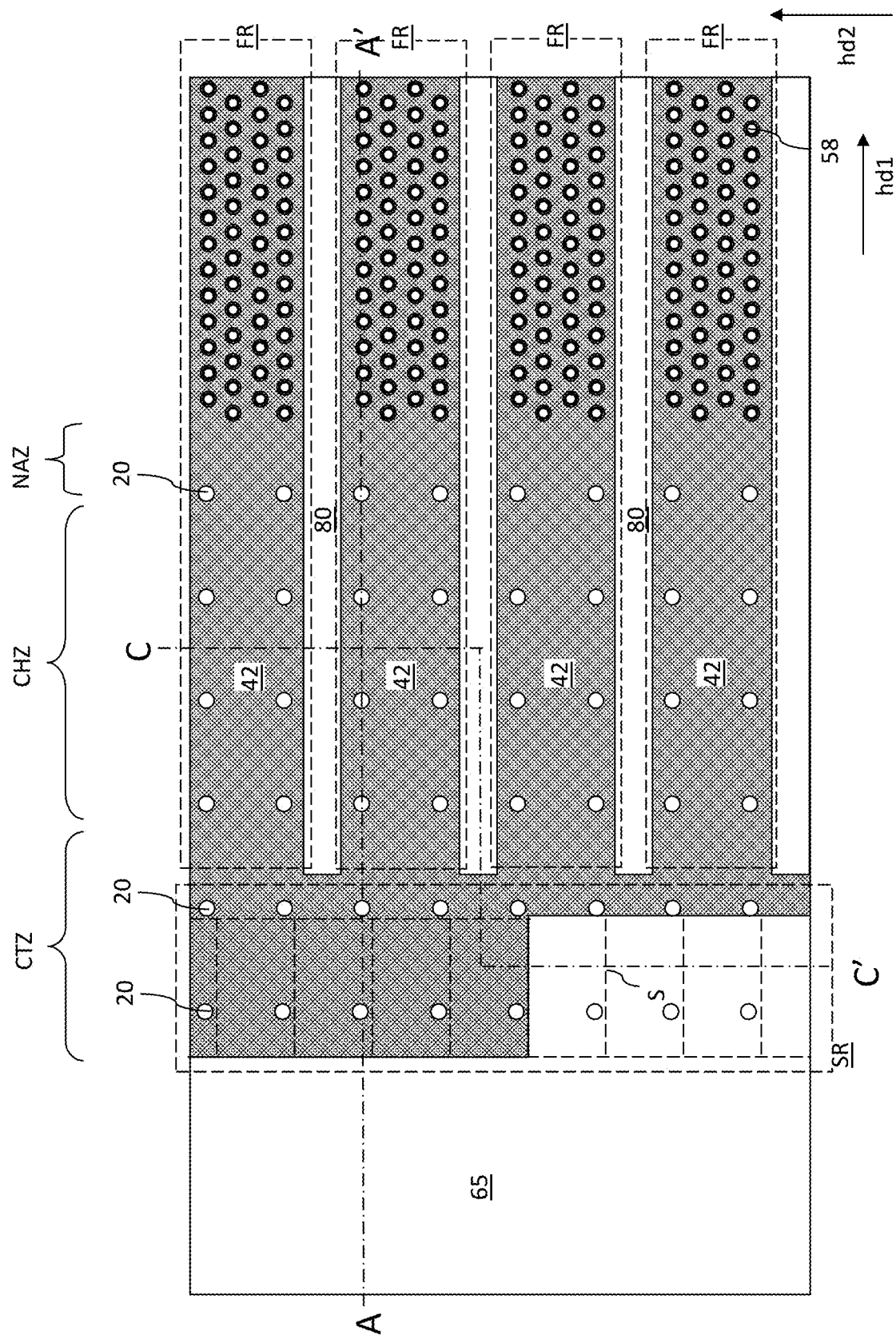
FIG. 10B is a horizontal cross-sectional view of the exemplary structure along the horizontal plane B-B' of FIG. 10A.
Figure 10C:
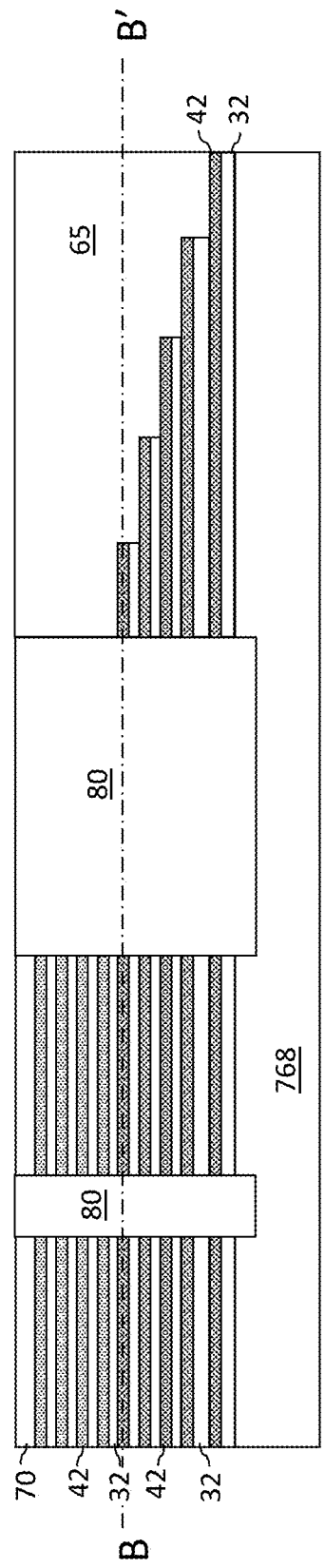
FIG. 10C is a vertical cross-sectional plane of an upper region of the exemplary structure along a zig-zag vertical cross-sectional plane C-C' of FIG. 10B.

Referring to FIGS. 10A-10C, a first masking material 80 can be deposited in the backside trenches 79 and then planarized with the top surface of the exemplary structure. The first masking material 80 may comprise any sacrificial material which may be selectively removed relative to the insulating layers 32 and the sacrificial material layers 42. For example, the first masking material may include a semiconductor material, such as amorphous silicon. Optionally the top surface of the masking material 80 may be oxidized to form a silicon oxide cap on the masking material 80.

Figure 11A:
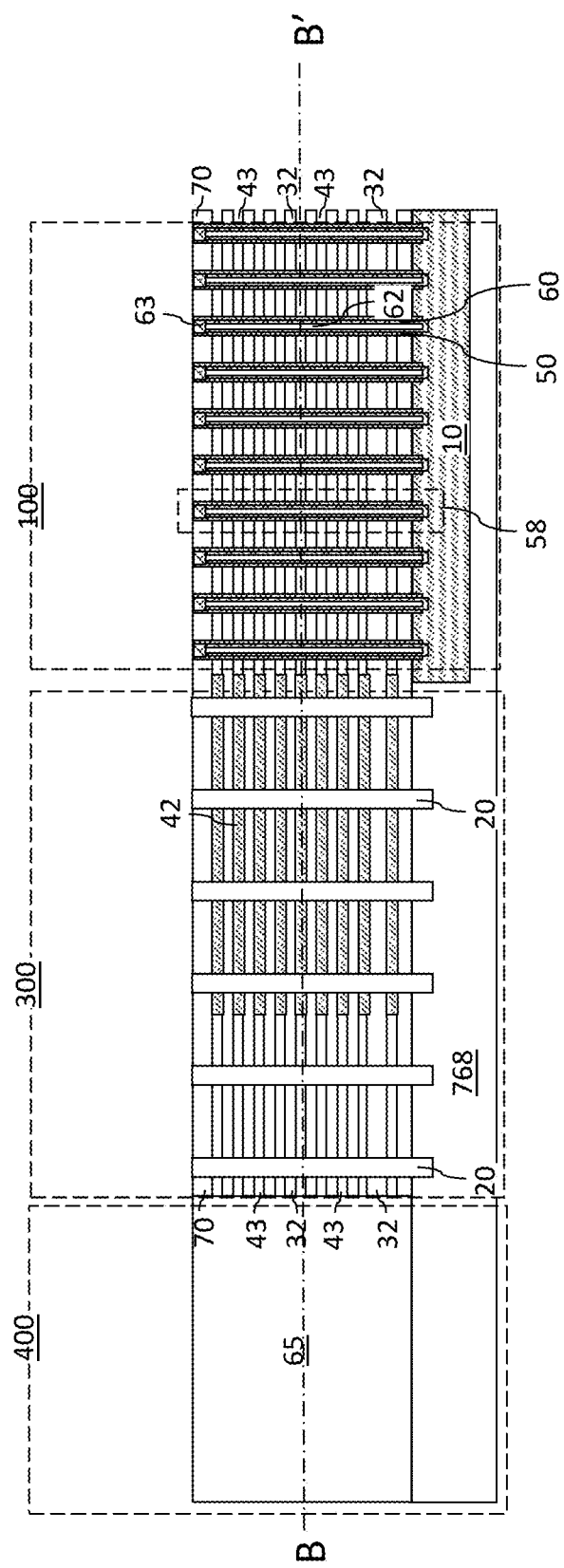
FIG. 11A is a vertical cross-sectional view of the exemplary structure after formation of backside recesses according to an embodiment of the present disclosure.
Figure 11B:
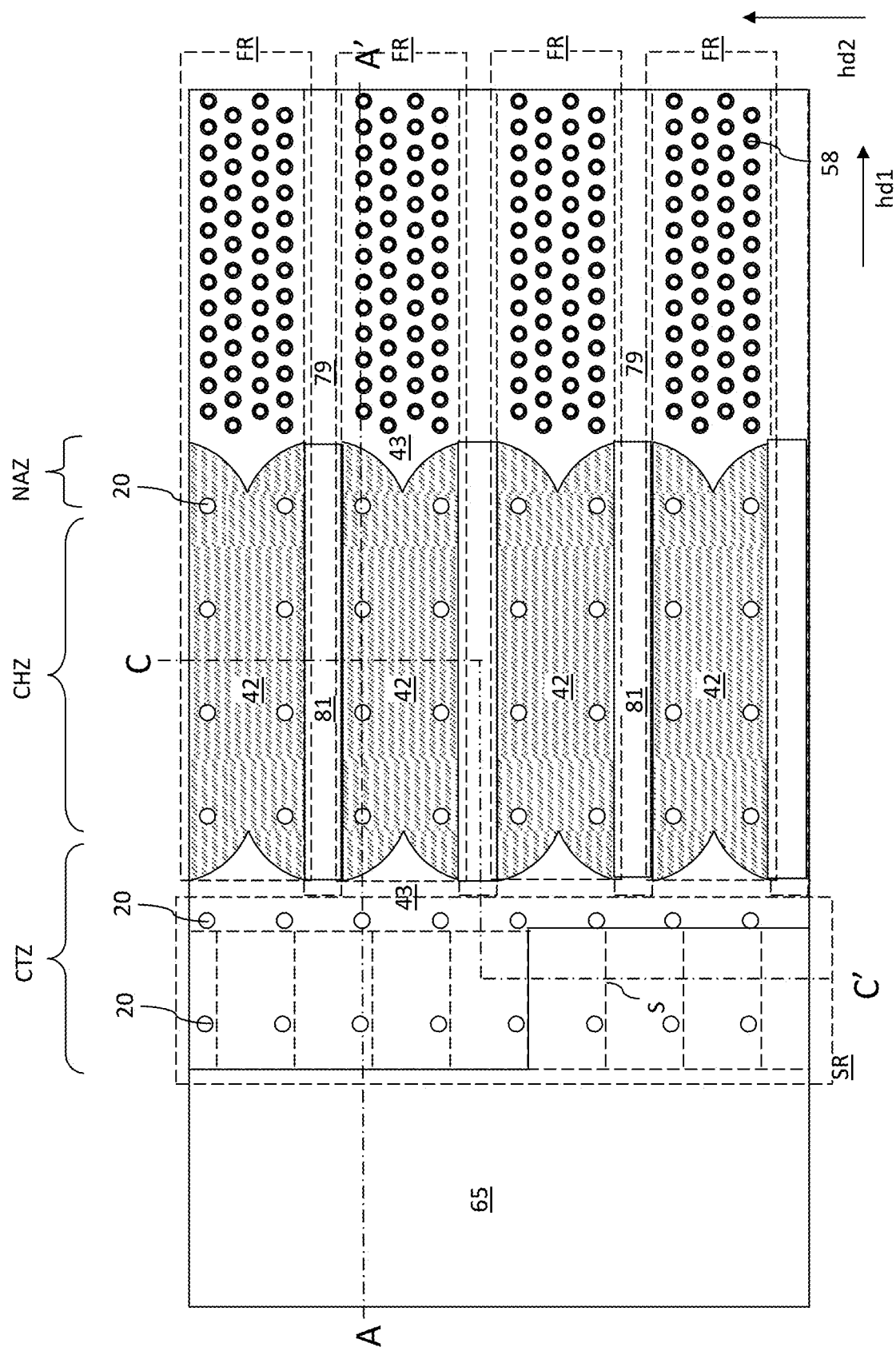
FIG. 11B is a horizontal cross-sectional view of the exemplary structure along the horizontal plane B-B' of FIG. 11A.
Figure 11C:
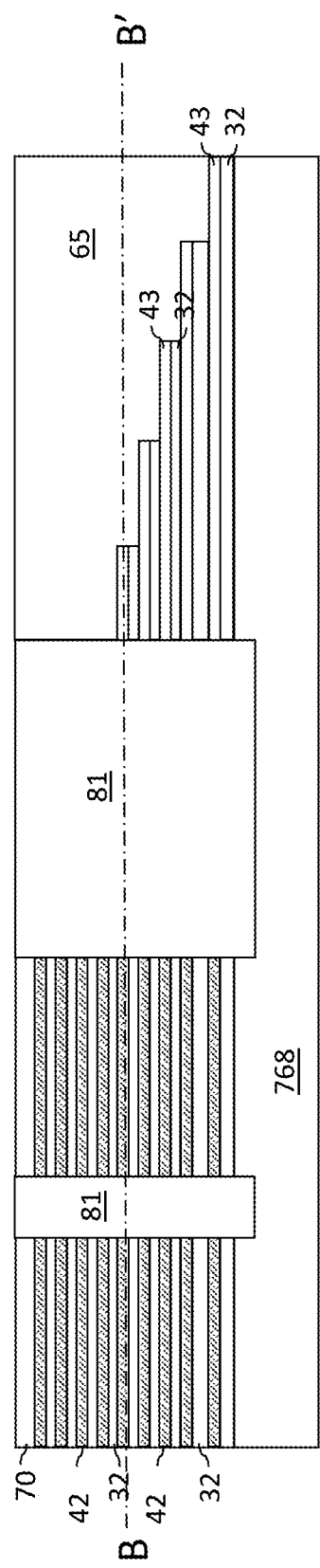
FIG. 11C is a vertical cross-sectional plane of an upper region of the exemplary structure along a zig-zag vertical cross-sectional plane C-C' of FIG. 11B.

Referring to FIGS. 11A-11C, a first photoresist layer (not shown) can be applied over the first masking material 80, the insulating cap layer 70, and the retro-stepped dielectric material portion 65, and can be lithographically patterned to form openings over central segments of portions of the backside trenches 79 located in the channel zone CHZ of the access transistor region 300.

An anisotropic etch process can be performed to transfer the pattern of the openings in the photoresist layer through the first masking material 80 in the backside trenches 79. Unmasked portions of the first masking material 80 can be removed underneath openings in the first photoresist layer. The backside trench 79 is exposed within volumes from which the first masking material 80 is removed within the memory array region 100 and within the near-array zone NAZ and the contact zone CTZ of the access transistor region 300. Remaining portions of the first masking material 80 comprise first masking pillar structures 81. The first masking pillar structures 81 can cover lengthwise sidewalls of the backside trenches 79 (which extend along the first horizontal direction hd1) in the channel zone CHZ within the access transistor region 300. Optionally, the exposed surfaces of the first masking pillar structures 81 may be oxidized to form an oxide (e.g., silicon oxide) cap and sidewalls of the first masking pillar structures. If the sidewalls of the sacrificial material layers 42 exposed in the backside trenches 79 were previously oxidized, then the resulting exposed silicon oxide may be removed (i.e., recessed) from the backside trenches 79 by selective etching.

An etchant that selectively etches the second material of the sacrificial material layers 42 with respect to the first material of the insulating layers 32 can be introduced into the backside trenches 79 within the memory array region 100 and within the near-array zone NAZ and the contact zone CTZ of the access transistor region 300. Backside recesses 43 are formed within the memory array region 100 and within the near-array zone NAZ and the contact zone CTZ of the access transistor region 300 by selective isotropic etching in volumes from which the sacrificial material layers 42 are removed. The removal of the second material of the sacrificial material layers 42 can be selective to the first material of the insulating layers 32, the material of the retro-stepped dielectric material portion 65, and the outermost layer of the memory opening fill structures 58 (such as the blocking dielectric layer 52).

The etch process that removes the sacrificial material layers 42 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The memory opening fill structures 58, the support pillar structures 20, and the retro-stepped dielectric material portion 65 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. In one embodiment, each backside recess 43 can define a space for receiving a respective word line of the array of monolithic three-dimensional NAND strings. The backside recesses 43 include first backside recesses that are formed within a respective one of the finger regions FR, and second backside recesses that are formed in the staircase region SR of the contact zone CTZ and extend into a peripheral segment of the finger regions FR.

Each of the plurality of backside recesses 43 can extend substantially parallel to the top surface of the semiconductor material layer 10. A backside recess 43 can be vertically bounded by a top surface of an underlying insulating layer 32 and a bottom surface of an overlying insulating layer 32. In one embodiment, each backside recess 43 can have a uniform height throughout.

Figure 12A:
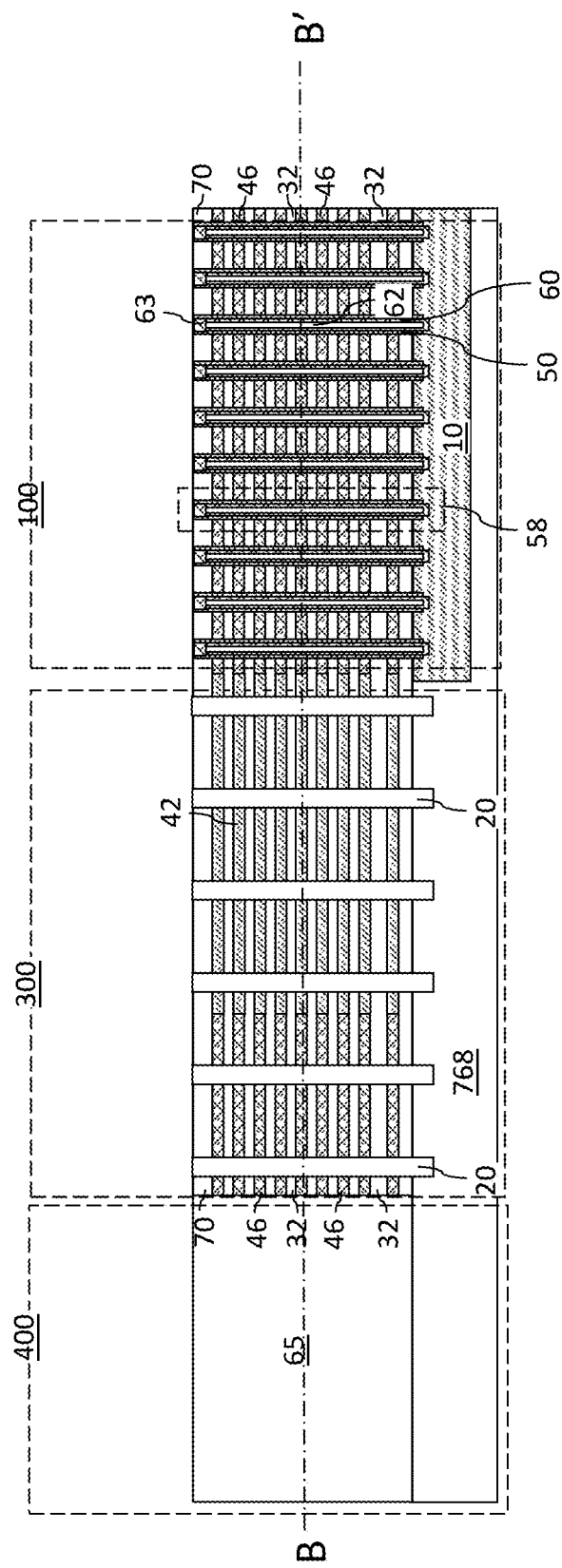
FIG. 12A is a vertical cross-sectional view of the exemplary structure after formation of electrically conductive layers according to an embodiment of the present disclosure.
Figure 12B:
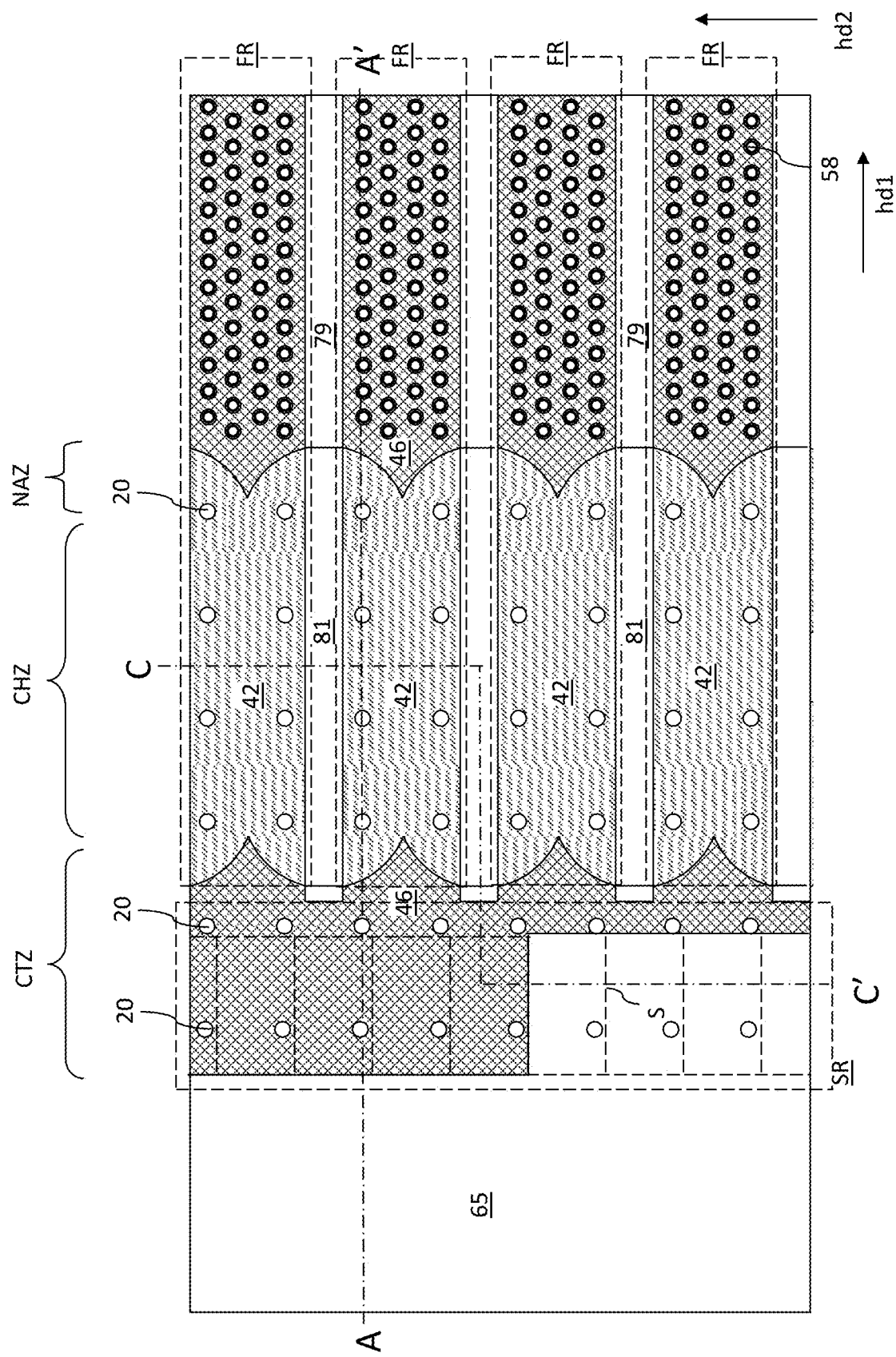
FIG. 12B is a horizontal cross-sectional view of the exemplary structure along the horizontal plane B-B' of FIG. 12A.
Figure 12C:
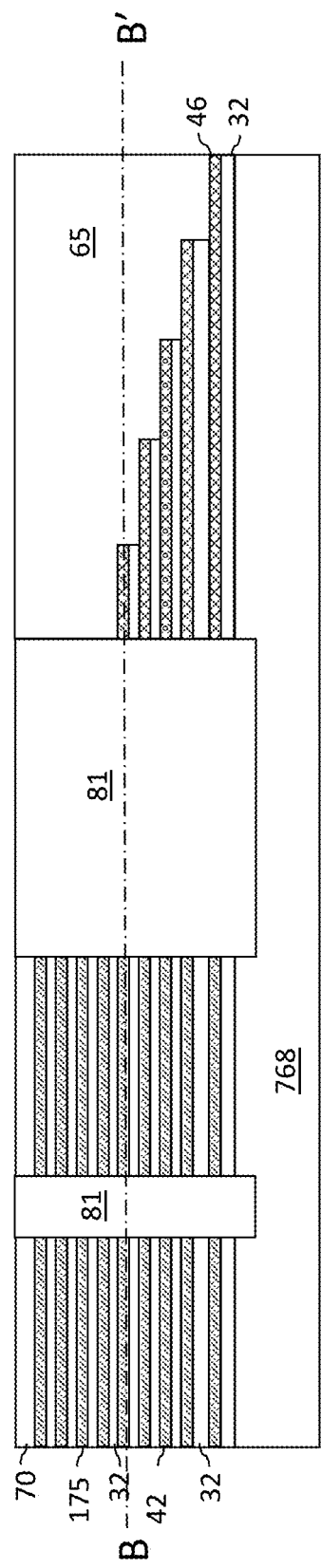
FIG. 12C is a vertical cross-sectional plane of an upper region of the exemplary structure along a zig-zag vertical cross-sectional plane C-C' of FIG. 12B.

Referring to FIGS. 12A-12C, a backside blocking dielectric layer (not shown) can be optionally formed. The backside blocking dielectric layer, if present, comprises a dielectric material that functions as a control gate dielectric for the control gates to be subsequently formed in the backside recesses 43. The blocking dielectric layer may include a dielectric metal oxide, such as aluminum oxide.

A metallic barrier layer can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of backside recesses 43, over the sidewalls of the remaining portions of the sacrificial material layers 42 and over the physically exposed surfaces of the insulating layers 32, and over the top surface of the insulating cap layer 70 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory opening fill structures 58 by the metallic barrier layer, which is a diffusion barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the insulating cap layer 70. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the insulating cap layer 70.

The deposited metallic material of the continuous electrically conductive material layer is etched back from the sidewalls of each backside trench 79 and from above the insulating cap layer 70, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, portions of the sacrificial material layers 42 outside the channel zone CHZ are replaced with the electrically conductive layers 46.

The electrically conductive layers 46 comprise first electrically conductive layers 46 that are formed in a respective one of the finger regions FR, and second electrically conductive layers 46 that are formed in the staircase region SR and adjoining peripheral segments of the contact zone CTZ in the finger regions FR. Portions of the sacrificial material layers 42 that are located within portions of the finger regions FR located within the memory array region 100 are replaced with the first electrically conductive layers 46. Portions of the sacrificial material layers 42 that are located within the staircase region SR are replaced with the second electrically conductive layers 46.

Each first electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. One or more topmost and bottommost first electrically conductive layers 46 may function as select gate electrodes of memory strings instead of as control gate electrodes.

Figure 13C:
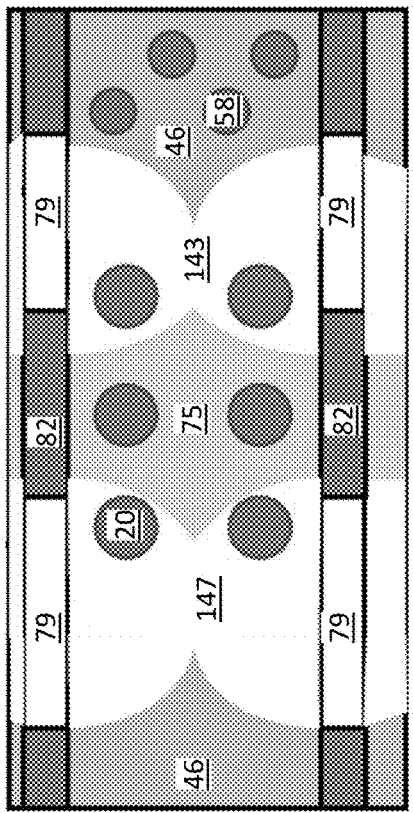

FIGS. 13A-13E illustrate steps in forming a semiconductor active region (e.g., source, drain and channel regions) of an access transistor located in the access transistor region 300. Referring to FIG. 13A, a second masking material can be deposited in the backside trenches 79. For example, the second masking material may a semiconductor material, such as amorphous silicon. A second photoresist layer (not shown) can be applied over the second masking material, the insulating cap layer 70, and the retro-stepped dielectric material portion 65, and can be lithographically patterned to form openings over segments of portions of the backside trenches 79 that include at least a portion of the near-array zone NAZ and the contact zone CTZ of the access transistor region 300.

An anisotropic etch process can be performed to transfer the pattern of the openings in the photoresist layer through the second masking material in the backside trenches 79. Unmasked portions of the second masking material can be removed underneath openings in the second photoresist layer. Cavities in the backside trenches 79 can be formed within volumes from which the second masking material is removed. Remaining portions of the second masking material comprise second masking pillar structures 82. A first subset of the second masking pillar structures 82 can cover lengthwise sidewalls of the backside trenches 79 (which extend along the second horizontal direction hd1) within the memory array region 100. An optional second subset of the second masking pillar structures 82 may cover portions of sidewalls of the sacrificial material layers 42 within the channel zone CHZ in the access transistor region 300. Portions of the sacrificial material layers 42 located at least in the near-array zone NAZ and the contact zone CTZ are exposed in the cavities in the backside trenches 79.

Referring to FIG. 13B, a selective isotropic etch process can be performed to isotropically etch the material of the sacrificial material layers 42 selective to the material of the insulating layers 32 and the electrically conductive layers 46. The second masking pillar structures 82 can be employed as an etch mask for the selective isotropic etch process. An isotropic etchant is introduced into volumes of the backside trenches that are not filled with the second masking pillar structures 82. In an illustrative example, if the insulating layers 32 include silicon oxide and if the electrically conductive layers include a metallic material, a wet etch process employing hot phosphoric acid can be performed to isotropically etch the silicon nitride material of the sacrificial material layers 42.

The duration of the isotropic etch process can be selected such that the lateral etch distance of the isotropic etch process is greater than the dimensions of the remaining sacrificial material layers 42 along the first and the second horizontal directions. Thus, the entire remaining portions of the sacrificial material layers 42 are removed in FIG. 13B, despite the presence of the optional second subset of the second masking pillar structures 82. Alternatively, the optional second subset of the second masking pillar structures 82 may be omitted at the step of FIG. 13A to simplify the etching step. Transistor region cavities 171 are formed in the channel zone CHZ in spaces previously occupied by the sacrificial material layers 42. The patterned photoresist layer can be removed, for example, by ashing.

Referring to FIG. 13C, a semiconductor material (also referred to as a semiconductor channel material) having a doping of a first conductivity type can be conformally deposited in the volumes of the transistor region cavities 171. The semiconductor channel material may include amorphous silicon, polysilicon, a silicon-germanium alloy, or any other semiconducting material. In one embodiment, the atomic concentration of dopants (e.g., boron) of the first conductivity type (e.g., p-type) in the semiconductor channel material may be in a range from $1.0 \times 10^{14}/cm^3$ to $1.0 \times 10^{18}/cm^3$, although lesser and greater atomic concentrations may also be employed.

An anisotropic etch process can be performed to remove portions of the semiconductor material from outside the transistor region cavities 171, i.e., from inside the backside trenches 79 and from above the top surface of the insulating cap layer 70. Each remaining portion of the semiconductor material that fills a respective one of the transistor region cavities 171 constitutes a planar semiconductor material portion 175. Thus, portions of the sacrificial material layers 42 in the channel zone CHZ and adjacent volumes are replaced with planar semiconductor material portions having a doping of the first conductivity type. Each planar semiconductor material portion 175 can have the same thickness as a respective sacrificial material layer 42 that was previously located at a same level.

Figure 13D:
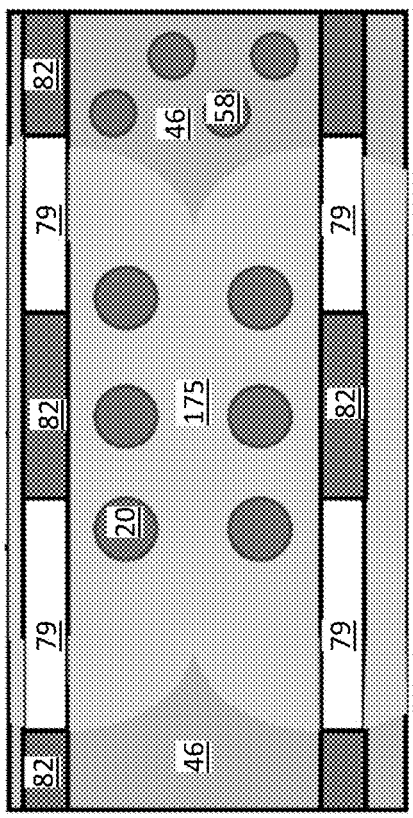

Referring to FIG. 13D, a selective isotropic etch process can be performed to isotropically etch the material of the planar semiconductor material portions 175 selective to the material of the insulating layers 32 and the electrically conductive layers 46. The second masking pillar structures 82 can be employed as an etch mask for the selective isotropic etch process. An isotropic etchant is introduced into volumes of the backside trenches that are not filled with the second masking pillar structures 82.

In an illustrative example, if the insulating layers 32 include silicon oxide and if the electrically conductive layers include a metallic material, a wet etch process employing hot trimethyl-2 hydroxyethyl ammonium hydroxide ("hot TMY") or tetramethyl ammonium hydroxide (TMAH) can be performed to isotropically etch the material of the planar semiconductor material portions 175. Proximal segments of the planar semiconductor material portions 175 can be laterally etched within the near-array zone NAZ and the contact zone CTZ of the access transistor region 300, without etching distal segments of the planar semiconductor material portions 175 located in the channel zone CHZ because they are masked by the second subset of the second masking pillar structures 82. If the second subset of the second masking pillar structures 82 is omitted at the step of FIG. 13A, then they can be formed between the steps of FIGS. 13C and 13D.

The duration of the isotropic etch process can be selected such that the lateral etch distance of the isotropic etch process is greater than one half of the width of each planar semiconductor material portion 175 along the second horizontal direction hd2. Source cavities 143 and drain cavities 147 are formed within volumes form which the material of the planar semiconductor material portions 175 is removed. Each source cavity 143 and each drain cavity 147 may have a same thickness as remaining portions of a respective planar semiconductor material portion 175 that is located at a same level.

Generally, the semiconductor material of the planar semiconductor material portions 175 can be isotropically etched employing the second masking pillar structures 82 as an etch mask. Source cavities 143 and drain cavities 147 can be formed by laterally recessing end regions of each of the planar semiconductor material portions 175. Volumes from which portions of the semiconductor material of the planar semiconductor material portions 175 are removed comprise the source cavities 143 and the drain cavities 147. The source cavities 143 may be formed around a boundary between the channel zone CHZ and the near-array zone NAZ. The drain cavities 147 may be formed around a boundary between the channel zone CHZ and the contact zone CTZ. Remaining regions of the planar semiconductor material portions 175 comprise channel regions 75. Each of the source cavities 143 and the drain cavities 147 may be laterally bounded by a respective set of two concave surfaces of electrically conductive layers 46 and two concave surfaces of the channel regions 75.

Figure 13E:
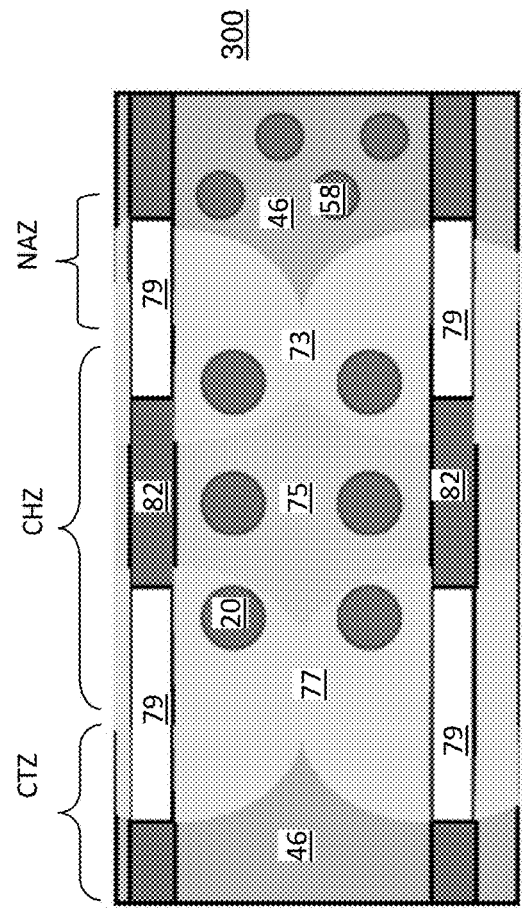

Referring to FIG. 13E, a doped semiconductor material having a doping of a second conductivity type can be deposited in the source cavities 143 and the drain cavities 147. The second conductivity type is the opposite of the first conductivity type. Preferably, the first conductivity type is p-type, and the second conductivity type is n-type. The doped semiconductor material may include amorphous silicon, polysilicon, or any other semiconductor material. The atomic concentration of dopants of the second conductivity type can be in a range from $5.0 \times 10^{18}/cm^3$ to $2.0 \times 10^{21}/cm^3$, although lesser and greater atomic concentrations may also be employed.

The thickness of the deposited semiconductor material (as measured within the backside trenches) can be greater than one half of the height of the source cavities 143 and the drain cavities 147, and can be less than one half of the width of each backside trench 79 along the second horizontal direction hd2. An anisotropic etch process can be performed to remove portions of the semiconductor material from outside the source cavities 143 and the drain cavities 147, i.e., from inside the backside trenches 79 and from above the top surface of the insulating cap layer 70. Each remaining portion of the semiconductor material that fills a source cavity 143 constitutes a source region 73, and each remaining portion of the semiconductor material that fill a drain cavity 147 constitutes a drain region 77.

Each contiguous combination of a channel region 75, a source region, 73 and a drain region 77 comprises a semiconductor active region (73, 75, 77). In other words, a semiconductor active region (73, 75, 77) comprises a contiguous set of a channel region 75, a source region 73, and a drain region 77. Thus, portions of the sacrificial material layers 42 that are located within the access transistor region 300 are replaced with active semiconductor regions (73, 75, 77). Each active semiconductor region (75, 73, 77) comprises a contiguous combination of a respective channel region 75, a respective source region 73, and a respective drain region 77.

In one embodiment, each interface between a source region 73 and a channel region 75 within each active semiconductor region (73, 75, 77) comprises a vertically straight and laterally convex surface of the source region 73 that contacts a first vertically straight and laterally concave surface of the channel region 75. Each interface between a drain region 77 and the channel region 75 within each active semiconductor region (73, 75, 77) comprises a vertically straight and laterally convex surface of the drain region 77 that contacts a second vertically straight and laterally concave surface of the channel region 75. As used herein, a surface is vertically straight if a vertical cross-sectional profile of the surface is straight. A surface is laterally convex if a horizontal cross-sectional profile of the surface is concave. A surface is laterally concave if a horizontal cross-sectional profile of the surface is convex. In one embodiment, each first semiconductor surface (such as a surface of a source region 73) that contacts a respective one of the first electrically conductive layers 46 in a finger region FR comprises a respective vertically straight and laterally convex surface, and each second semiconductor surface (such as a surface of a drain region 77) that contacts a respective one of the second electrically conductive layers 46 in the staircase region SR comprises a respective vertically straight and laterally convex surface.

Figure 14A:
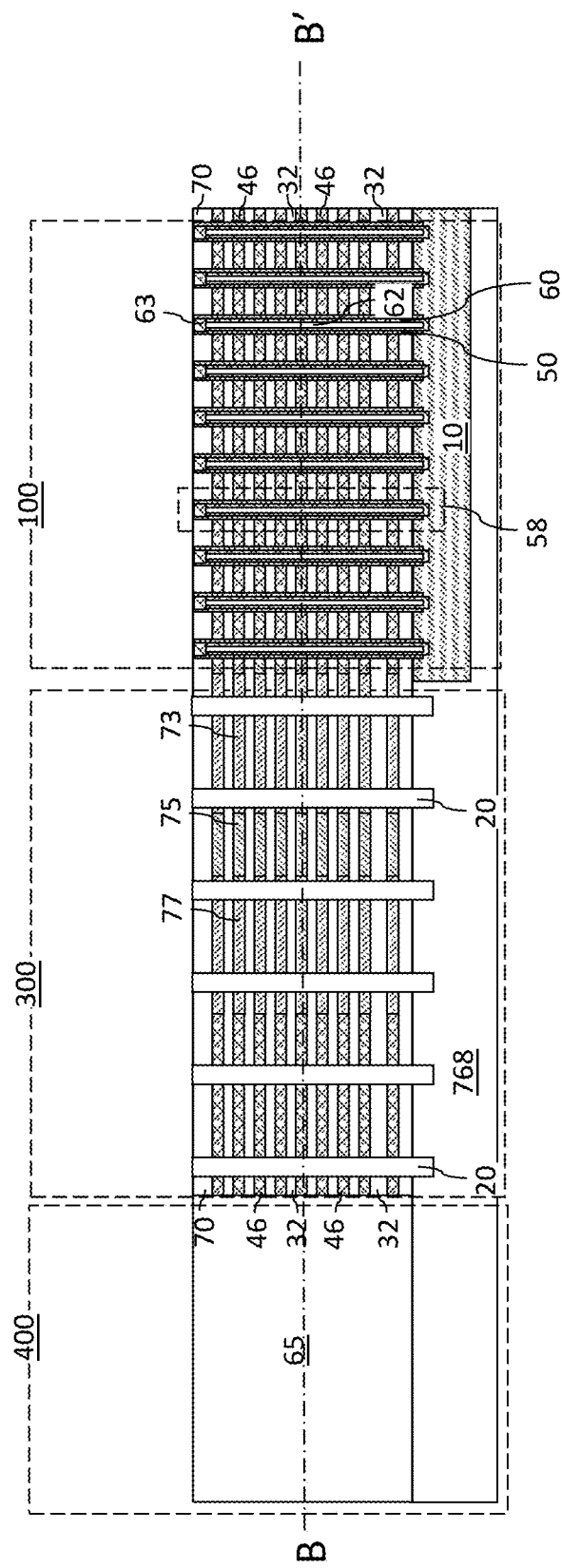
FIG. 14A is a vertical cross-sectional view of the exemplary structure after formation of the active regions according to an embodiment of the present disclosure.
Figure 14B:
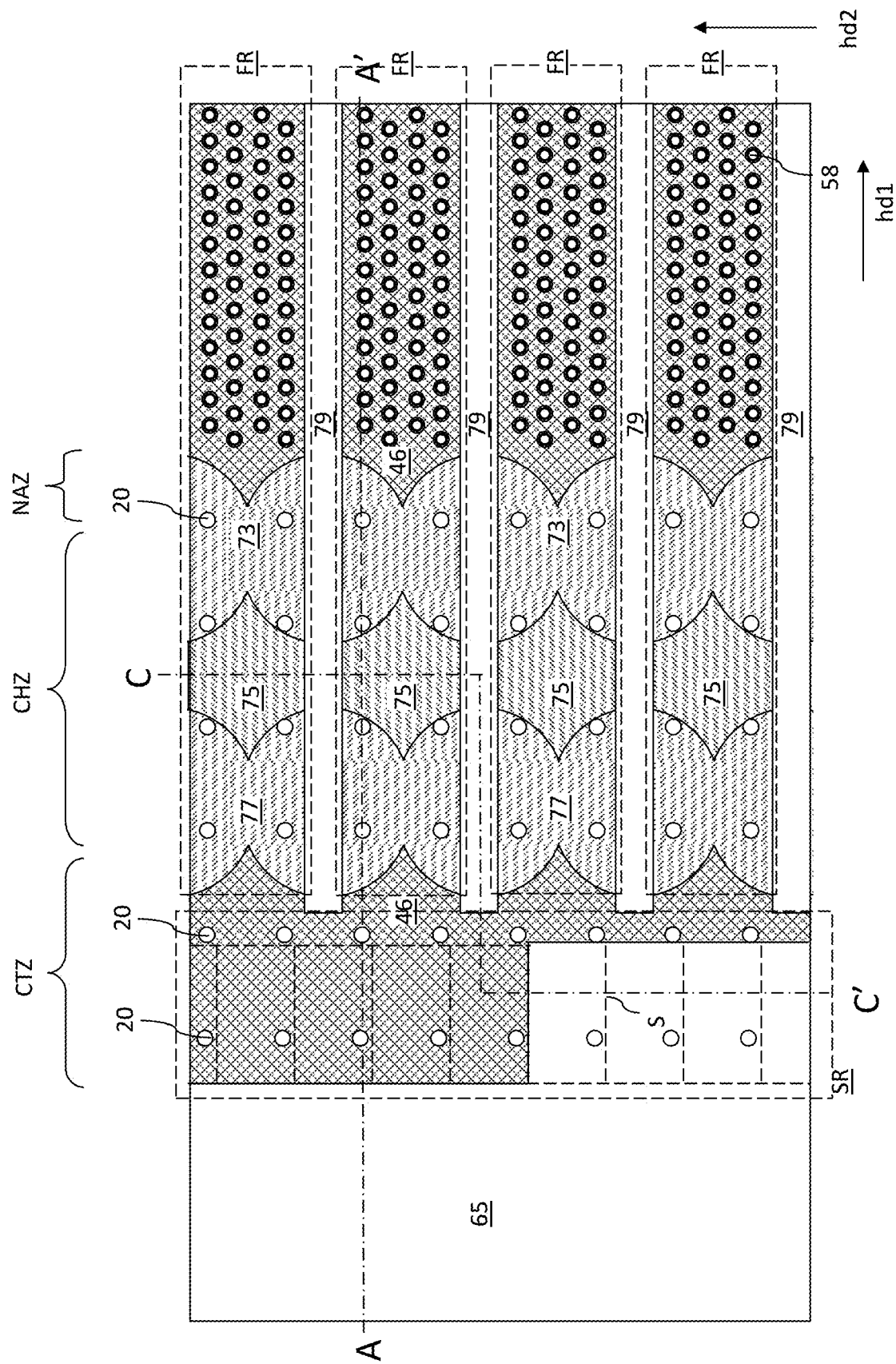
FIG. 14B is a horizontal cross-sectional view of the exemplary structure along the horizontal plane B-B' of FIG. 14A.
Figure 14C:
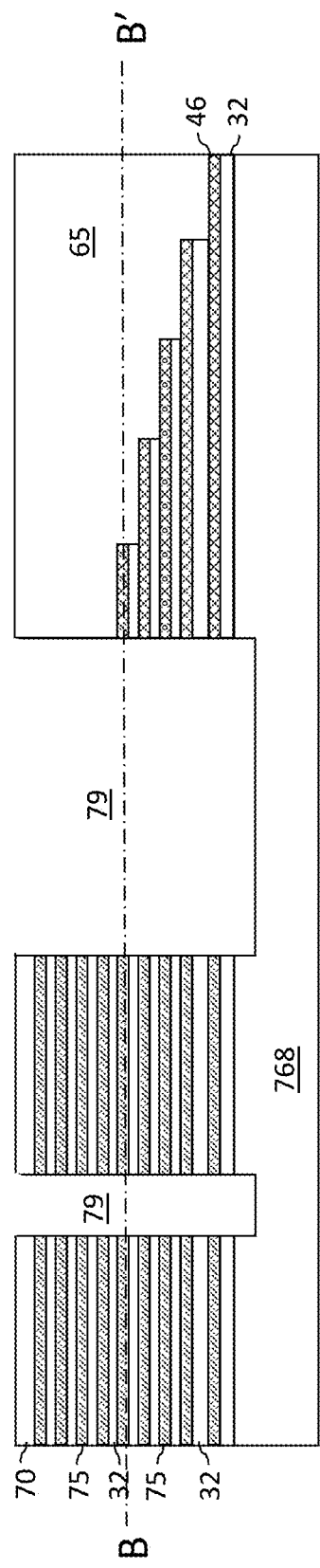
FIG. 14C is a vertical cross-sectional plane of an upper region of the exemplary structure along a zig-zag vertical cross-sectional plane C-C' of FIG. 14B.

Referring to FIGS. 14A-14C, the second masking pillar structures 82 are removed from the backside trenches 79 be selective etching.

Figure 15A:
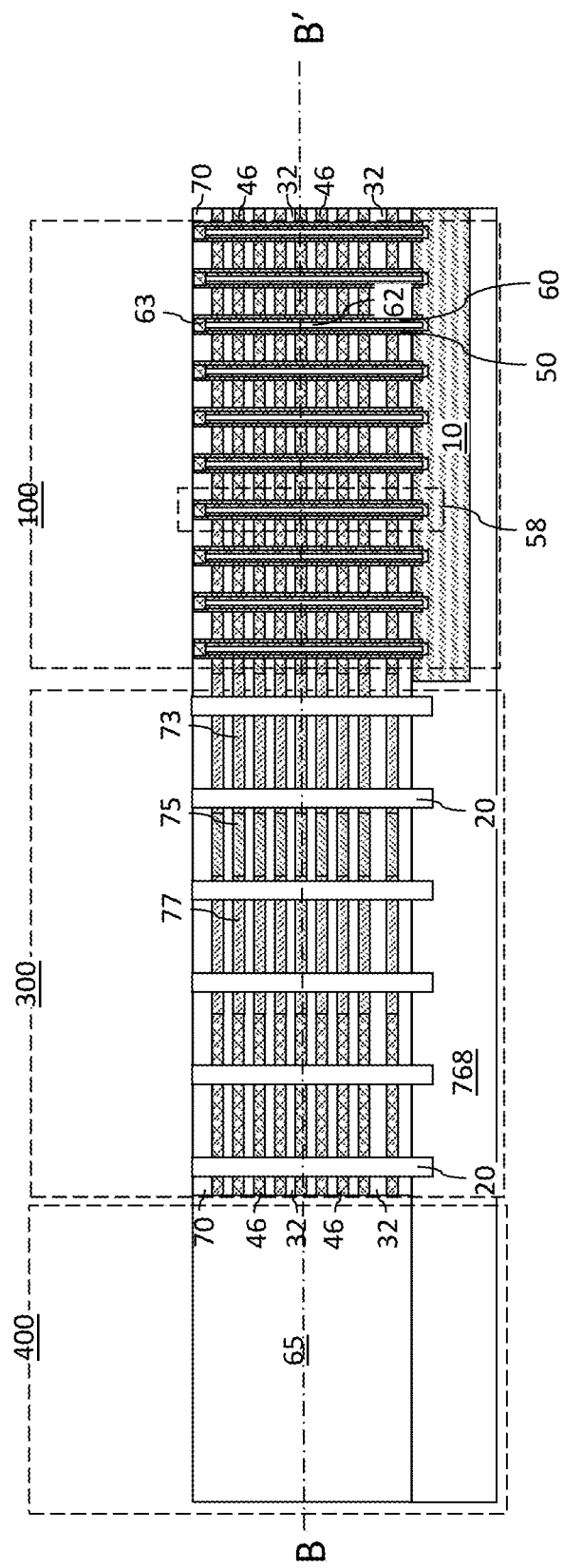
FIG. 15A is a vertical cross-sectional view of the exemplary structure after formation of backside trench fill structures according to an embodiment of the present disclosure.
Figure 15B:
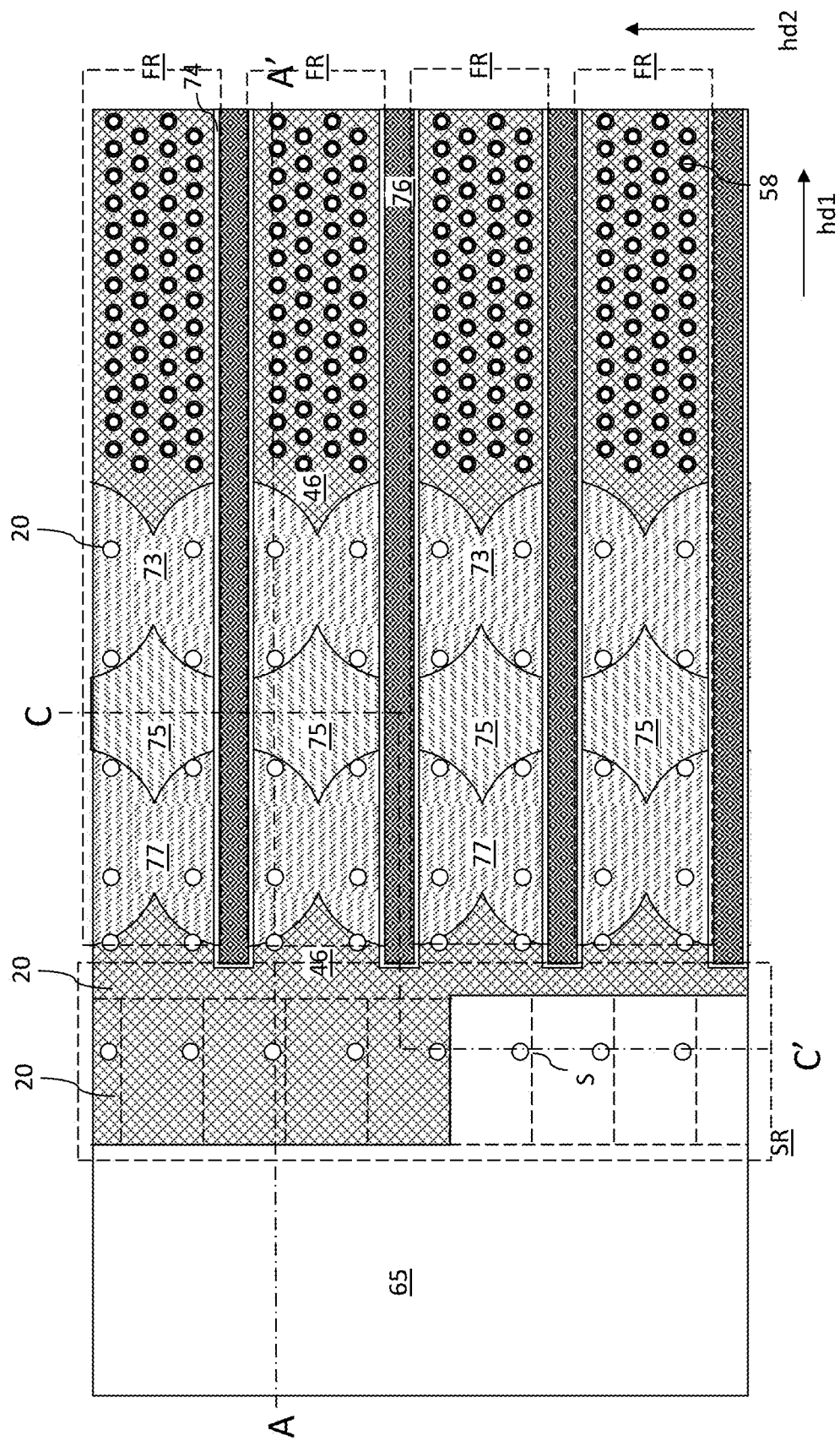
FIG. 15B is a horizontal cross-sectional view of the exemplary structure along the horizontal plane B-B' of FIG. 15A.
Figure 15C:
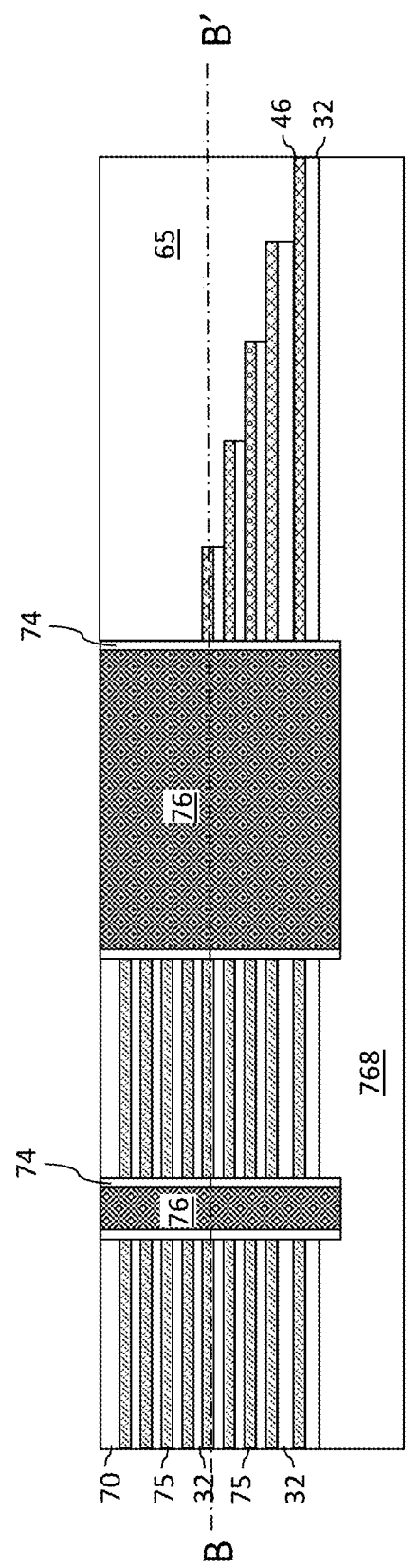
FIG. 15C is a vertical cross-sectional plane of an upper region of the exemplary structure along a zig-zag vertical cross-sectional plane C-C' of FIG. 15B.

Referring to FIGS. 15A-15C, an insulating material layer can be conformally deposited and can be anisotropically etched to form insulating spacers 74 at peripheral regions of the backside trenches 79. At least one conductive material can be deposited in remaining volumes of the backside trenches 79. The at least one conductive material can include a conductive liner and a conductive fill material portion. The conductive liner can include a conductive metallic liner such as TiN, TaN, WN, TiC, TaC, WC, an alloy thereof, or a stack thereof. The conductive fill material portion can include a metal or a metallic alloy. For example, the conductive fill material portion can include W, Cu, Al, Co, Ru, Ni, an alloy thereof, or a stack thereof. Portions of the at least one conductive material overlying the horizontal plane including the top surface of the insulating cap layer 70 can be removed by a planarization process such as a chemical mechanical polishing process. Each remaining portion of the at least one conductive material constitute a backside contact via structure 76. The backside contact via structure 76 may be a source electrode or a source local interconnect which electrically contacts the source contact layer 114.

Figure 16A:
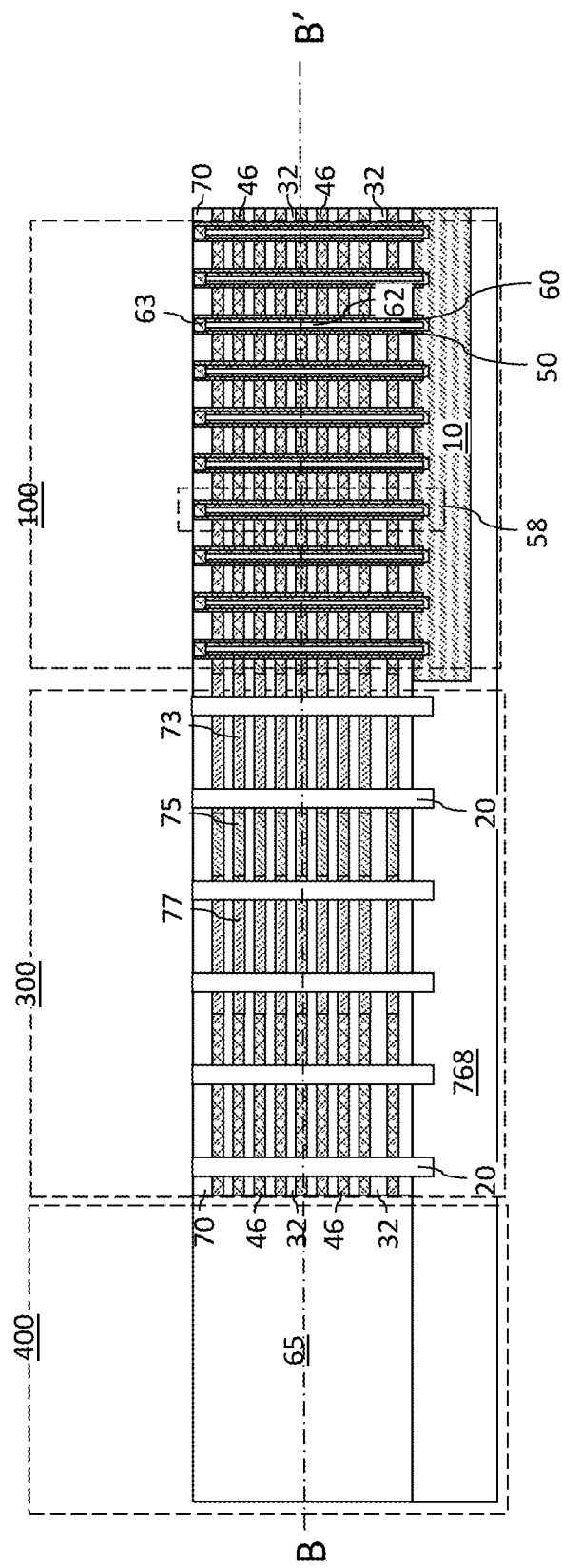
FIG. 16A is a vertical cross-sectional view of the exemplary structure after formation of gate via cavities according to an embodiment of the present disclosure.
Figure 16B:
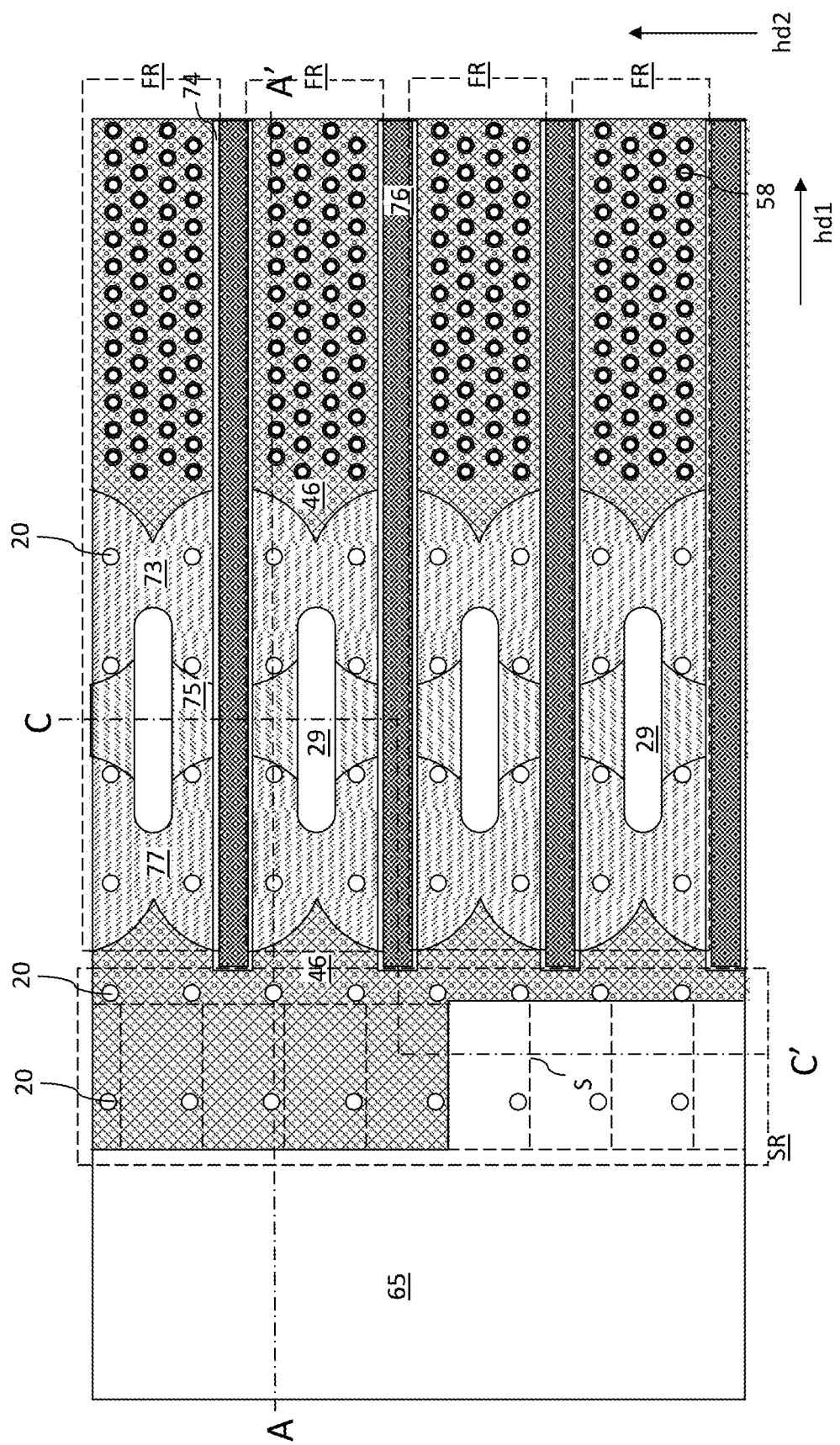
FIG. 16B is a horizontal cross-sectional view of the exemplary structure along the horizontal plane B-B' of FIG. 16A.
Figure 16C:
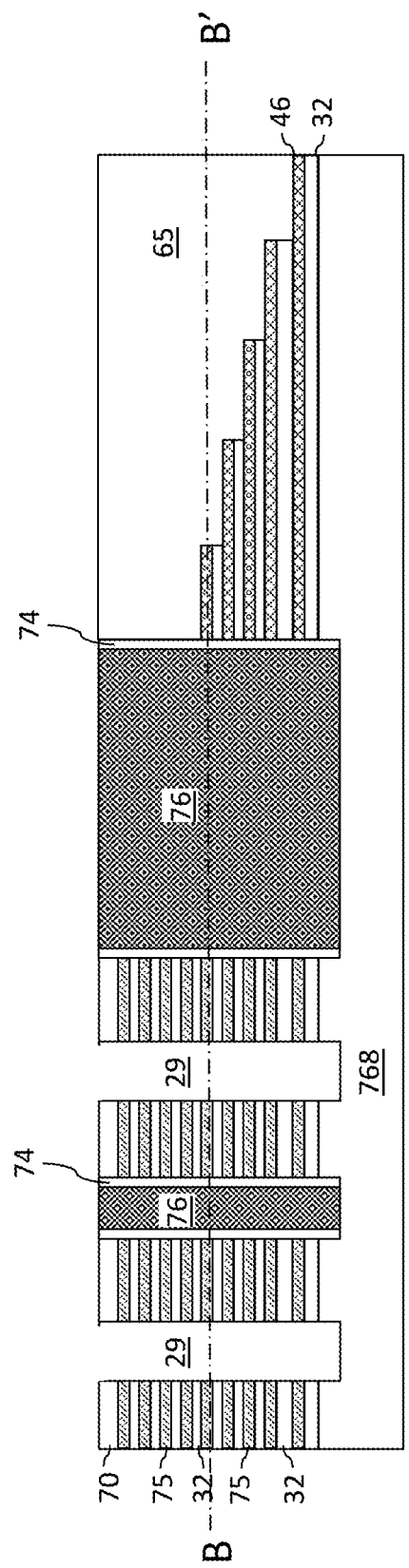
FIG. 16C is a vertical cross-sectional plane of an upper region of the exemplary structure along a zig-zag vertical cross-sectional plane C-C' of FIG. 16B.

Referring to FIGS. 16A-16C, a photoresist layer (not shown) can be applied over the exemplary structure, and can be lithographically patterned to form openings over areas of the channel regions 75. The width of each opening along the second horizontal direction hd2 can be less than the width of a respective underlying channel region 75 such that lengthwise edges of each opening in the photoresist layer is laterally offset from lengthwise edges of the respective underlying channel region 75 that contact the insulating spacers 74. Optionally, the openings may extend in the first horizontal direction hd1 into the source region 73 and the drain region 77. In another optional embodiment, the openings may extend in the first horizontal direction hd1 through the source region 73 and the drain region 77 and into the respective finger region FR and the staircase region SR.

An anisotropic etch process can be performed to transfer the pattern of the openings in the photoresist layer through the insulating cap layer 70, the insulating layers 32, and the active semiconductor regions (73, 75, 77). Gate via cavities 29 vertically extending from a top surface of the insulating cap layer 70 to an upper portion of an underlying material layer (such as the at least one second dielectric material layer 768) can be formed in volumes from which the materials of the insulating cap layer 70, the insulating layers 32, and the active semiconductor regions (73, 75, 77) are removed by the anisotropic etch process. Each gate via cavity 29 can be elongated along the first horizontal direction hd1, and can have a pair of lengthwise sidewalls that are parallel to the first horizontal direction hd1. Each channel region 75 is divided into a plurality of channel regions 75 between adjacent backside trenches 79.

While the present disclosure is described employing an embodiment in which a single gate via cavity 29 vertically extends through each active semiconductor region (73, 75, 77), embodiments are expressly contemplated herein in which a plurality of gate via cavities 29 that are laterally spaced apart along the second horizontal direction hd2 vertically extends through each active semiconductor region (73, 75, 77) between the adjacent backside trenches 79.

Each gate via cavity 29 can cut into a peripheral portion of each source region 73 within a vertical stack of source regions 73 located within a respective finger region FR. Each gate via cavity 29 can cut into a peripheral portion of each drain region 77 within a vertical stack of drain regions 77 located within a respective finger region FR. Thus, each active semiconductor region (73, 75, 77) includes at least one pair of sidewalls of channel regions 75, at least one sidewall of a source region 73, and at least one sidewall of a drain region 77 that are physically exposed to a respective one of the gate via cavities 29. Each of the gate via cavities 29 is formed through a respective subset of the semiconductor active regions (73, 75, 77) that are located within a respective finger region FR. In one embodiment, each semiconductor active region (73, 75, 77) can include at least two channel regions 75 having lengthwise sidewalls that are parallel to the first horizontal direction hd1. In one embodiment, the width of each channel region 75 along the second horizontal direction hd2 can be selected such that a gate voltage applied by a gate electrode to be subsequently formed in a gate via cavity 29 can turn on or turn off electrical current through a respective channel region 75.

Figure 17A:
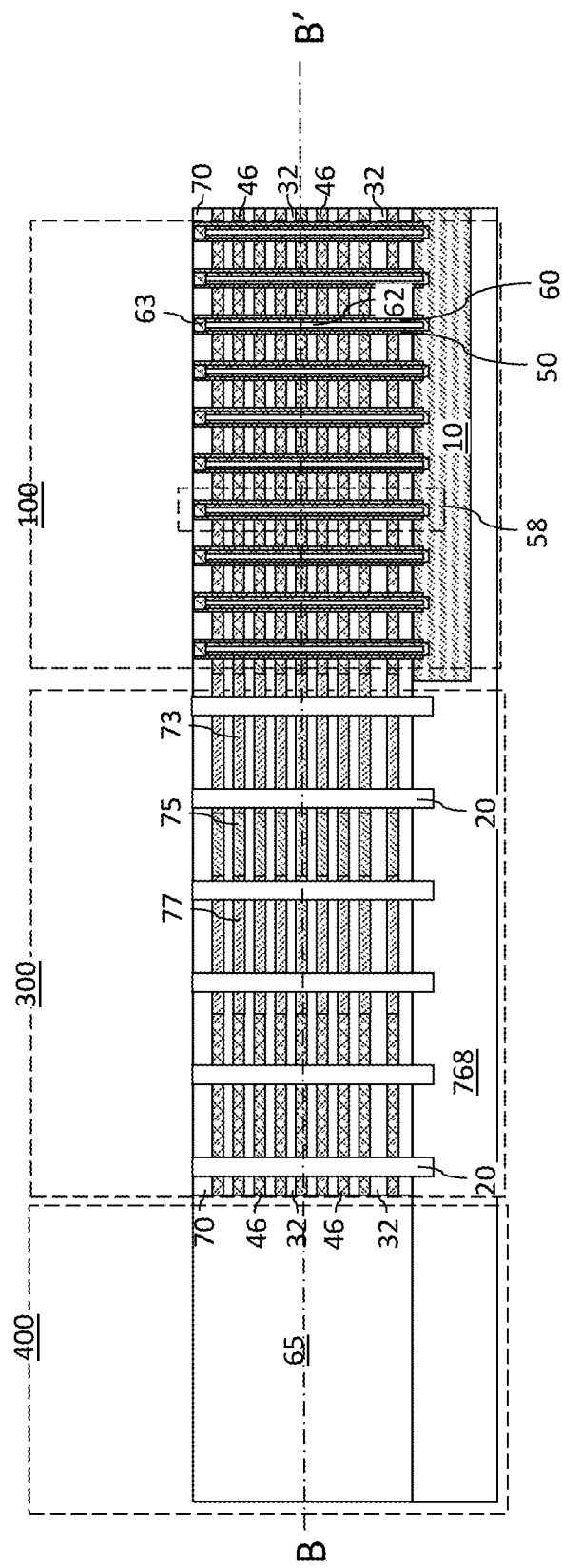
FIG. 17A is a vertical cross-sectional view of the exemplary structure after formation of gate dielectrics and gate electrodes according to an embodiment of the present disclosure.
Figure 17B:
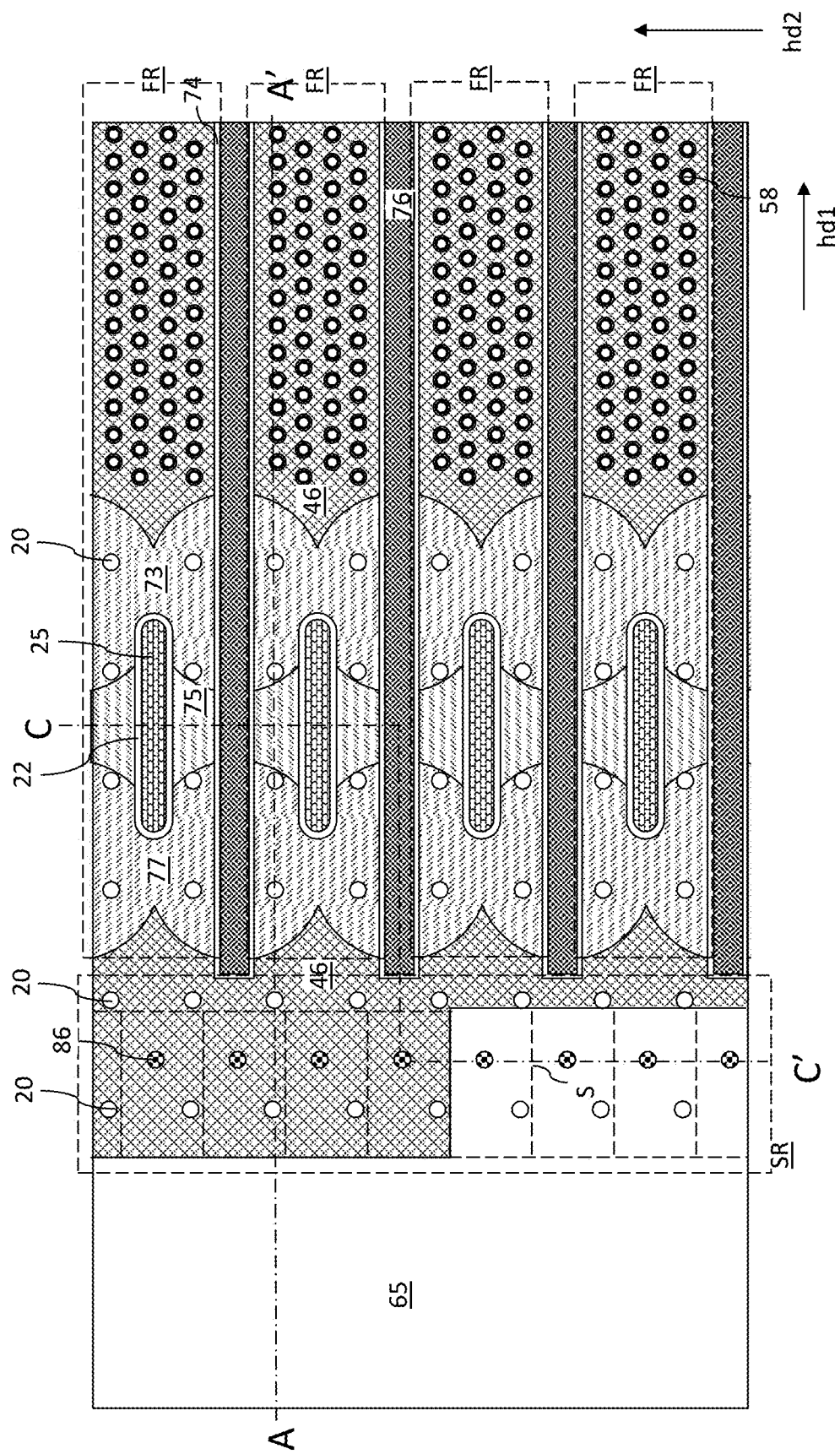
FIG. 17B is a horizontal cross-sectional view of the exemplary structure along the horizontal plane B-B' of FIG. 17A.
Figure 17C:
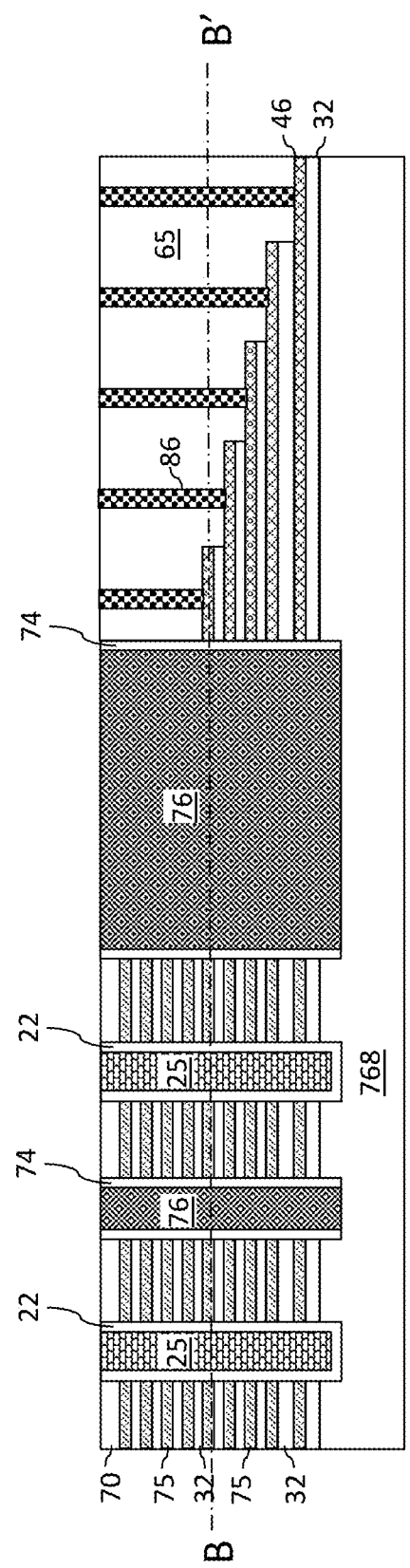
FIG. 17C is a vertical cross-sectional plane of an upper region of the exemplary structure along a zig-zag vertical cross-sectional plane C-C' of FIG. 17B.

Referring to FIGS. 17A-17C, a gate dielectric 22 can be formed around each gate via cavity 29 by conformal deposition of a gate dielectric material and/or by oxidation of surface portions of the semiconductor active regions (73, 75, 77) that are physically exposed to the gate via cavities 29. The gate dielectric 22 may include a dielectric metal oxide material or silicon oxide.

A conductive material may be deposited in remaining volumes of the gate via cavities 29 by a conformal deposition process. Excess portions of the conductive material can be removed from above the horizontal plane including the top surface of the insulating cap layer 70 by a planarization process such as a chemical mechanical polishing process. Each remaining portion of the conductive material comprises a gate electrode 25. The gate electrodes 25 may include a metallic material and/or a heavily doped semiconductor material.

A two-dimensional array of field effect transistors is provided. Each of the field effect transistors includes the active semiconductor region (73, 75, 77), a gate electrode 25 and a gate dielectric 22 separating the gate electrode 25 from the channel region 75. The two-dimensional array of field effect transistors act as word line/select gate access transistors and electrically connect or electrically inhibit each of the first electrically conductive layers (e.g., word lines and/or select gate electrodes) 46 in the memory array region 100 from a respective one of the second electrically conductive layers 46 that are located in the staircase region SR of the access transistor region 300.

In one embodiment, the gate electrodes 25 vertically extend through a respective vertical stack of active semiconductor regions (73, 75, 77), are laterally spaced apart along the second horizontal direction hd2, and are laterally surrounded by a respective gate dielectric 22. In one embodiment, each of the gate electrodes 25 vertically extends at least from a horizontal plane including a top surface of a topmost one of the second electrically conductive layers 46 and at least to a horizontal plane including a bottom surface of a bottommost one of the second electrically conductive layers 46.

In one embodiment, each of the gate electrodes 25 has a pair of planar sidewalls that are parallel to the first horizontal direction hd1. Each of the channel regions 75 comprises a segment having a uniform width along the second horizontal direction hd2. Each of the channel regions 75 has a non-uniform channel length along the first horizontal direction hd1 between a respective neighboring pair of a source region 73 and a drain region 77. The non-uniform channel length can vary along the second horizontal direction hd2 due to the curvature of the interfaces between the channel region 75 and each of the source region 73 and the drain region 77.

In one embodiment, each of the gate dielectrics 22 contacts sidewalls of at least one channel region 75 (such as a pair of channel regions 75), at least one source region 73, and at least one drain region 77, and is laterally surrounded by at least one of the semiconductor active regions (73, 75, 77). In case a gate dielectric 22 vertically extends through a plurality of semiconductor active regions (73, 75, 77) as a continuous material layer, the gate dielectric 22 may contact sidewalls of each semiconductor active region (73, 75, 77) within the plurality of semiconductor active regions (73, 75, 77).

In one embodiment, the first electrically conductive layers 46 and the second electrically conductive layers 46 may include a metallic material such as W, Ti·, Ta, Mo, Ru, and/or Co and may be free of nickel, and the first semiconductor surfaces and the second semiconductor surfaces may be free of nickel.

Word line contact via structures 86 are then formed in contact with the electrically conductive layers 46 by forming via openings through the retro-stepped dielectric layer 65 followed by filling the via openings with an electrically conductive material. The conductive material may be removed from above the exemplary structure by CMP.

Figure 18A:
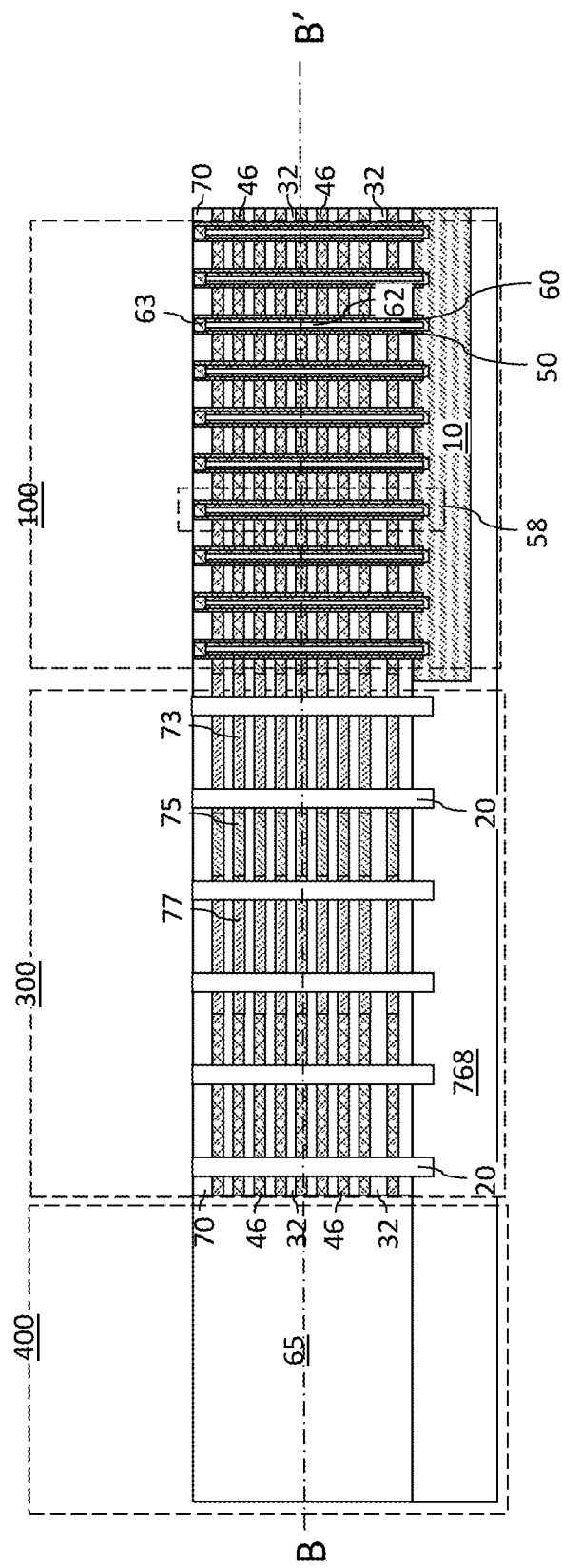
FIG. 18A is a vertical cross-sectional view of an alternative embodiment of the exemplary structure after deposition of a nickel layer according to an embodiment of the present disclosure.
Figure 18B:
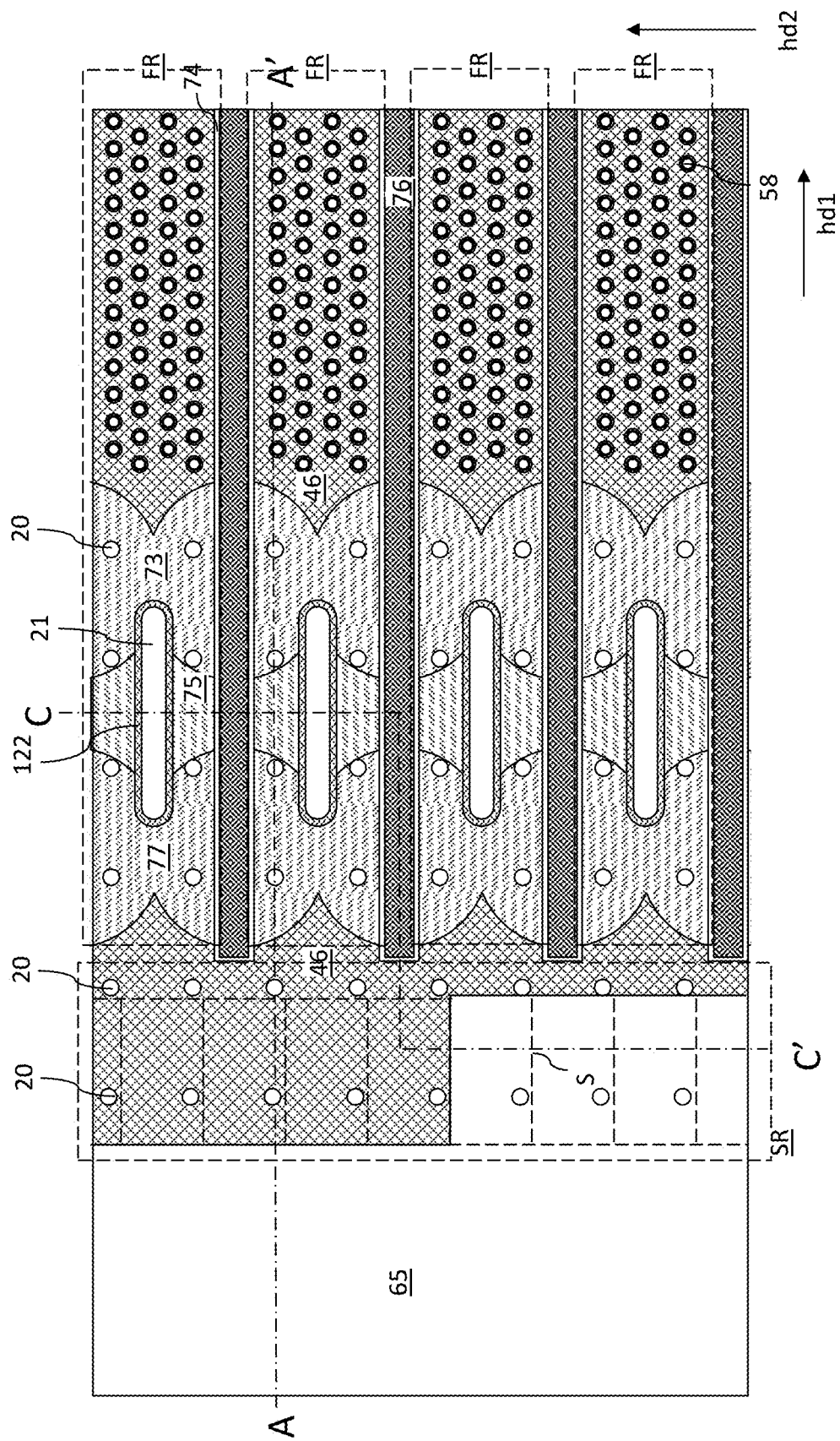
FIG. 18B is a horizontal cross-sectional view of the alternative embodiment of the exemplary structure along the horizontal plane B-B' of FIG. 18A.
Figure 18C:
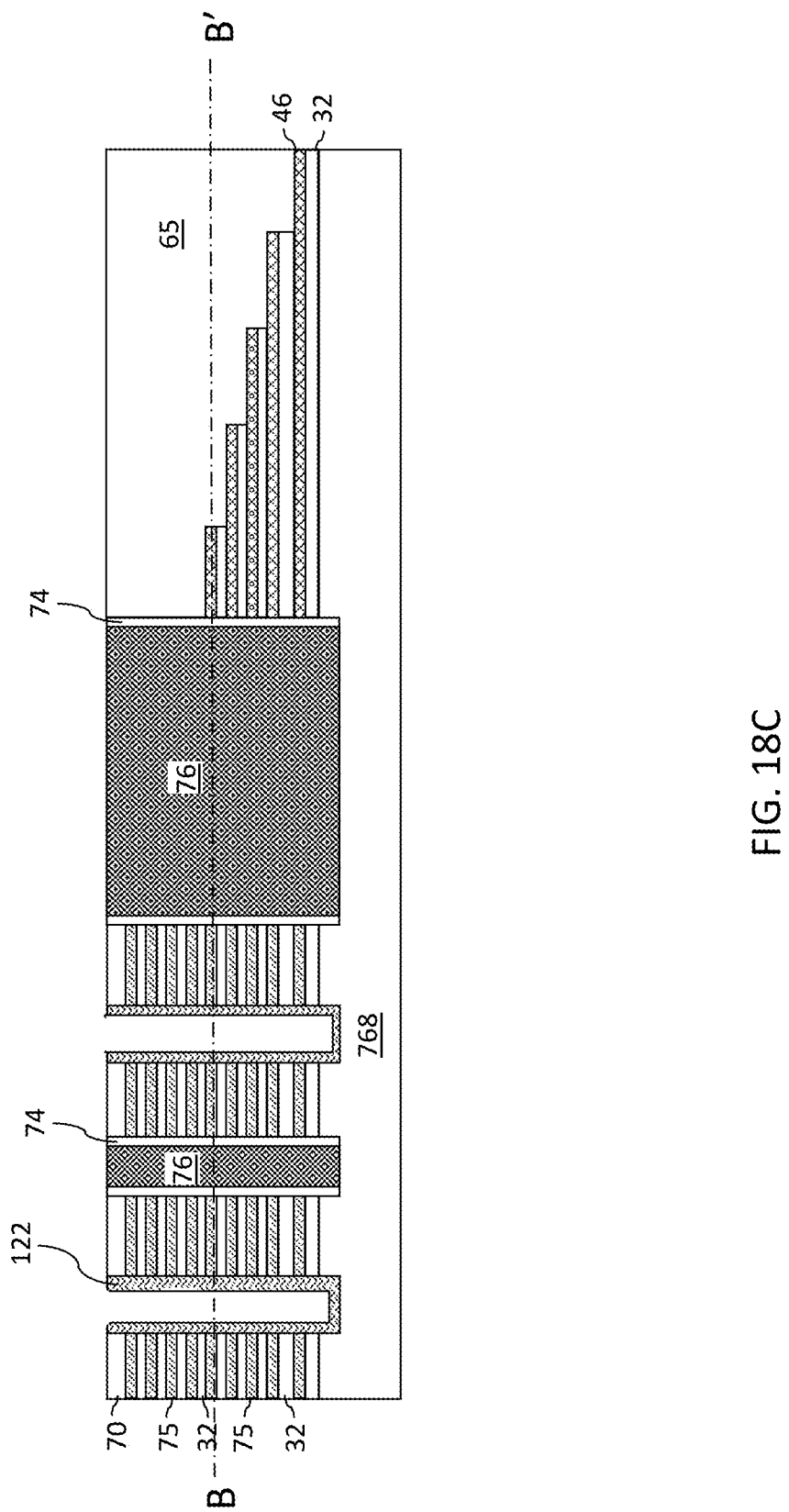
FIG. 18C is a vertical cross-sectional plane of an upper region of the alternative embodiment of the exemplary structure along a zig-zag vertical cross-sectional plane C-C' of FIG. 18B.

Referring to FIGS. 18A-18C, an alternative embodiment of the exemplary structure can be derived from the exemplary structure of FIGS. 16A-16C by conformally depositing a nickel layer 122 on sidewalls of the gate via cavities 29. The thickness of the nickel layer 122 may be in a range from 1 nm to 30 nm, such as from 3 nm to 10 nm, although lesser and greater thicknesses may also be employed. The nickel layer 122 is then removed from the top surface of the exemplary structure by CMP.

Figure 19A:
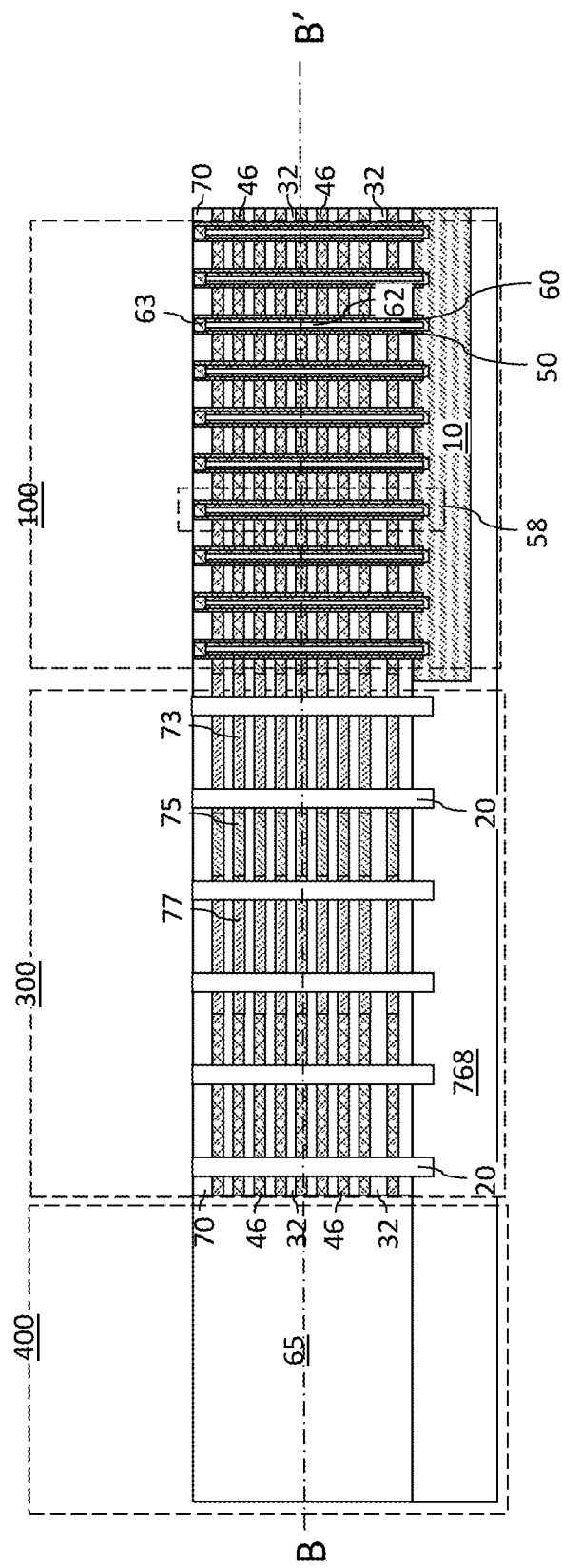
FIG. 19A is a vertical cross-sectional view of the alternative embodiment of the exemplary structure after a metal-induced crystallization process according to an embodiment of the present disclosure.
Figure 19B:
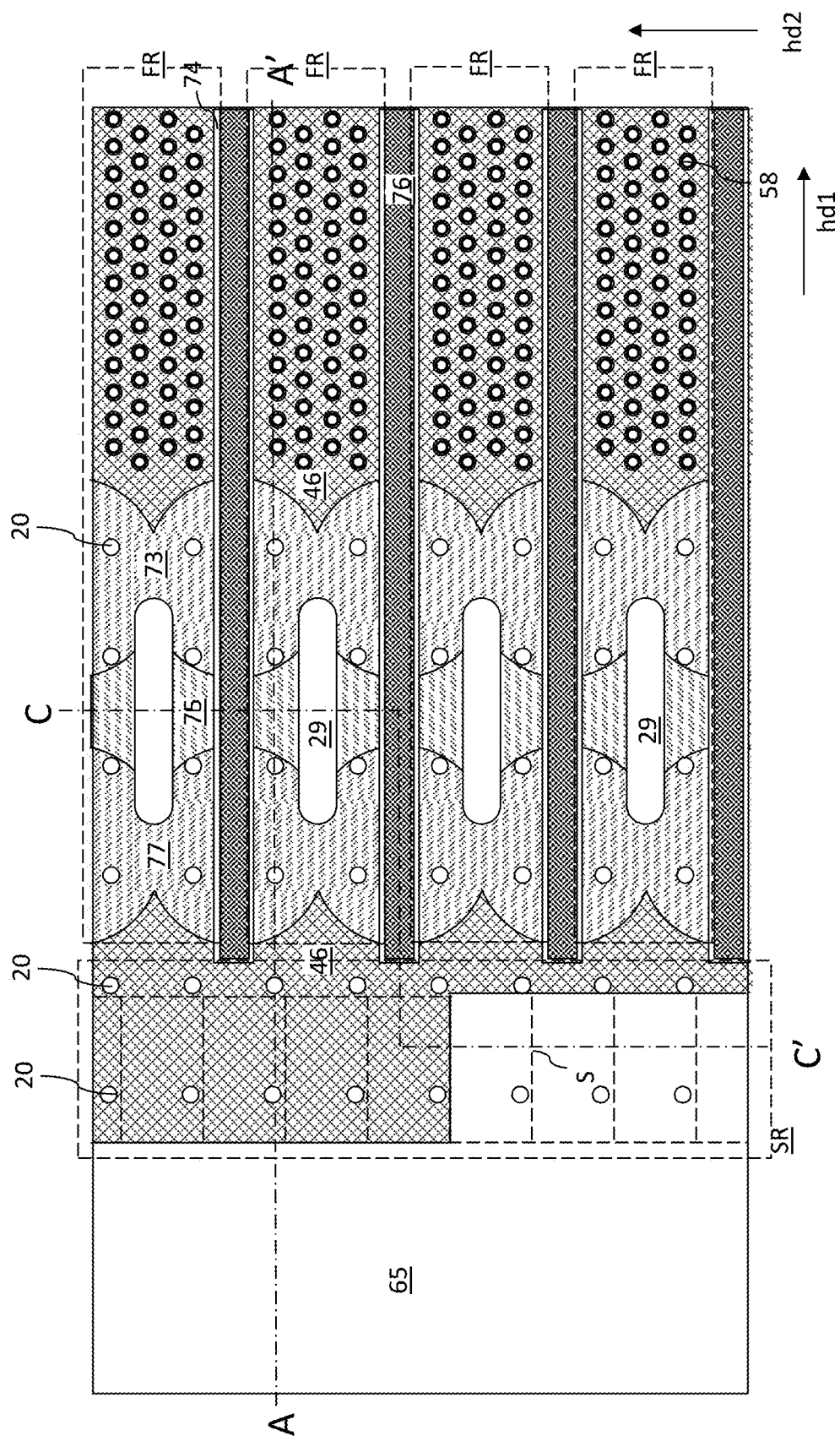
FIG. 19B is a horizontal cross-sectional view of the alternative embodiment of the exemplary structure along the horizontal plane B-B' of FIG. 19A.
Figure 19C:
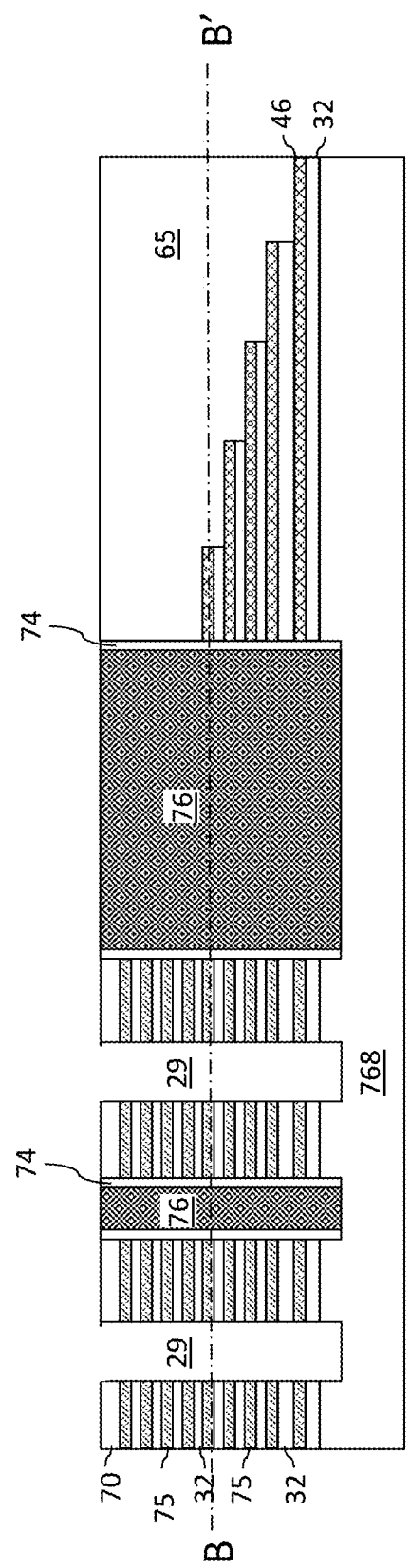
FIG. 19C is a vertical cross-sectional plane of an upper region of the alternative embodiment of the exemplary structure along a zig-zag vertical cross-sectional plane C-C' of FIG. 19B.

Referring to FIGS. 19A-19C, a thermal anneal process can be performed to elevate the temperature of the exemplary structure that induces diffusion of nickel atoms from the nickel layer 122 though the semiconductor active regions (73, 75, 77) toward the electrically conductive layers 46. The elevated temperature of the thermal anneal process may be in a range from 400 degrees Celsius to 600 degrees Celsius. The thermal anneal process causes a metal-induced crystallization process within the semiconductor active regions (73, 75, 77), in which the average size of crystallographic grains of the semiconductor materials in the semiconductor active regions (73, 75, 77) increases due to catalytic growth of the grains of the semiconductor materials. The increase in the average grain size in the channel regions 75, the source regions 73, and the drain regions 77 has the effect of decreasing the resistivity of the semiconductor materials of the semiconductor active regions (73, 75, 77). Generally, the metal-induced crystallization process can be performed by laterally diffusing nickel atoms from the nickel layer 122 through the semiconductor active regions (73, 75, 77). In one embodiment, at least a portion of the active regions (73, 77, 75) located adjacent to the nickel layer is recrystallized into a larger grained polysilicon or into single crystalline silicon. A nickel or nickel silicide selective etch, such as an isotropic wet etch process may be performed to remove the remaining portions of the nickel layer 122. In alternative embodiments, other metals, such as cobalt or platinum, which provide metal-induced crystallization may be used instead of nickel.

Figure 20A:
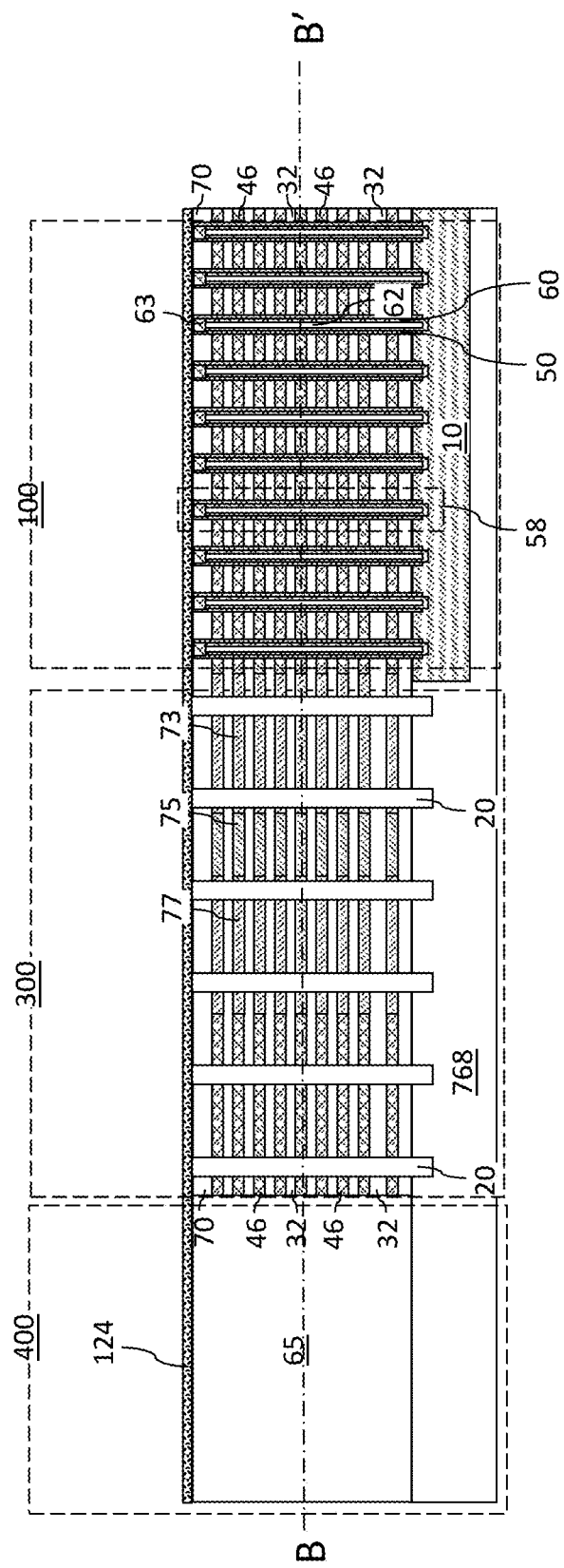
FIG. 20A is a vertical cross-sectional view of the alternative embodiment of the exemplary structure after deposition of a getter material layer according to an embodiment of the present disclosure.
Figure 20B:
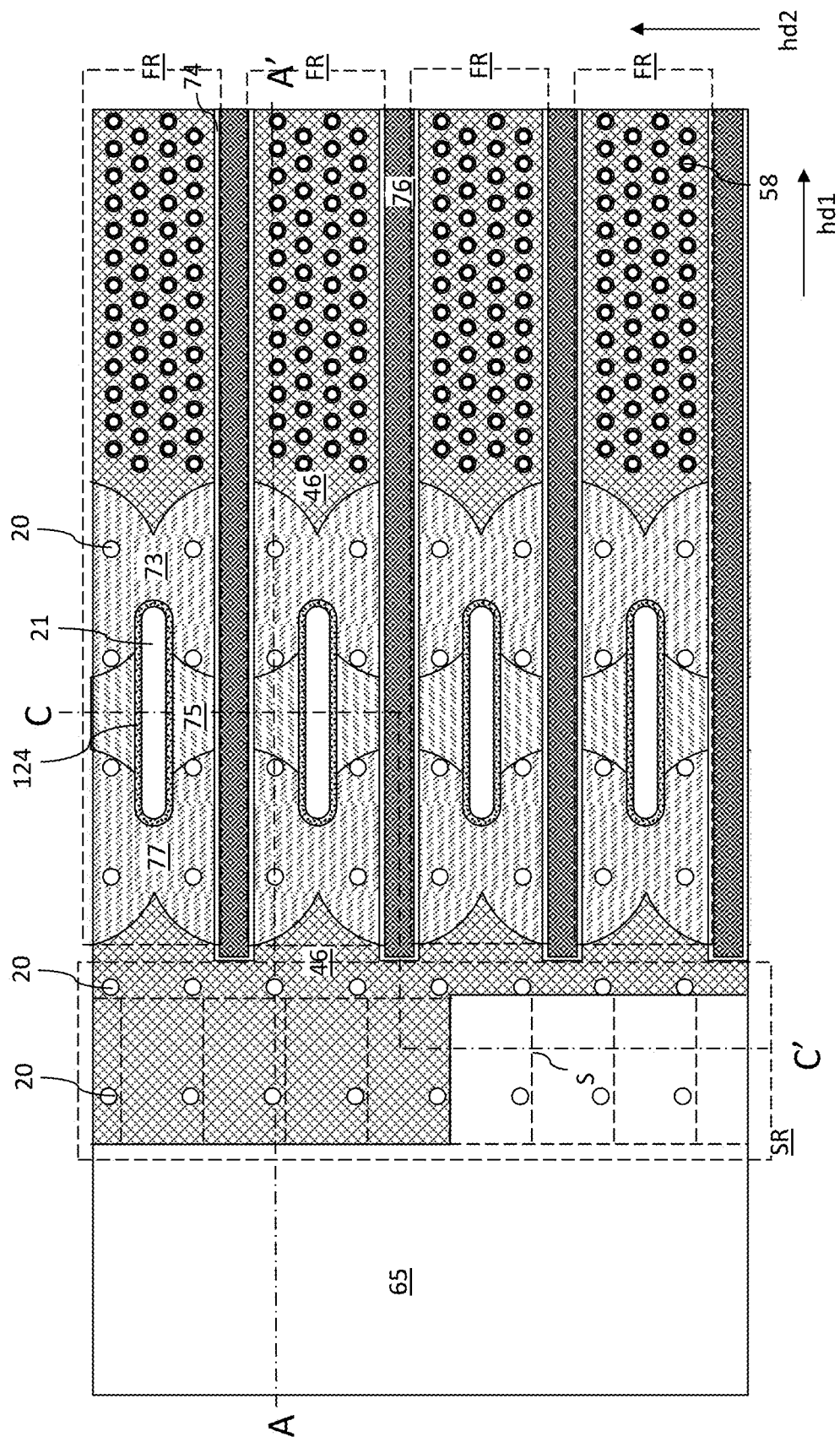
FIG. 20B is a horizontal cross-sectional view of the alternative embodiment of the exemplary structure along the horizontal plane B-B' of FIG. 20A.
Figure 20C:
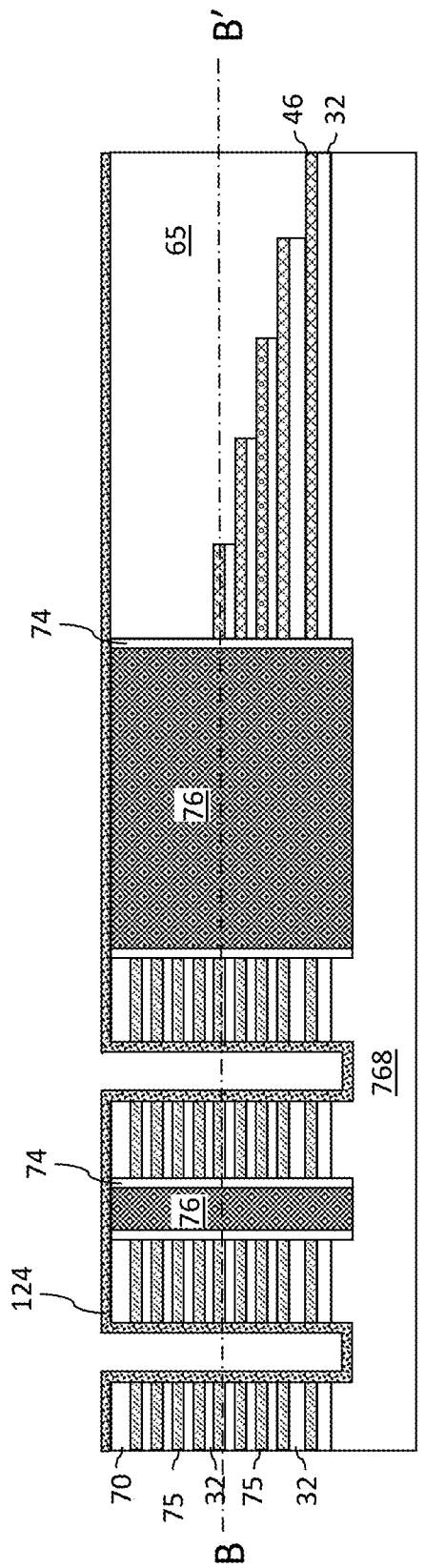
FIG. 20C is a vertical cross-sectional plane of an upper region of the alternative embodiment of the exemplary structure along a zig-zag vertical cross-sectional plane C-C' of FIG. 20B.

Referring to FIGS. 20A-20C, a getter material layer 124 can be conformally deposited on the sidewalls of the gate cavities 29. The getter material layer 124 includes a semiconductor material that attracts nickel atoms more strongly than the semiconductor material within the semiconductor active regions (73, 75, 77) to form a stable compound. For example, the semiconductor active regions (73, 75, 77) may include doped silicon, and the getter material layer 124 may include, and/or may consist essentially of, germanium or silicon-germanium. The thickness of the getter material layer 124 may be in a range from 1 nm to 30 nm, such as from 3 nm to 10 nm, although lesser and greater thicknesses may also be employed. A portion of the getter material layer 124 may be left on top of the exemplary structure or it may be removed from the top of the exemplary structure by CMP.

A gettering process can be performed by annealing the exemplary structure at an elevated temperature in which nickel atoms diffuse through the semiconductor active regions (73, 75, 77) toward the getter material layer 124. The getter material layer 124 can be converted into a nickel-containing compound layer such as a nickel germanide or a nickel germanide-silicide layer. The getter material layer 124 can be subsequently removed by performing a selective isotropic etch process such as a wet etch process that removes the nickel-containing compound material selective to the materials of the insulating layers 32, the semiconductor active regions (73, 75, 77), and the electrically conductive layers 46.

Figure 21A:
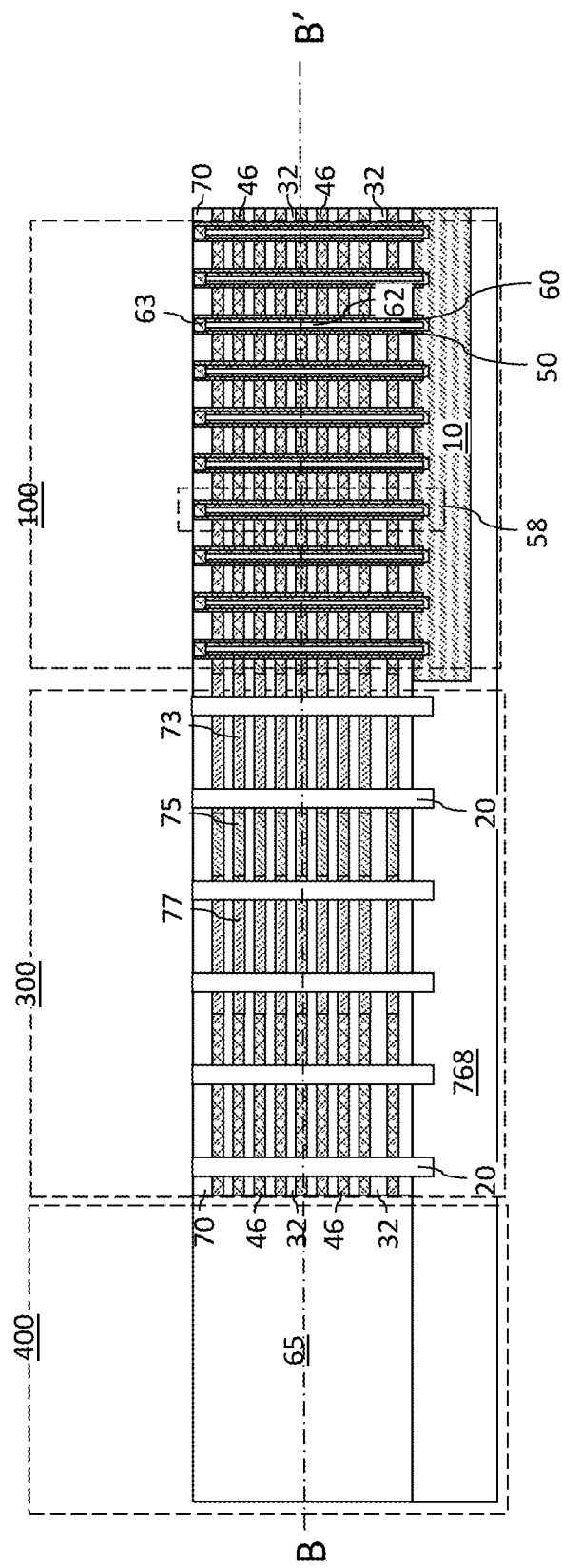
FIG. 21A is a vertical cross-sectional view of the alternative embodiment of the exemplary structure after formation of gate dielectrics and gate electrodes according to an embodiment of the present disclosure.
Figure 21B:
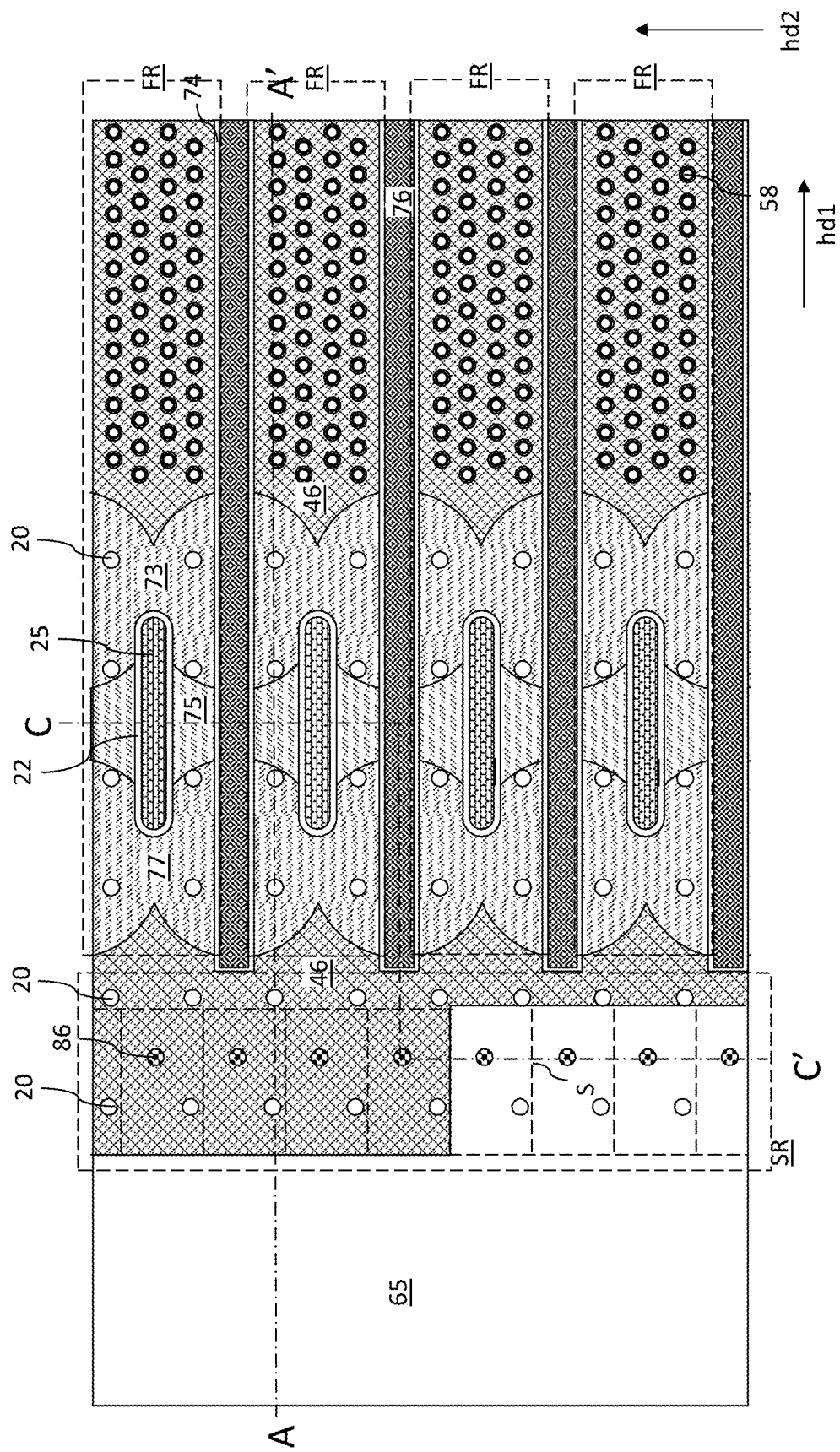
FIG. 21B is a horizontal cross-sectional view of the alternative embodiment of the exemplary structure along the horizontal plane B-B' of FIG. 21A.
Figure 21C:
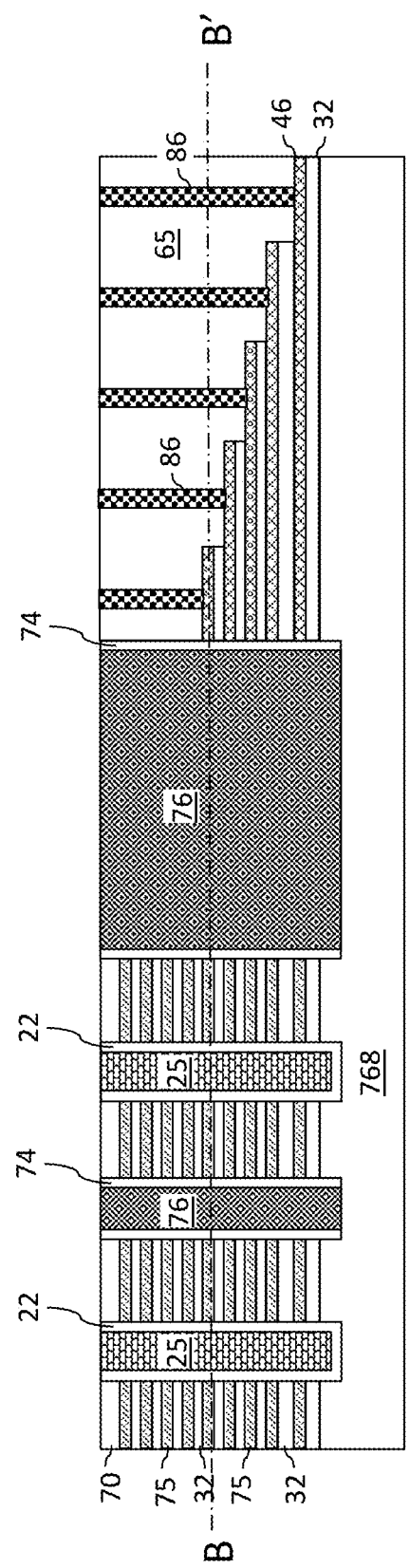
FIG. 21C is a vertical cross-sectional plane of an upper region of the alternative embodiment of the exemplary structure along a zig-zag vertical cross-sectional plane C-C' of FIG. 21B.

Referring to FIGS. 21A-21C, the processing steps of FIGS. 17A-17C can be performed to form a gate dielectric 22 and a gate electrode 25 within each of the gate cavities 29. In one embodiment, the first electrically conductive layers 46 and the second electrically conductive layers 46 may be free of nickel, and the first semiconductor surfaces and the second semiconductor surfaces may comprise nickel atoms at a concentration in a range from 1 part per million to 1%.

Figure 22A:
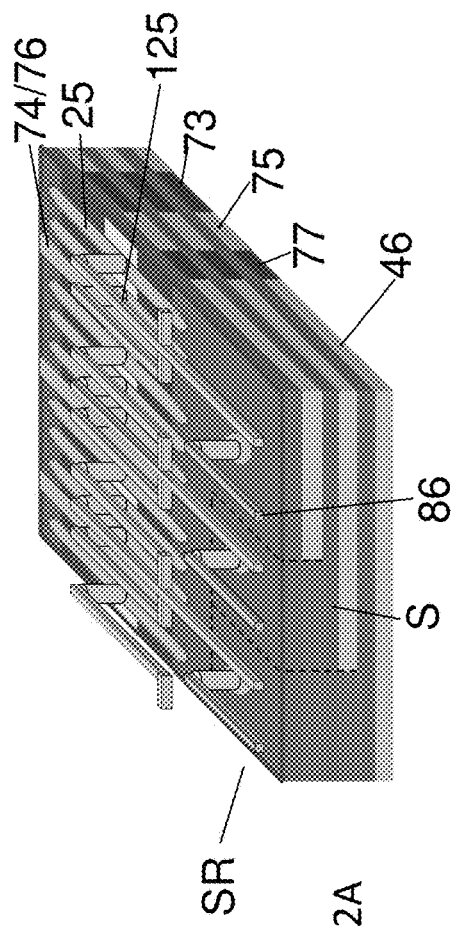
FIGS. 22A and 22B are respective perspective and top views of the exemplary structures after formation of interconnects.
Figure 22B:
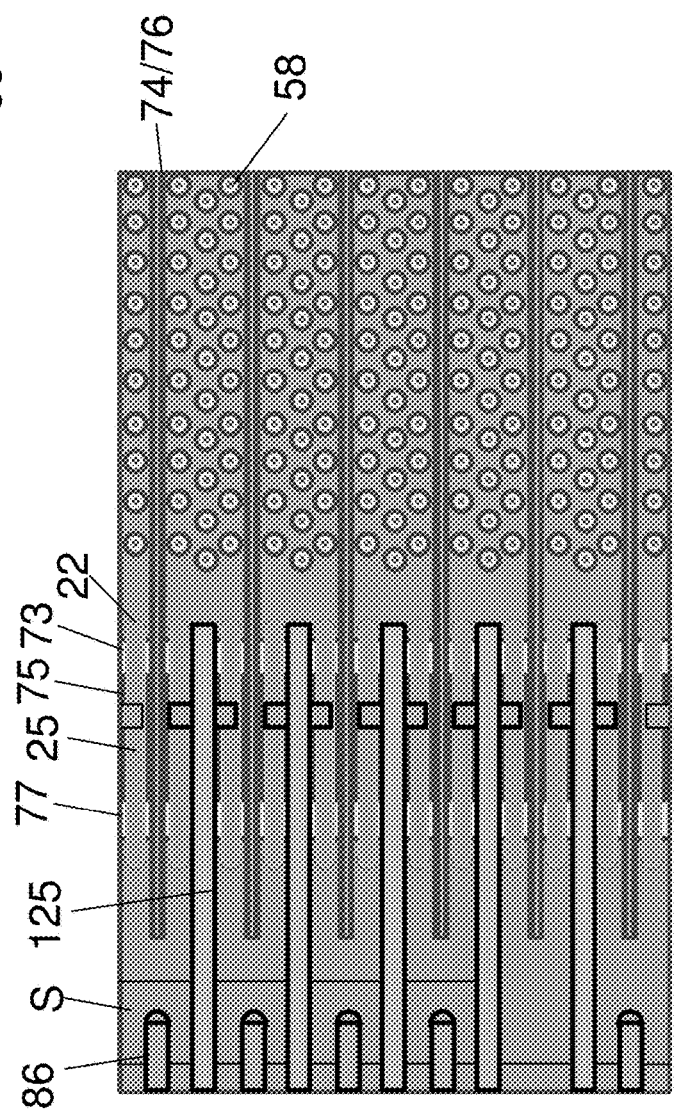

FIGS. 22A and 22B illustrate the exemplary structures of FIGS. 17A-17C or 21A-21C after formation of interconnects. Specifically, a gate interconnect 125 is formed in electrical contact with each gate electrode 25 in the same memory block (i.e., finger FR), and a word line interconnect is formed in electrical contact with each respective word line contact via structures 86. During the inhibit (i.e., "off") mode operation of the access transistors, zero volts is applied to the gate electrode 25 (i.e., the gate electrode is grounded) to inhibit a particular memory block/finger region FR. Thus, current does not flow from the staircase region to the memory array region during the inhibit mode. During the "on" mode operation of the access transistors, a turn on voltage (e.g., a positive voltage between 5V and 10V) is applied to the gate electrode 25 to allow current to flow through the access transistor from the staircase region to the memory array region of a particular memory block/finger region to turn on/select the particular memory block/finger region. Bit lines (not shown) are then formed in electrical contact with the drain regions 63. The bit lines may extend in the second horizontal direction hd2 in the memory array region 100.

FIGS. 23A to 23H illustrate the steps in a method according to an alternative embodiment of the present disclosure. In this embodiment, the sacrificial material layers 42 are replaced with first electrically conductive layers 46A that are located within a memory array region 100, second electrically conductive layers 46B that are located within the staircase region SR, and active semiconductor regions (73, 75, 77) that are located in an access transistor region 300 located between the staircase region SR and the memory array region 100. In this alternative embodiment, the entire sacrificial material layers 42 are replaced with continuous electrically conductive layers, followed by forming a cavity in the continuous electrically conductive layers in the access transistor region, followed by forming the active semiconductor regions (73, 75, 77) in the cavity.

Figure 23A:
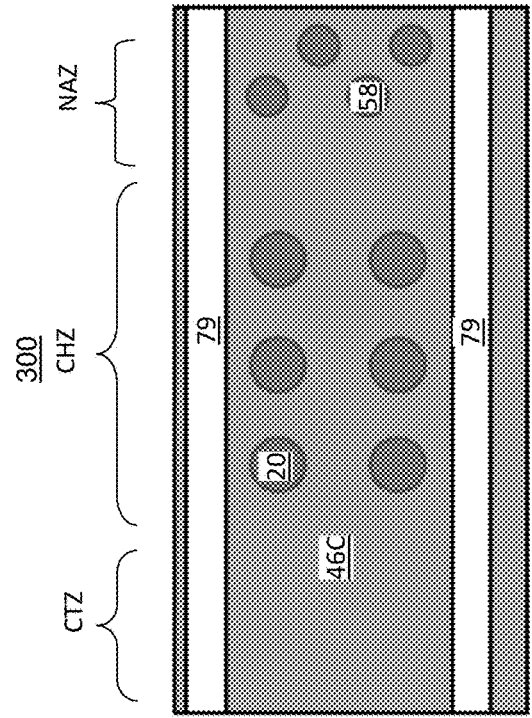
FIGS. 23A-23H are alternative horizontal cross-sectional views of the access transistor region of the exemplary structure during steps of forming active regions of an access transistor of the exemplary structure according to an alternative embodiment of the present disclosure.

FIG. 23A illustrates the horizontal cross-sectional view of the access transistor region 300 of the exemplary structure FIGS. 8A-8C, in which the sacrificial material layers 42 extend continuously from the memory array region 100 through the near-array zone NAZ and the channel zone CHZ of the access transistor region 300 to the staircase region SR (shown in FIG. 8B) located in contact zone CTZ of the access transistor region 300.

Figure 23B:
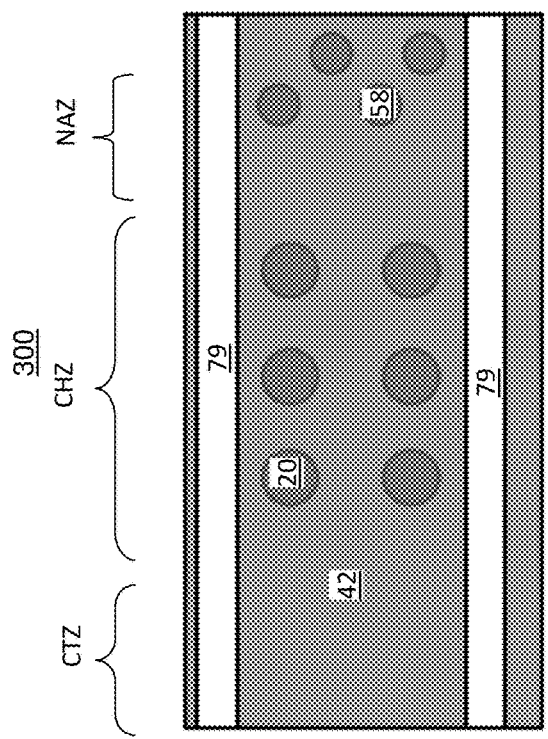

Referring to FIG. 23B, the sacrificial material layers 42 are replaced with continuous electrically conductive layers 46C through the backside trenches 79 prior to forming any masking pillar structures. Specifically, the entire sacrificial material layers 42 are removed by isotropic etching through the backside trenches 79 to form the backside recesses 43, as described above with respect to FIGS. 11A-11C. The continuous electrically conductive layers 46C are then formed in the backside recesses 43 though the backside recesses 43, as described above with respect to FIGS. 12A-12C.

Figure 23C:
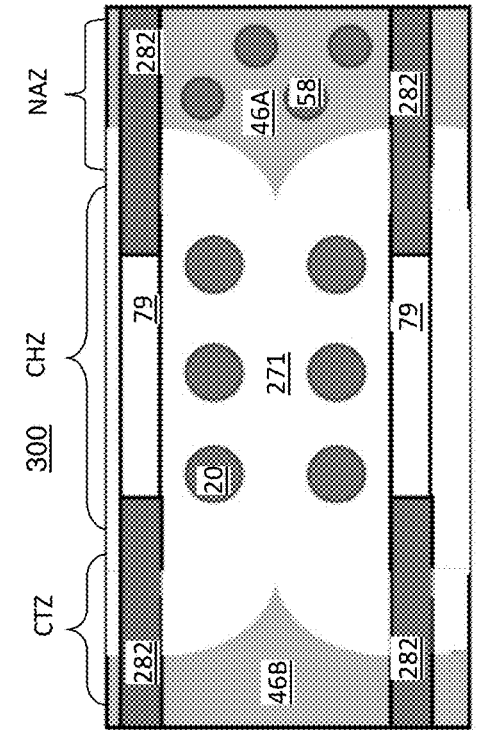

Referring to FIG. 23C, masking pillar structures 282 are formed within portions of the backside trenches 79, as described above with respect to FIG. 13A. The masking pillar structures 282 laterally cover portions of the continuous electrically conductive layers 46C in the memory array region 100 and in the staircase region SR, and do not laterally cover the portions of the continuous electrically conductive layers 46C in the access transistor region 300. Specifically, the masking pillar structures 282 laterally cover portions of the continuous electrically conductive layers 46C in the staircase region SR (shown in FIG. 8B) located in contact zone CTZ of the access transistor region 300, but do not laterally cover the portions of the continuous electrically conductive layers 46C at least in the channel zone CHZ in the access transistor region 300. The masking pillar structures 282 may or may not laterally cover portions of the continuous electrically conductive layers 46C in the near-array zone NAZ of the access transistor region 300, depending on the lateral extend of the near-array zone. Subsequently, portions of the continuous electrically conductive layers 46C located in the access transistor region 300 are replaced with the active semiconductor regions (73, 75, 77), as will be described with reference to FIGS. 23D to 23G.

Figure 23D:
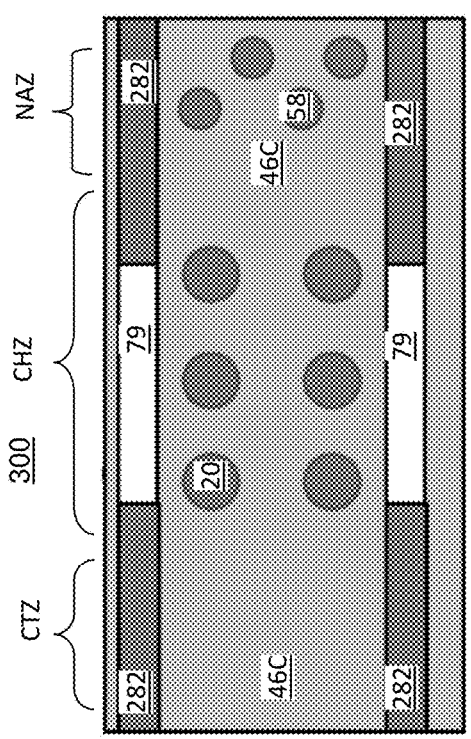

Referring to FIG. 23D, portions of the continuous electrically conductive layers 46C located in the access transistor region 300 are isotropically etched by introducing an isotropic etchant into volumes of the backside trenches 79 that are not filled with the masking pillar structures 282. Specifically, portions of the continuous electrically conductive layers 46C located in the channel zone CHZ of the access transistor region 300 are isotropically etched to form transistor region cavities 271 in the portions of the continuous electrically conductive layers 46C located in the access transistor region 300, such as in the channel zone CHZ of the access transistor region 300. Due to the lateral etching action of the isotropic etchant, the transistor region cavities 271 may extend at least into parts of the near-array zone NAZ and the contact zone CTZ of the access transistor region 300. Thus, the transistor region cavities 271 are wider along the first horizontal direction hd1 (e.g., word line direction) than the volumes of the backside trenches 79 adjacent to the channel zone CHZ that are not filled with the masking pillar structures 282.

The isotropic etching separates the continuous electrically conductive layers 46C into the first electrically conductive layers 46A that are located with a memory array region 100 and the second electrically conductive layers 46B that are located within the staircase region SR. Furthermore, the first electrically conductive layers 46A may optionally partially extend into the near-array zone NAZ of the access transistor region 300 and the second electrically conductive layers 46B are also located at least partially in the contact zone CTZ of the access transistor region 300.

Figure 23F:
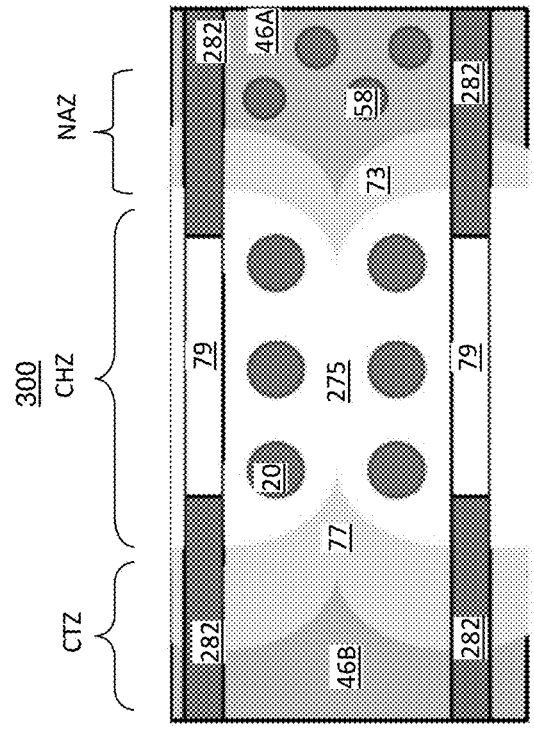
Figure 23E:
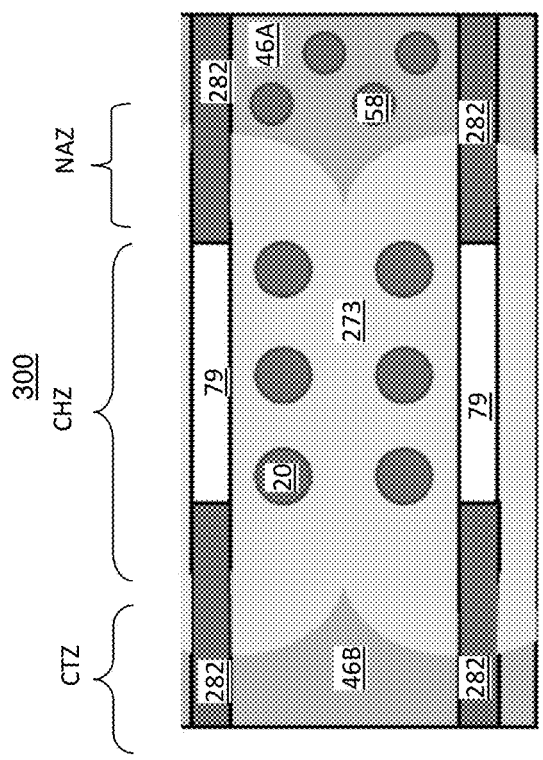

Referring to FIG. 23E, second conductivity type semiconductor material layers 273 are formed in the transistor region cavities 271 through the volumes of the backside trenches 79 that are not filled with the masking pillar structures 282. The semiconductor material may include amorphous silicon, polysilicon, or any other semiconductor material. The atomic concentration of dopants of the second conductivity type can be in a range from $5.0 \times 10^{18}/cm^3$ to $2.0\times10^{21}/cm^3$, although lesser and greater atomic concentrations may also be employed. Preferably, the dopants are n-type dopants.

Referring to FIG. 23F, a middle portion of the second conductivity type semiconductor material layers 273 is partially etched back through the volumes of the backside trenches 79 that are not filled with the masking pillar structures 282. The partial etch back may comprise a timed isotropic etch which provides the isotropic etchant into volumes of the backside trenches 79 that are not filled with the masking pillar structures 282 to etch the middle portion of layer 273 located adjacent to the unfilled backside trench 79 volume, but not the lateral edge portions of layer 273 located adjacent to the masking pillar structures 282.

The partial etch back forms second conductivity type semiconductor source regions 73 and drain regions 77 separated by respective channel cavities 275 along the first horizontal direction hd1 in each vertical device level. The source and drain regions (73, 77) comprise the unetched lateral edge portion of the semiconductor material layers 273. The source regions 73 may be located in the near-array zone NAZ, the drain regions 77 may be located in the contact zone CTZ of the access transistor region 300, and the channel cavities 275 may be located in the channel zone CHZ of the access transistor region 300.

Figure 23H:
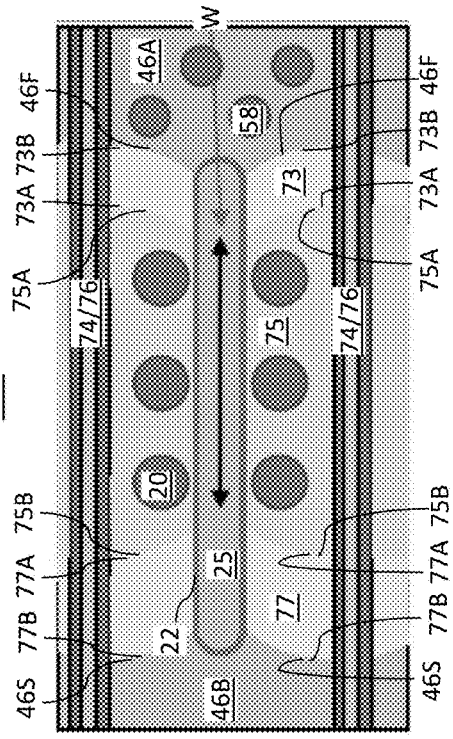
Figure 23G:
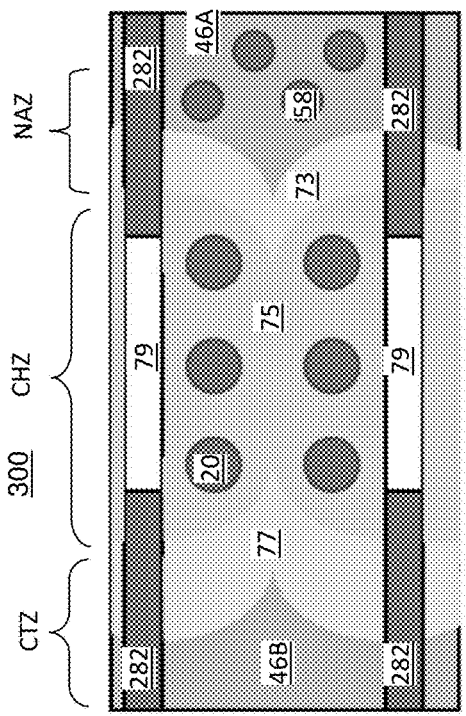

Referring to FIG. 23G, first conductivity type semiconductor channel regions 75 are formed in the respective channel cavities 275 through the volumes of the backside trenches 79 that are not filled with the masking pillar structures 282. In one embodiment, the atomic concentration of dopants (e.g., boron) of the first conductivity type (e.g., p-type) in the channel regions may be in a range from $1.0\times10^{14}/cm^3$ to $1.0\times10^{18}/cm^3$, although lesser and greater atomic concentrations may also be employed. The formation of the channel regions 75 in the channel zones CHZ of the access transistor region 300 completes the active semiconductor regions (73, 75, 77) in each vertical device level.

Referring to FIG. 23H, the masking pillar structures 282 are removed from the backside trenches 79 by selective etching, similar to the steps described above. The insulating spacers 74 and the backside contact via structures 76 are then formed in the respective backside trenches 79, as described above.

The method according to an alternative embodiment shown in FIGS. 23A-23H is simpler than the method described above with respect to FIGS. 13A-13E because only one masking pillar structure 282 formation step is used. Furthermore, the width W of the channel region 75 shown in FIG. 23H is easier to control. Specifically, the channel region 75 width W along the first horizontal direction hd1 is controlled by the width of the opening between the masking pillar structures 282 and the partial etch back of the respective second conductivity type semiconductor material layer 273. Furthermore, the convex shape of the middle of the inner portions of the source and drain regions (73, 77) provides an improved control of the channel region 75 width W.

Referring to all drawings and according to additional various embodiments of the present disclosure, a three-dimensional memory device includes an alternating stack of insulating layers 32 and electrically conductive layers 46 having a staircase region SR, a memory array region 100 and an access transistor region 300 (e.g., at least the channel zone CHZ of region 300) located between the staircase region SR and the memory array region 100, memory opening fill structures 58 including a respective vertical semiconductor channel 60 and a respective vertical stack of memory elements 54 extending through the alternating stack in a memory array region 100, word line via contact structures 86 contacting the stepped surfaces of the electrically conductive layers 46 at each step in a staircase region SR, and a vertical stack of access transistors (22, 25, 73, 75, 77) located in the access transistor region 300 between the staircase region SR and the memory array region 100.

In one embodiment, each electrically conductive layer 46 contains one step S and is in contact with only one word line via contact structure 86 for a plurality of memory blocks (e.g., finger regions FR). The electrically conductive layers extend in a first horizontal direction hd1, and the steps S step up and down only along a second horizontal direction hd2 which is perpendicular to the first horizontal direction hd1.

In one embodiment, a plurality of backside trenches 76 extend through the alternating stack (32, 46), wherein the plurality of backside trenches separate the alternating stack into a plurality of finger regions FR in the memory array regions 100 but not in the staircase region SR, and each of the finger regions comprises one of the respective memory blocks.

In one embodiment, each of the access transistors comprises a gate electrode 25, a gate dielectric 22, and an active region comprising a source region 73, a drain region 77 and a semiconductor channel region 75 located between the source region and the drain region. The active region of each access transistor is located at a same level (i.e., vertical level as measured from the top surface of the substrate 8) as a respective electrically conductive layer 46. The gate electrode 25 vertically extends through the active semiconductor regions of the vertical stack of access transistors, such that each gate electrode is shared between all access transistors in the vertical stack of access transistors.

Referring to FIG. 23H, each interface between the source region 73 and the channel region 75 within each active region (i.e., active semiconductor region) (73, 75, 77) comprises a first vertically straight and laterally concave surface 73A of the source region 73 that contacts a first vertically straight and laterally convex surface 75A of the channel region 75. Each interface between a drain region 77 and the channel region 75 within each active semiconductor region comprises a first vertically straight and laterally concave surface 77A of the drain region 77 that contacts a second vertically straight and laterally convex surface 75B of the channel region 75.

In one embodiment, the plurality of trenches 79 extend through the alternating stack (32, 46) in a first horizontal direction hd1 and are spaced apart along a second horizontal direction hd2 which is perpendicular to the first horizontal direction. The source region 73 extends along the second horizontal direction hd2 through a respective one of the plurality of finger regions FR between two neighboring trenches 79. The drain region 77 extends along the second horizontal direction hd2 through the respective one of the plurality of finger regions FR between two neighboring trenches 79, and is separated from the respective source region 73 of the same active region (73, 75, 77) along the first horizontal direction hd1. The channel region 75 extends along the second horizontal direction hd2 through the respective one of the plurality of finger regions FR between two neighboring trenches 79, and is located between the respective source region 73 and drain region 77 of the same active region (73, 75, 77).

In one embodiment shown in FIG. 23H, the respective finger region FR further comprises two of the first vertically straight and laterally concave surfaces 73A of the source region 73 that contact two first vertically straight and laterally convex surfaces 75A of the channel region 75, and two of the first vertically straight and laterally concave surfaces 77A of the drain region 77 that contact two second vertically straight and laterally convex surfaces 75B of the channel region 75.

In one embodiment shown in FIG. 23H, the respective finger region FR further comprises two second vertically straight and laterally convex surfaces 73B of the source region 73 that contact two first vertically straight and laterally concave surfaces 46F of a respective one of the first electrically conductive layers 46A, and two second vertically straight and laterally convex surfaces 77B of the drain region 77 that contact two second vertically straight and laterally concave surfaces 46S of the respective one of the second electrically conductive layers 46B.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers having a staircase region, a memory array region and an access transistor region located between the staircase region and the memory array region;
   memory opening fill structures comprising a respective vertical semiconductor channel and a respective vertical stack of memory elements extending through the alternating stack in the memory array region;
   via contact structures contacting the stepped surfaces of the electrically conductive layers at each step in the staircase region;
   a vertical stack of access transistors located in the access transistor region; and
   a plurality of trenches extending through the alternating stack, wherein the plurality of trenches separate the alternating stack into a plurality of finger regions in the memory array regions but not in the staircase region, and each of the finger regions comprises one of the respective memory blocks.

2. The three-dimensional memory device of claim 1, wherein:
   each electrically conductive layer contains one step and is in contact with only one via contact structure for a plurality of memory blocks;
   the electrically conductive layers extend in a first horizontal direction; and
   the steps step up and down only along a second horizontal direction which is perpendicular to the first horizontal direction.

3. The three-dimensional memory device of claim 1, wherein:
   each of the access transistors comprises a gate electrode, a gate dielectric, and an active region comprising a source region, a drain region and a channel region located between the source region and the drain region; and
   the active region of each access transistor is located at a same level as a respective electrically conductive layer.

4. The three-dimensional memory device of claim 3, wherein the gate electrode vertically extends through the active region of each access transistor of the vertical stack of access transistors, such that each gate electrode is shared between all access transistors in the vertical stack of access transistors.

5. The three-dimensional memory device of claim 3, wherein:
   each interface between the source region and the channel region within each active region comprises a first vertically straight and laterally concave surface of the source region that contacts a first vertically straight and laterally convex surface of the channel region; and
   each interface between the drain region and the channel region within each active region comprises a first vertically straight and laterally concave surface of the drain region that contacts a second vertically straight and laterally convex surface of the channel region.

6. The three-dimensional memory device of claim 5, wherein:
   the plurality of trenches extend through the alternating stack in a first horizontal direction and are spaced apart along a second horizontal direction which is perpendicular to the first horizontal direction;
   the source region extends along the second horizontal direction through a respective one of the plurality of finger regions between two neighboring trenches;
   the drain region extends along the second horizontal direction through the respective one of the plurality of finger regions between two neighboring trenches, and is separated from the respective source region of the same active region along the first horizontal direction; and
   the channel region extends along the second horizontal direction through the respective one of the plurality of finger regions between two neighboring trenches, and is located between the respective source and drain regions of the same active region.

7. The three-dimensional memory device of claim 6, wherein the respective finger region further comprises:
   two of the first vertically straight and laterally concave surfaces of the source region that contact two first vertically straight and laterally convex surfaces of the channel region; and
   two of the first vertically straight and laterally concave surfaces of the drain region that contact two second vertically straight and laterally convex surfaces of the channel region.

8. The three-dimensional memory device of claim 7, wherein the respective finger region further comprises:
   two second vertically straight and laterally convex surfaces of the source region that contact two first vertically straight and laterally concave surfaces of a respective one of the first electrically conductive layers; and
   two second vertically straight and laterally convex surfaces of the drain region that contact two second vertically straight and laterally concave surfaces of the respective one of the second electrically conductive layers.

9. The three-dimensional memory device of claim 6, wherein:
    each of the gate electrodes has a pair of planar sidewalls that are parallel to the first horizontal direction; each of the channel regions comprises a segment having a uniform width along the second horizontal direction;
    each of the channel regions has a non-uniform channel length along the first horizontal direction between a respective neighboring pair of the source region and the drain region, the non-uniform channel length varying along the second horizontal direction; and
    each of the gate dielectrics contacts sidewalls of at least one channel region, at least one source region, and at least one drain region, and is laterally surrounded by at least one of the active regions.

10. A method of forming a semiconductor structure, comprising:
    forming an alternating stack of insulating layers and sacrificial material layers over a substrate;
    forming memory elements through the alternating stack;
    forming backside trenches that laterally extend along a first horizontal direction through the alternating stack, wherein the alternating stack is divided into finger regions that are laterally spaced apart from each other along a second horizontal direction which is perpendicular to the first horizontal direction by the backside trenches, and by a staircase region adjoined to end portions of the finger regions;
    replacing the sacrificial material layers with first electrically conductive layers that are located within a memory array region, second electrically conductive layers that are located within the staircase region, and active semiconductor regions that are located in an access transistor region located between the staircase region and the memory array region;
    forming vertically extending gate via cavities through the active semiconductor regions; and
    forming a gate dielectric and a vertical gate electrode in each of the gate via cavities.

11. The method of claim 10, wherein replacing the sacrificial material layers comprises:
    replacing the sacrificial material layers with continuous electrically conductive layers through the backside trenches;
    forming masking pillar structures within portions of the backside trenches, wherein the masking pillar structures laterally cover portions of the continuous electrically conductive layers in the memory array region and in the staircase region and do not laterally cover the portions of the continuous electrically conductive layers in the access transistor region; and
    replacing portions of the continuous electrically conductive layers located in the access transistor region with the active semiconductor regions.

12. The method of claim 11, wherein replacing the portions of the continuous electrically conductive layers located in the access transistor region with the active semiconductor regions comprises isotropically etching the portions of the continuous electrically conductive layers by introducing an isotropic etchant into volumes of the backside trenches that are not filled with the masking pillar structures to form transistor region cavities in the portions of the continuous electrically conductive layers located in the access transistor region, and to separate the continuous electrically conductive layers into the first electrically conductive layers that are located with the memory array region and the second electrically conductive layers that are located within the staircase region.

13. The method of claim 12, further comprising:
    forming second conductivity type semiconductor material layers in the transistor region cavities through the volumes of the backside trenches that are not filled with the masking pillar structures;
    partially etching back a middle portion of the second conductivity type semiconductor material layers through the volumes of the backside trenches that are not filled with the masking pillar structures to form second conductivity type semiconductor source and drain regions separated by a respective channel cavity; and
    forming first conductivity type semiconductor channel regions in the respective channel cavities through the volumes of the backside trenches that are not filled with the masking pillar structures to form the active semiconductor regions.

14. The method of claim 13, further comprising:
    removing the masking pillar structures from the backside trenches; and
    forming backside contact via structures in the respective backside trenches.

15. The method of claim 13, wherein:
    each of the source regions extends along the second horizontal direction through a respective one of the plurality of finger regions between two neighboring backside trenches;
    each of the drain regions extends along the second horizontal direction through the respective one of the plurality of finger regions between two neighboring backside trenches, and is separated from the respective source region of the same active semiconductor region along the first horizontal direction; and
    the channel region extends along the second horizontal direction through the respective one of the plurality of finger regions between two neighboring backside trenches, and is located between the respective source and drain regions of the same active semiconductor region.

16. The method of claim 15, wherein the respective finger region further comprises:
    two first vertically straight and laterally concave surfaces of the source region that contact two first vertically straight and laterally convex surfaces of the channel region; and
    two first vertically straight and laterally concave surfaces of the drain region that contact two second vertically straight and laterally convex surfaces of the channel region.

17. The method of claim 16, wherein the respective finger region further comprises:
    two second vertically straight and laterally convex surfaces of the source region that contact two first vertically straight and laterally concave surfaces of a respective one of the first electrically conductive layers; and
    two second vertically straight and laterally convex surfaces of the drain region that contact two second vertically straight and laterally concave surfaces of the respective one of the second electrically conductive layers.

18. The method of claim 10, further comprising:
    forming memory openings through the alternating stack; and forming memory opening fill structures in the memory openings.

19. The method of claim 18, wherein each of the memory opening fill structures comprises a vertical semiconductor channel and a vertical stack of memory elements.

* * * * *